(12) United States Patent
Yoshimizu

(10) Patent No.: US 10,573,662 B2
(45) Date of Patent: **\*Feb. 25, 2020**

(54) MEMORY DEVICE AND METHOD FOR MANUFACTURING MEMORY DEVICE

(71) Applicant: Toshiba Memory Corporation, Minato-ku (JP)

(72) Inventor: Yasuhito Yoshimizu, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/381,625

(22) Filed: Apr. 11, 2019

(65) Prior Publication Data

US 2019/0237479 A1    Aug. 1, 2019

Related U.S. Application Data

(63) Continuation of application No. 15/917,954, filed on Mar. 12, 2018, now Pat. No. 10,319,740.

(30) Foreign Application Priority Data

Aug. 31, 2017    (JP) ................................. 2017-167088

(51) Int. Cl.
*H01L 27/115* (2017.01)
*H01L 27/11582* (2017.01)
(Continued)

(52) U.S. Cl.
CPC .. *H01L 27/11582* (2013.01); *H01L 21/02636* (2013.01); *H01L 21/31111* (2013.01);
(Continued)

(58) Field of Classification Search
CPC .................................................. H01L 27/11582
See application file for complete search history.

(56) References Cited

U.S. PATENT DOCUMENTS 7,696,559 B2    4/2010   Arai et al.
9,634,097 B2    4/2017   Rabkin
(Continued)

FOREIGN PATENT DOCUMENTS

JP         2013-531390 A      8/2013

*Primary Examiner* — William Coleman
(74) *Attorney, Agent, or Firm* — Oblon, McClelland, Maier & Neustadt, L.L.P.

(57) ABSTRACT

A memory device includes first and second conductive layers, first and second semiconductor members, first and second charge storage members, first and second insulating members, and first and second insulating layers. The second conductive layer is distant from the first conductive layer. The first semiconductor member is positioned between the first and second conductive layers. The second semiconductor member is positioned between the first semiconductor member and the second conductive layer. The first insulating layer includes a first region positioned between the first semiconductor member and the first charge storage member and a second region positioned between the first semiconductor member and the second semiconductor member. The second insulating layer includes a third region positioned between the second semiconductor member and the second charge storage member and a fourth region positioned between the second region and the second semiconductor member.

20 Claims, 44 Drawing Sheets

(51) Int. Cl.
- *H01L 29/10* (2006.01)
- *H01L 29/423* (2006.01)
- *H01L 21/311* (2006.01)
- *H01L 21/02* (2006.01)
- *H01L 27/11519* (2017.01)
- *H01L 27/11556* (2017.01)
- *H01L 27/11565* (2017.01)
- *H01L 23/528* (2006.01)
- *H01L 21/28* (2006.01)
- *H01L 27/24* (2006.01)
- *H01L 45/00* (2006.01)
- *H01L 27/1157* (2017.01)
- *H01L 27/11524* (2017.01)

(52) U.S. Cl.
CPC ........ *H01L 23/528* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/249* (2013.01); *H01L 29/1037* (2013.01); *H01L 29/40114* (2019.08); *H01L 29/40117* (2019.08); *H01L 29/4234* (2013.01); *H01L 29/42324* (2013.01); *H01L 45/04* (2013.01); *H01L 45/06* (2013.01); *H01L 45/085* (2013.01); *H01L 45/1226* (2013.01); *H01L 45/144* (2013.01); *H01L 45/145* (2013.01); *H01L 45/146* (2013.01); *H01L 45/16* (2013.01); *H01L 21/0217* (2013.01); *H01L 21/02164* (2013.01); *H01L 21/02178* (2013.01)

(56) References Cited

U.S. PATENT DOCUMENTS

| | | | |
|---|---|---|---|
| 10,319,740 B2* | 6/2019 | Yoshimizu | H01L 27/11582 |
| 2011/0199804 A1 | 8/2011 | Son et al. | |
| 2016/0071876 A1 | 3/2016 | Mizuno et al. | |
| 2016/0099254 A1 | 4/2016 | Park et al. | |
| 2017/0263613 A1 | 9/2017 | Murakoshi et al. | |

* cited by examiner

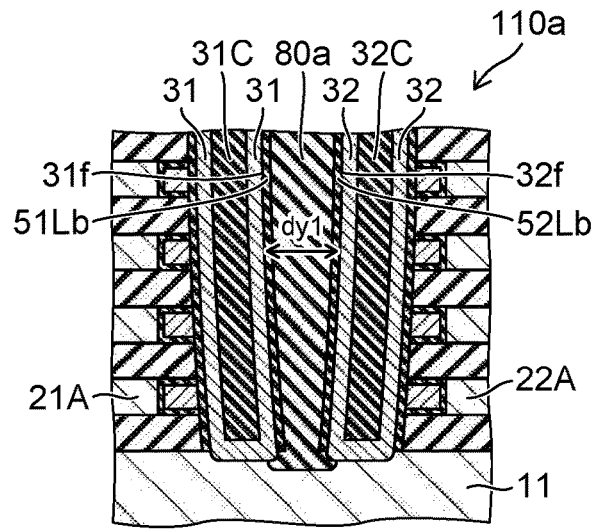
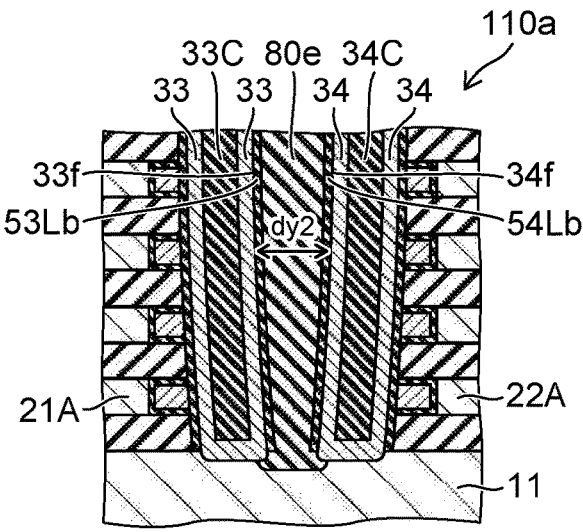
FIG. 8A  FIG. 8B
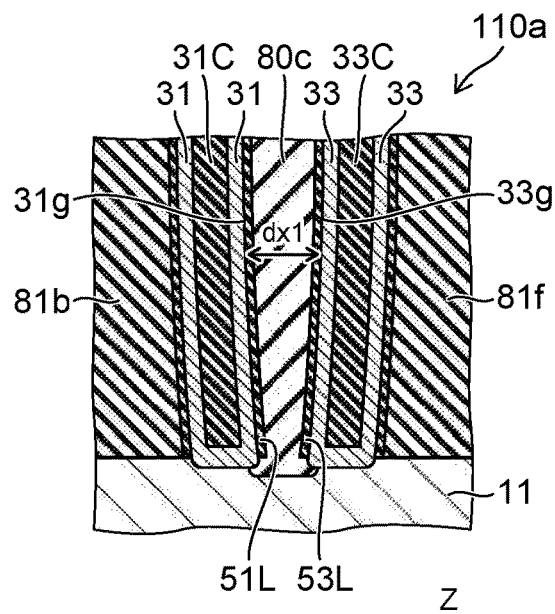
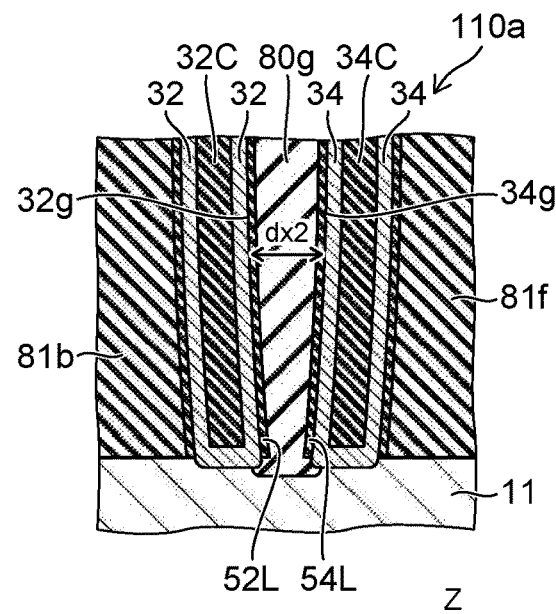
FIG. 8C  FIG. 8D

MEMORY DEVICE AND METHOD FOR MANUFACTURING MEMORY DEVICE

CROSS-REFERENCE TO RELATED APPLICATIONS

This application is a continuation of application Ser. No. 15/917,954, filed Mar. 12, 2018, which is based upon and claims the benefit of priority from Japanese Patent Application No. 2017-167088, filed on Aug. 31, 2017; the entire contents of which are incorporated herein by reference.

FIELD

Embodiments described herein relate generally to a memory device and a method for manufacturing a memory device.

BACKGROUND

A nonvolatile semiconductor memory device and a resistance change memory device are known. Memory density is desired to be improved in the memory devices.

BRIEF DESCRIPTION OF THE DRAWINGS

FIGS. 5A to 7D are schematic sectional views illustrating a method for manufacturing the memory device according to the first embodiment;

FIGS. 8A to 8D are schematic sectional views illustrating a part of a memory device according to the first embodiment;

DETAILED DESCRIPTION

Figure 1:
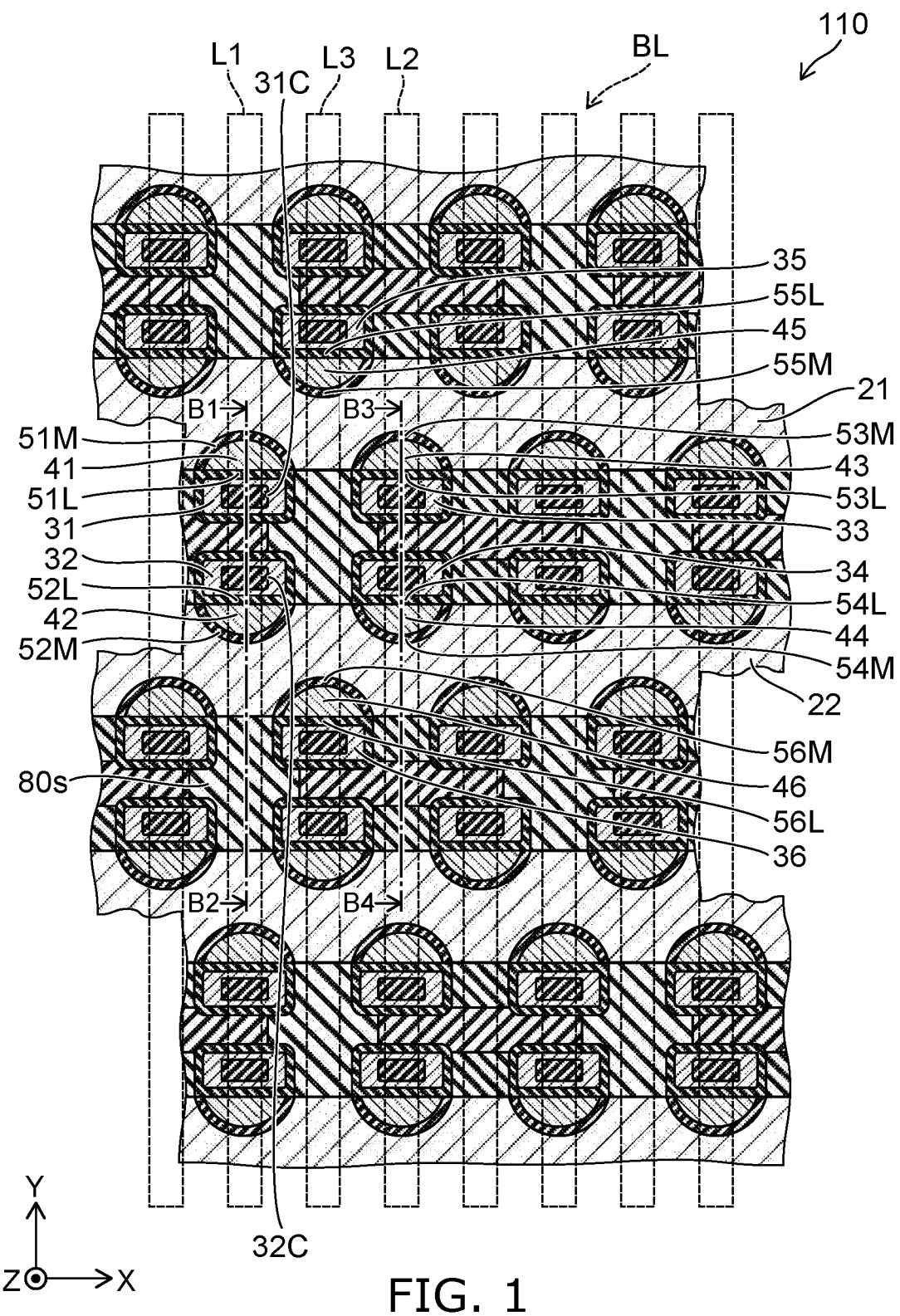
FIG. 1 is a schematic sectional view illustrating a memory device according to a first embodiment.

According to one embodiment, a memory device includes a first conductive layer, a second conductive layer, a first semiconductor member, a second semiconductor member, a first charge storage member, a first insulating member, a first insulating layer, a second charge storage member, a second insulating member, and a second insulating layer. The first conductive layer extends along a first direction. The second conductive layer is distant from the first conductive layer in a second direction crossing the first direction and extending along the first direction. The first semiconductor member extends in a third direction crossing a plane including the first direction and the second direction, and passing through between the first conductive layer and the second conductive layer. The second semiconductor member extends in the third direction and passing through between the first semiconductor member and the second conductive layer. The first charge storage member is provided between the first conductive layer and the first semiconductor member. The first insulating member is provided between the first conductive layer and the first charge storage member. The first insulating layer includes a first region and a second region. The first region is positioned between the first semiconductor member and the first charge storage member. The second region is positioned between the first semiconductor member and the second semiconductor member. The second charge storage member is provided between the second conductive layer and the second semiconductor member. The second insulating member is provided between the second conductive layer and the second charge storage member. The second insulating layer includes a third region and a fourth region. The third region is positioned between the second semiconductor member and the second charge storage member. The fourth region is positioned between the second region and the second semiconductor member.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

(First Embodiment)

FIGS. 1 to 4 are schematic sectional views illustrating a memory device according to a first embodiment.

Figure 2:
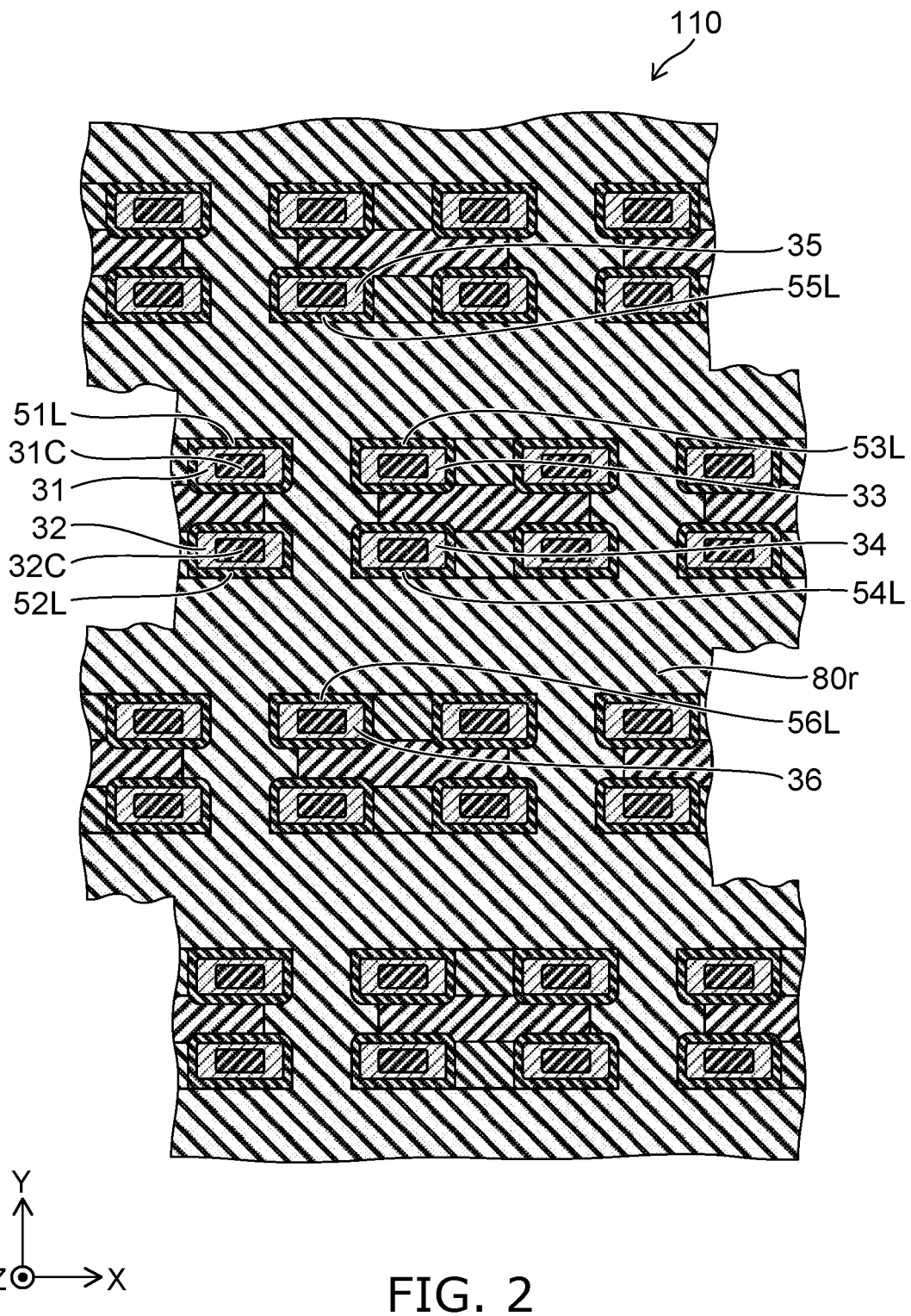
FIG. 2 is a schematic sectional view illustrating the memory device according to the first embodiment.
Figure 3A:
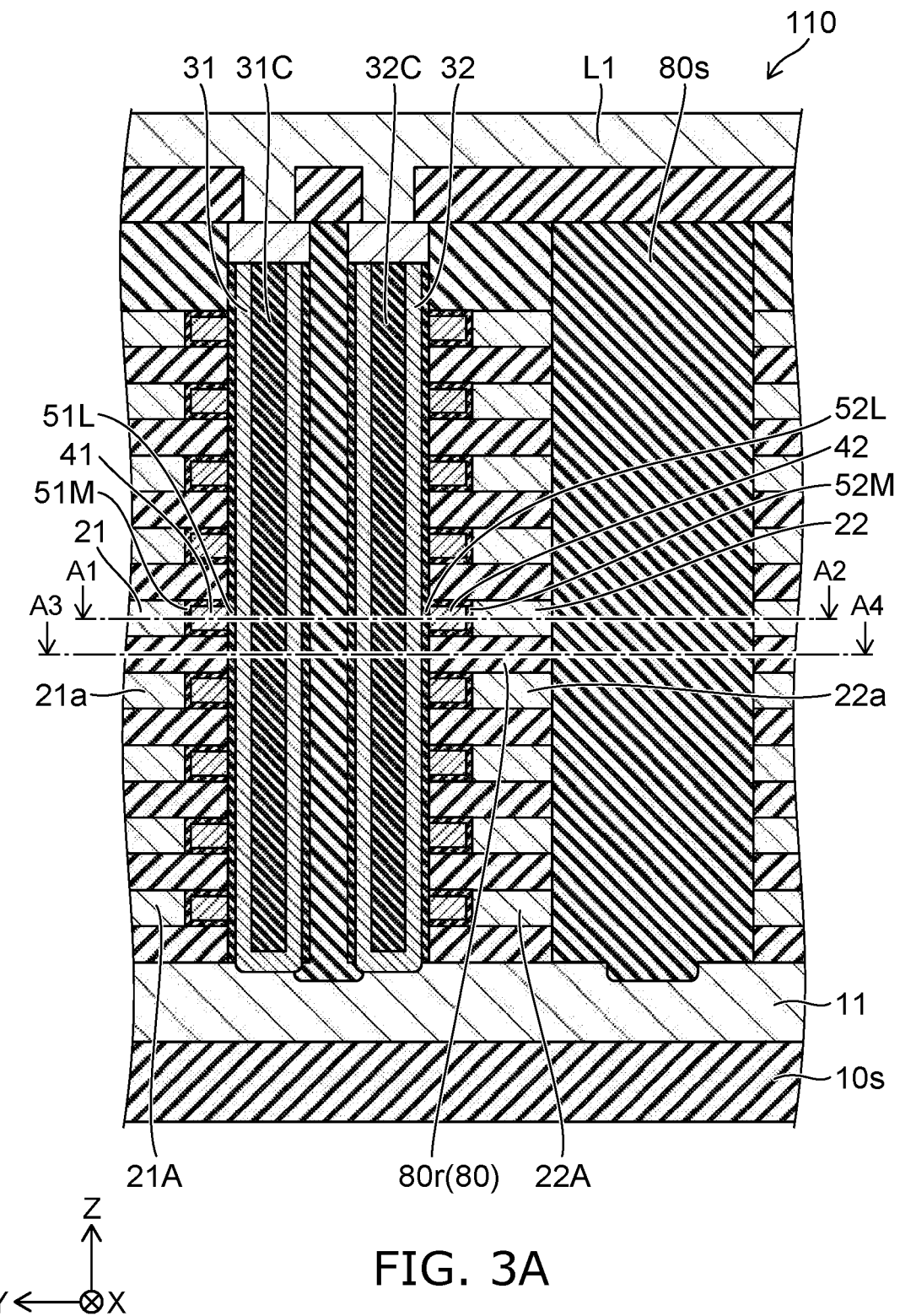
FIGS. 3A and 3B are schematic sectional views illustrating the memory device according to the first embodiment.
Figure 3B:
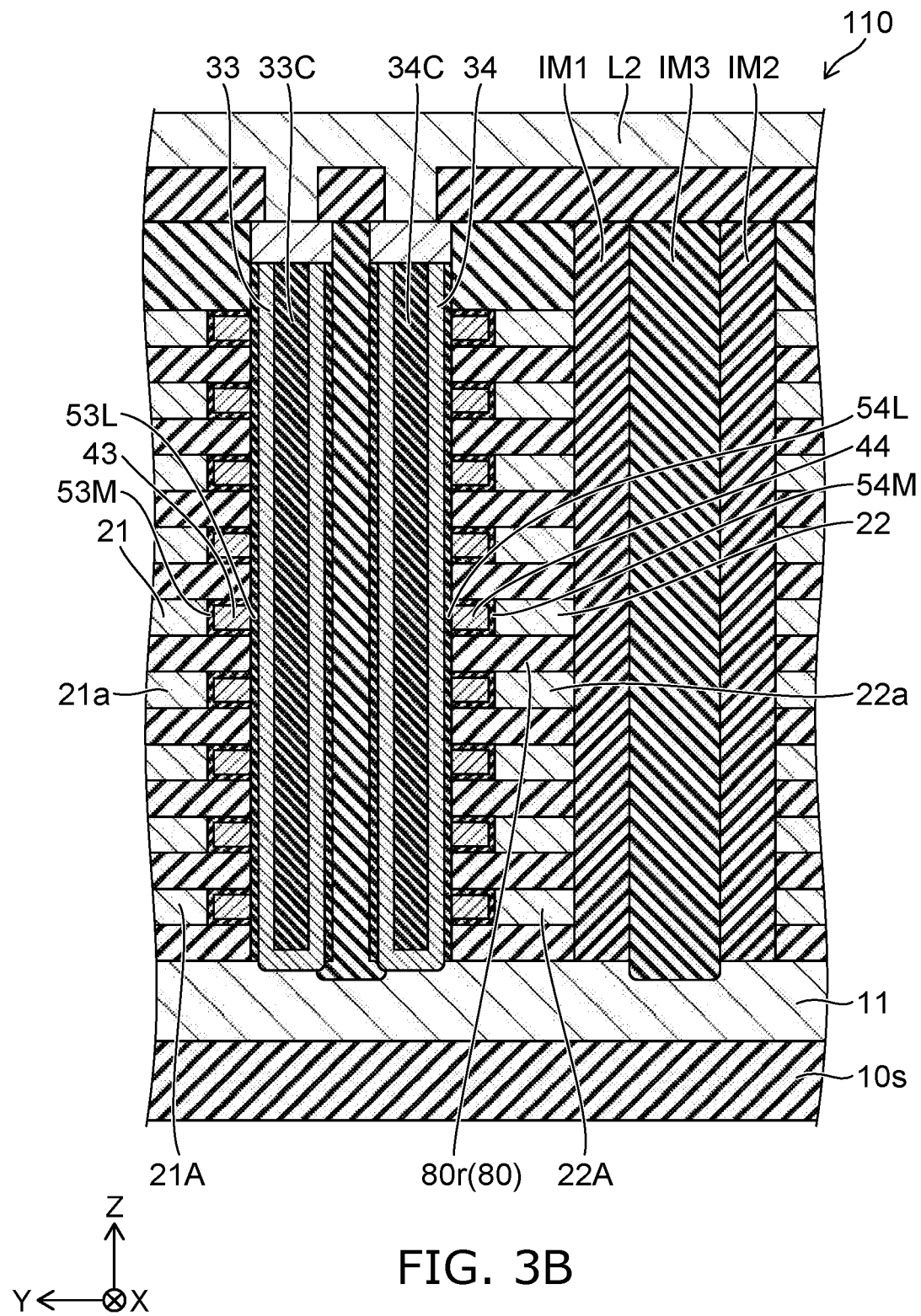
Figure 4:
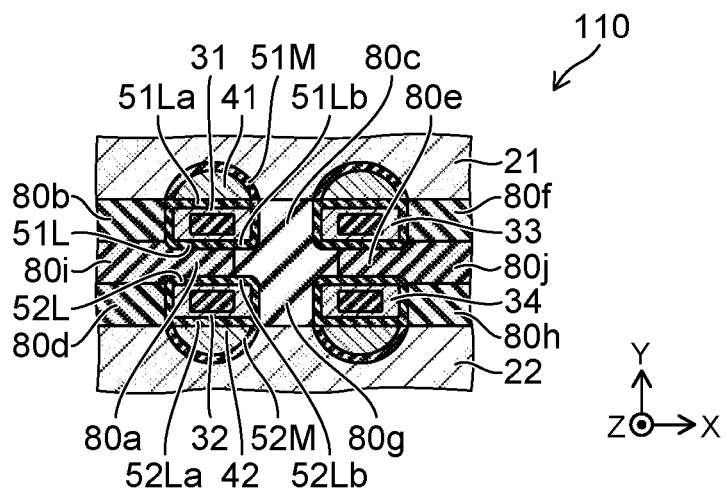
FIG. 4 is a schematic sectional view illustrating the memory device according to the first embodiment.

FIG. 1 is a sectional view taken along line A1-A2 of FIG. 3A. FIG. 2 is a sectional view taken along line A3-A4 of FIG. 3A. FIG. 3A is a sectional view taken along line B1-B2 of FIG. 1. FIG. 3B is a sectional view taken along line B3-B4 of FIG. 1. FIG. 4 shows part of a cross section taken along line A1-A2 of FIG. 3A.

As shown in FIGS. 3A and 3B, the memory device 110 according to the embodiment includes a plurality of first electrode layers 21A and a plurality of second electrode layers 22A. One of the plurality of first electrode layers 21A is referred to as a first conductive layer 21. One of the plurality of second electrode layers 22A is referred to as a second conductive layer 22.

FIG. 1 shows a first conductive layer 21 and a second conductive layer 22. As shown in FIG. 1, the first conductive layer 21 and the second conductive layer 22 extend along a first direction.

The first direction is referred to as X-axis direction. One direction perpendicular to the X-axis direction is referred to as Y-axis direction. The direction perpendicular to the X-axis direction and the Y-axis direction is referred to as Z-axis direction.

The configuration of the first conductive layer 21 shown in FIG. 1 also applies to the other electrode layers (such as a conductive layer 21a (see FIGS. 3A and 3B)) included in the plurality of first electrode layers 21A. The configuration of the second conductive layer 22 also applies to the other electrode layers (such as a conductive layer 22a (see FIGS. 3A and 3B)) included in the plurality of second electrode layers 22A.

As shown in FIGS. 1, 3A, and 3B, the second conductive layer 22 is spaced from the first conductive layer 21 in a second direction. That is, the plurality of second electrode layers 22A are spaced from the plurality of first electrode layers 21A in the second direction. The second direction crosses the first direction. In this example, the second direction is the Y-axis direction. Here, "spaced" refers to division between the electrode layers in the second direction.

As shown in FIG. 3A, the plurality of first electrode layers 21A are arranged in a third direction. The plurality of second electrode layers 22A are arranged in the third direction. The third direction crosses a plane including the first direction and the second direction (e.g. X-Y plane). The third direction is e.g. the Z-axis direction.

For instance, it may be considered that the first conductive layer 21 is provided in a plurality. The plurality of first conductive layers 21 are arranged in the third direction (Z-axis direction). The plurality of first conductive layers 21 are spaced from each other in the third direction. For instance, it may be considered that the second conductive layer 22 is provided in a plurality. The plurality of second conductive layers 22 are arranged in the third direction. The plurality of second conductive layers 22 are spaced from each other in the third direction.

As shown in FIGS. 2, 3A, and 3B, part of an insulating part 80 (interlayer insulating region 80r) is provided between the plurality of first electrode layers 21A and between the plurality of second electrode layers 22A.

For instance, a conductive base member 11 is provided as shown in FIGS. 3A and 3B. A substrate 10s is provided in this example. The substrate 10s may include e.g. a semiconductor substrate plate and a semiconductor element (such as a transistor) provided thereon. A stacked body including the plurality of first electrode layers 21A and the plurality of second electrode layers 22A is provided on the conductive base member 11.

The memory device 110 further includes a first semiconductor member 31 and a second semiconductor member 32. The first semiconductor member 31 and the second semiconductor member 32 extend along the third direction (Z-axis direction in this example).

For instance, one end of each of the first semiconductor member 31 and the second semiconductor member 32 is electrically connected to the conductive base member 11. For instance, the other end of each of the first semiconductor member 31 and the second semiconductor member 32 is electrically connected to a first interconnect L1.

For instance, the plurality of first electrode layers 21A (such as the first conductive layer 21) and the plurality of second electrode layers 22A (such as the second conductive layer 22) function as word lines of the memory device 110. The first interconnect L1 functions as e.g. a bit line. The conductive base member 11 functions as e.g. a source line (or a source part electrically connected to the source line). The first semiconductor member 31 and the second semiconductor member 32 function as e.g. a channel part.

As shown in FIGS. 1 and 2, the first semiconductor member 31 and the second semiconductor member 32 as described above are provided in a plurality. The following describes an example of the configuration of each of the first conductive layer 21, the second conductive layer 22, the first semiconductor member 31, and the second semiconductor member 32. The following description is also applicable to the plurality of first electrode layers 21A, the plurality of second electrode layers 22A, and the other plurality of semiconductor members.

As shown in FIG. 1, the first semiconductor member 31 passes between the first conductive layer 21 and the second conductive layer 22 and extends along the Z-axis direction (see FIG. 3A). At least part of the first semiconductor member 31 is located between the first conductive layer 21 and the second conductive layer 22. The second semiconductor member 32 passes between the first semiconductor member 31 and the second conductive layer 22 and extends along the Z-axis direction (see FIG. 3A). At least part of the second semiconductor member 32 is located between the first semiconductor member 31 and the second conductive layer 22.

These semiconductor members are shaped like e.g. a column extending along the Z-axis direction. In this example, these semiconductor members are shaped like a pipe. For instance, a first core part 31C is provided in the first semiconductor member 31. The first semiconductor member 31 is provided around the first core part 31C. The direction from the first core part 31C to the first semiconductor member 31 crosses the Z-axis direction. A second core part 32C is provided in the second semiconductor member 32. The second semiconductor member 32 is provided around the second core part 32C. The direction from the second core part 32C to the second semiconductor member 32 crosses the Z-axis direction.

The memory device 110 further includes a first charge storage member 41, a first insulating member 51M, a first insulating layer 51L, a second charge storage member 42, a second insulating member 52M, and a second insulating layer 52L.

As shown in FIGS. 1 and 4, the first charge storage member 41 is provided between the first conductive layer 21 and the first semiconductor member 31. The first insulating member 51M is provided between the first conductive layer 21 and the first charge storage member 41.

As shown in FIG. 4, the first insulating layer 51L includes a first region 51La and a second region 51Lb. The first region 51La is located between the first semiconductor member 31 and the first charge storage member 41. The second region 51Lb is located between the first semiconductor member 31 and the second semiconductor member 32. The second region 51Lb is e.g. continuous with the first region 51La. For instance, the first insulating layer 51L is provided around the first semiconductor member 31.

As shown in FIGS. 1 and 4, the second charge storage member 42 is provided between the second conductive layer 22 and the second semiconductor member 32. The second insulating member 52M is provided between the second conductive layer 22 and the second charge storage member 42.

As shown in FIG. 4, the second insulating layer 52L includes a third region 52La and a fourth region 52Lb. The third region 52La is located between the second semiconductor member 32 and the second charge storage member 42. The fourth region 52Lb is located between the second region 51Lb and the second semiconductor member 32. The fourth region 52Lb is continuous with the third region 52La. For instance, the second insulating layer 52L is provided around the second semiconductor member 32.

For instance, one transistor (memory transistor) is configured in the crossing region of the first conductive layer 21 and the first semiconductor member 31. The first conductive layer 21 functions as a gate of the transistor. The first semiconductor member 31 functions as a channel of the transistor. The first insulating layer 51L functions as e.g. a tunnel insulating film. The first insulating layer 51L contains e.g. silicon oxide. The first insulating member 51M functions as e.g. a block insulating film.

In one example, the first charge storage member 41 is e.g. non-insulative (e.g. conductive). For instance, the first charge storage member 41 contains e.g. silicon (such as polysilicon or amorphous silicon). In this case, the first charge storage member 41 functions as a floating gate. The memory cell is configured as a transistor of the floating gate type.

In another example, the first charge storage member 41 is e.g. insulative. An example of this case will be described later.

The configuration and function of the second charge storage member 42, the second insulating member 52M, and the second insulating layer 52L are the same as the configuration and function of the first charge storage member 41, the first insulating member 51M, and the first insulating layer 51L, respectively.

In such a memory device 110, two semiconductor members (the first semiconductor member 31 and the second semiconductor member 32) are provided between two conductive layers (the first conductive layer 21 and the second conductive layer 22) arranged in the Y-axis direction. This can provide a memory device capable of improving memory density. For instance, the spacing (e.g. pitch) in the Y-axis direction between such two semiconductor members can be made small.

As illustrated in FIG. 1, a plurality of sets each including these two semiconductor members are arranged along the X-axis direction. Thus, the memory device capable of improving memory density can be manufactured relatively easily.

In the embodiment, the charge storage member (e.g. first charge storage member 41) may be non-insulative (e.g. conductive). In this case, the charge storage member is provided e.g. selectively in portions corresponding to the plurality of electrode layers (such as the first conductive layer 21 and the conductive layer 21a). As shown in FIG. 3, the first charge storage member 41 is provided in correspondence with the first conductive layer 21. A different charge storage member is provided in correspondence with a different conductive layer 21a. This different charge storage member is not continuous with the first charge storage member 41.

For instance, each of the plurality of first electrode layers 21A is set back, and a charge storage member is provided in the setback portion. Each of the plurality of second electrode layers 22A is set back, and a charge storage member is provided in the setback portion.

As shown in FIG. 4, for instance, the direction from the first charge storage member 41 to part of the first conductive layer 21 lies along the first direction (X-axis direction). For instance, at least part of the first charge storage member 41 is provided between two regions of the first conductive layer 21 in the first direction (X-axis direction). The direction from the second charge storage member 42 to part of the second conductive layer 22 lies along the first direction (X-axis direction). For instance, at least part of the second charge storage member 42 is provided between two regions of the second conductive layer 22 in the first direction (X-axis direction).

As shown in FIG. 4, the insulating part 80 further includes a first insulating region 80a, a second insulating region 80b, and a third insulating region 80c. At least part of the first insulating region 80a is located between the second region 51Lb and the fourth region 52Lb. The direction from the second insulating region 80b to the first semiconductor member 31 lies along the first direction (X-axis direction). The material contained in the second insulating region 80b is different from the material contained in the first insulating region 80a. The etching rate of the material contained in the second insulating region 80b is different from the etching rate of the material contained in the first insulating region 80a. For instance, these insulating regions may contain silicon oxide or silicon nitride. The first insulating region 80a may contain silicon oxide, and the second insulating region 80b may contain silicon nitride. The first insulating region 80a may contain silicon nitride, and the second insulating region 80b may contain silicon oxide. These insulating regions may be mutually different in the composition ratio of at least one of nitrogen and oxygen contained therein. These insulating regions may be mutually different in density.

In the first direction, the first semiconductor member 31 is located between the second insulating region 80*b* and the third insulating region 80*c*. For instance, the material contained in the third insulating region 80*c* may be different from the material contained in the second insulating region 80*b*. These insulating regions may be mutually different in density.

As described later, the etching rates of the materials contained in the first insulating region 80*a*, the second insulating region 80*b*, and the third insulating region 80*c* are mutually different. Thus, the memory device 110 described above can be formed easily.

An example of the plurality of semiconductor members is described in the following.

As shown in FIG. 1, in addition to the first semiconductor member 31 and the second semiconductor member 32, the memory device 110 is provided with e.g. third to sixth semiconductor members 33-36. The third to sixth semiconductor members 33-36 also extend along the third direction (e.g. Z-axis direction). For instance, the first to sixth semiconductor members 31-36 are substantially parallel to each other.

The third semiconductor member 33 passes between the first conductive layer 21 and the second conductive layer 22. The fourth semiconductor member 34 also passes between the first conductive layer 21 and the second conductive layer 22. At least part of the third semiconductor member 33 is located between the first conductive layer 21 and the second conductive layer 22. At least part of the fourth semiconductor member 34 is located between the first conductive layer 21 and the second conductive layer 22.

The direction from the first semiconductor member 31 to the third semiconductor member 33 lies along the first direction (X-axis direction). The direction from the second semiconductor member 32 to the fourth semiconductor member 34 lies along the first direction (X-axis direction). The third semiconductor member 33 and the fourth semiconductor member 34 pass between the first conductive layer 21 and the second conductive layer 22.

The position of the first conductive layer 21 in the second direction is located between the position of the first semiconductor member 31 in the second direction (Y-axis direction) and the position of the fifth semiconductor member 35 in the second direction. The position of the second conductive layer 22 in the second direction is located between the position of the second semiconductor member 32 in the second direction and the position of the sixth semiconductor member 36 in the second direction.

The position of the fifth semiconductor member 35 in the first direction is located between the position of the first semiconductor member 31 in the first direction (X-axis direction) and the position of the second semiconductor member 32 in the first direction. The position of the sixth semiconductor member 36 in the first direction is located between the position of the first semiconductor member 31 in the first direction and the position of the second semiconductor member 32 in the first direction.

For instance, third to sixth charge storage members 43-46, third to sixth insulating members 53M-56M, and third to sixth insulating layers 53L-56L are provided in correspondence with the third to sixth semiconductor members 33-36, respectively. The third to sixth insulating layers 53L-56L are provided around e.g. the third to sixth semiconductor members 33-36, respectively. The configuration of these members and insulating layers is similar to that of the first semiconductor member 31, the first charge storage member 41, the first insulating member 51M, and the first insulating layer 51L.

For instance, the third semiconductor member 33 extends along the third direction (Z-axis direction). The third semiconductor member 33 passes between the first conductive layer 21 and the second conductive layer 22. The direction from the first semiconductor member 31 to the third semiconductor member 33 lies along the first direction (X-axis direction).

For instance, as shown in FIG. 1, the third semiconductor member 33 and the fourth semiconductor member 34 are electrically connected to a second interconnect L2. The fifth semiconductor member 35 and the sixth semiconductor member 36 are electrically connected to a third interconnect L3.

An insulating region 80*s* is further provided as shown in FIGS. 1 and 3A. As shown in FIG. 1, the direction from the insulating region 80*s* to the first semiconductor member 31 lies along the second direction (Y-axis direction). The direction from the insulating region 80*s* to the sixth semiconductor member 36 lies along the first direction (X-axis direction).

As shown in FIG. 3B, the memory device 110 is provided with an insulating part IM1, an insulating part IM2, and an insulating part IM3. These insulating parts lie along the Z-axis direction. The direction from these insulating parts to the third semiconductor member 33 lies along the second direction (Y-axis direction). The direction from the insulating part IM1 to the sixth semiconductor member 36 lies along the first direction (X-axis direction).

As shown in FIG. 4, the insulating part 80 further includes e.g. fourth to eighth insulating regions 80*d*-80*h*.

In the X-axis direction, the third insulating region 80*c* is located between the second insulating region 80*b* and the sixth insulating region 80*f*.

In the X-axis direction, part of the first semiconductor member 31 and part of the third semiconductor member 33 are located between the second insulating region 80*b* and the sixth insulating region 80*f*. In the X-axis direction, part of the second semiconductor member 32 and part of the fourth semiconductor member 34 are located between the fourth insulating region 80*d* and the eighth insulating region 80*h*.

At least part of the fifth insulating region 80*e* is located between the third semiconductor member 33 and the fourth semiconductor member 34.

The first semiconductor member 31 passes between the second insulating region 80*b* and the third insulating region 80*c*.

The third semiconductor member 33 passes between the third insulating region 80*c* and the sixth insulating region 80*f*.

The second semiconductor member 32 passes between the fourth insulating region 80*d* and the seventh insulating region 80*g*.

The fourth semiconductor member 34 passes between the seventh insulating region 80*g* and the eighth insulating region 80*h*.

For instance, the material contained in the fourth insulating region 80*d* is different from the material contained in the first insulating region 80*a*. The material contained in the sixth insulating region 80*f* is different from the material contained in the fifth insulating region 80*e*. The material contained in the eighth insulating region 80*h* is different from the material contained in the fifth insulating region 80*e*.

For instance, the material contained in the third insulating region 80c is different from the material contained in the second insulating region 80b. The material contained in the third insulating region 80c is different from the material contained in the sixth insulating region 80f. The material contained in the seventh insulating region 80g is different from the material contained in the fourth insulating region 80d. The material contained in the seventh insulating region 80g is different from the material contained in the eighth insulating region 80h.

For instance, the material contained in the fifth insulating region 80e may be substantially the same as the material contained in the first insulating region 80a. For instance, the material contained in the third insulating region 80c may be substantially the same as the material contained in the seventh insulating region 80g. For instance, the materials contained in the second insulating region 80b, the fourth insulating region 80d, the sixth insulating region 80f, and the eighth insulating region 80h may be substantially the same as each other.

For instance, the first insulating region 80a is continuous with the region (insulating region 80i) between the second insulating region 80b and the fourth insulating region 80d. For instance, the fifth insulating region 80e is continuous with the region (insulating region 80j) between the sixth insulating region 80f and the eighth insulating region 80h.

An example of the method for manufacturing the memory device 110 is described in the following.

Figures 5A, 5B:
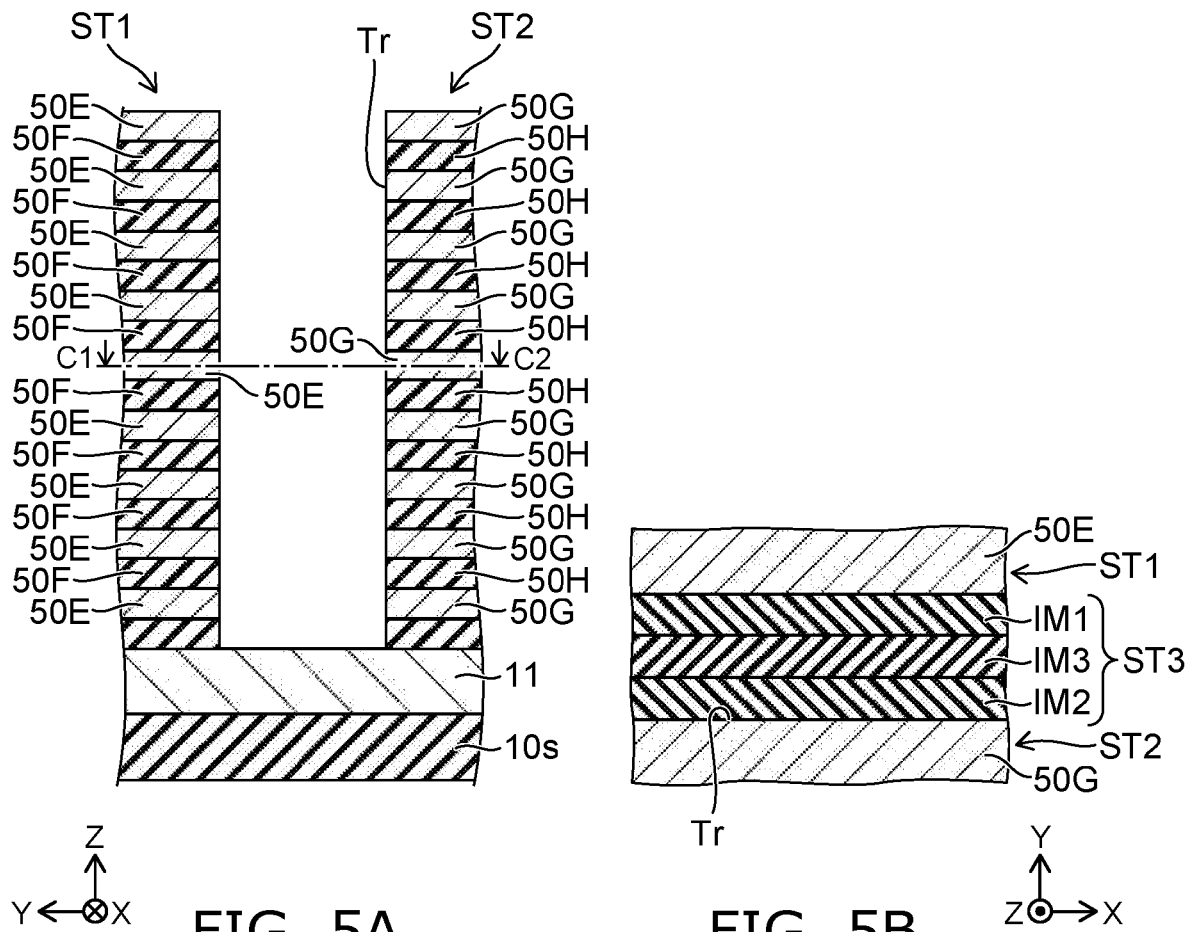

FIGS. 5A and 5B are schematic sectional views illustrating a method for manufacturing the memory device according to the first embodiment.

FIGS. 6A to 6F are schematic sectional views illustrating the method for manufacturing the memory device according to the first embodiment.

FIGS. 7A to 7D are schematic sectional views illustrating the method for manufacturing the memory device according to the first embodiment.

FIG. 5A is a sectional view at the position corresponding to FIGS. 3A and 3B. FIGS. 5B, 6A to 6F, and 7A to 7D are sectional views taken along line C1-C2 of FIG. 5A.

A first structural body ST1 and a second structural body ST2 are formed as shown in FIG. 5A. At least part of the first structural body ST1 constitutes a plurality of first electrode layers 21A. At least part of the second structural body ST2 constitutes a plurality of second electrode layers 22A. The first structural body ST1 and the second structural body ST2 extend along the first direction (e.g. X-axis direction). The second structural body ST2 is spaced from the first structural body ST1 along the second direction (e.g. Y-axis direction) crossing the first direction.

The first structural body ST1 includes a first film 50E. The second structural body ST2 includes a second film 50G.

In this example, the first structural body ST1 is provided with a plurality of first films 50E. The first structural body ST1 further includes a plurality of third films 50F. The plurality of first films 50E and the plurality of third films 50F are arranged alternately along the third direction. The third direction crosses a plane including the first direction and the second direction (X-Y plane). The third direction is e.g. the Z-axis direction.

The second structural body ST2 is provided with a plurality of second films 50G. The second structural body ST2 further includes a plurality of fourth films 50H. The plurality of second films 50G and the plurality of fourth films 50H are arranged alternately along the third direction (e.g. Z-axis direction).

The first structural body ST1 and the second structural body ST2 as described above are formed by forming a trench Tr in a stacked film constituting these structural bodies.

A third structural body ST3 is formed as shown in FIG. 5B. The third structural body ST3 includes a first material insulating part IM1, a second material insulating part IM2, and a third material insulating part IM3. The third structural body ST3 is formed by e.g. forming a film of the material constituting the first material insulating part IM1 and the second material insulating part IM2 and burying a third material insulating part IM3 in the remaining space. The first material insulating part IM1 is located between the first structural body ST1 and the second structural body ST2 in the second direction (Y-axis direction). The second material insulating part IM2 is located between the first material insulating part IM1 and the second structural body ST2 in the second direction. The third material insulating part IM3 is located between the first material insulating part IM1 and the second material insulating part IM2. The material (third material) of the third material insulating part IM3 is different from the material (first material) of the first material insulating part IM1, and different from the material (second material) of the second material insulating part IM2. The first material and the second material may be the same as each other.

The first material and the second material contain e.g. low-density silicon oxide. The third material contains e.g. high-density silicon oxide. The etching rate is mutually different in these materials. For instance, the etching rate of the first material insulating part IM1 and the second material insulating part IM2 for the etchant (such as hydrofluoric acid) is higher than the etching rate of the third material insulating part IM3 for the etchant (such as hydrofluoric acid).

The density of the third material insulating part IM3 is different from the density of the first material insulating part IM1, and different from the density of the second material insulating part IM2. For instance, the density of the third material insulating part IM3 is higher than the density of the first material insulating part IM1, and higher than the density of the second material insulating part IM2.

For instance, the first material insulating part IM1 and the second material insulating part IM2 are formed by low-temperature ALD using hexachlorodisilane (HCD) and oxygen. The third material insulating part IM3 is formed by e.g. high-temperature ALD using organosilane and radical oxygen. The first material insulating part IM1 and the second material insulating part IM2 contain e.g. low-density silicon oxide. The third material insulating part IM3 contains e.g. high-density silicon oxide.

The first material insulating part IM1, the second material insulating part IM2, and the third material insulating part IM3 are thus formed by the ALD method. Accordingly, for instance, high coverage is achieved in the trench Tr with high aspect ratio.

Figure 6A:
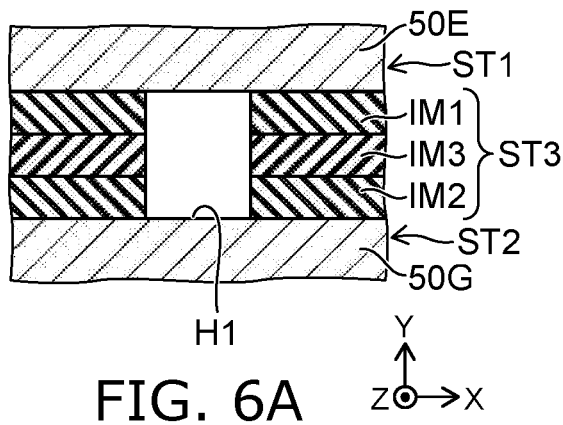

As shown in FIG. 6A, a first hole H1 extending along the third direction (Z-axis direction) is formed in the third structural body ST3. The first hole H1 is formed by removing part of the first material insulating part IM1, part of the second material insulating part IM2, and part of the third material insulating part IM3.

Figure 6B:
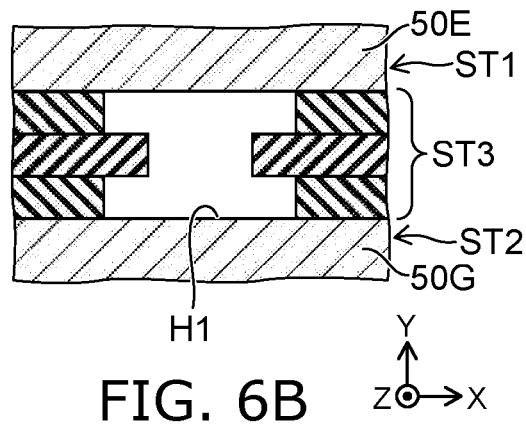

As shown in FIG. 6B, the first material insulating part IM1 and the second material insulating part IM2 exposed in the first hole H1 are set back in the X-axis direction. This expands the size in the X-axis direction of the first hole H1.

For instance, hydrofluoric acid treatment is performed. Thus, the amount of setback in the first material insulating part IM1 and the second material insulating part IM2 is made larger than the amount of setback in the third material insulating part IM3 due to the difference of etching rate in the silicon oxide films (the first material insulating part IM1, the second material insulating part IM2, and the third material insulating part IM3). For instance, a hole shaped like a letter "H" in the X-axis direction is formed.

Figure 6C:
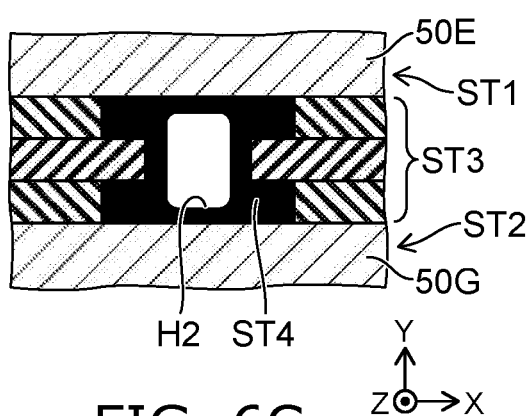

As shown in FIG. 6C, subsequently, a film of a fourth material is formed in the first hole H1. A fourth structural body ST4 is formed from the fourth material. The fourth structural body ST4 has a second hole H2 extending along the third direction. For instance, the fourth material (fourth structural body ST4) is silicon. The film of the fourth material is formed by e.g. the CVD method. This film of the fourth material is formed preferentially in the space formed by the setback of the first material insulating part IM1 and the second material insulating part IM2. The second hole H2 is formed by appropriately controlling the thickness of the film of the fourth material.

Figure 6D:
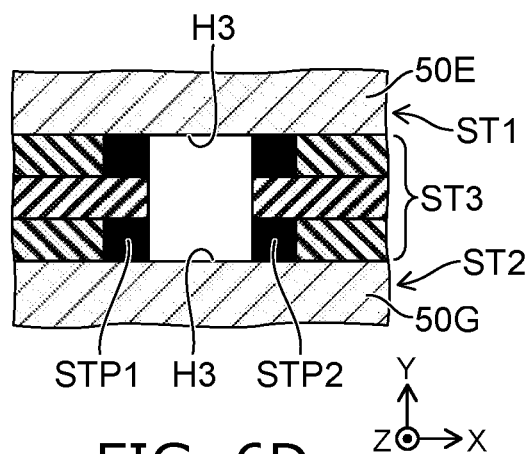

As shown in FIG. 6D, part of the fourth structural body ST4 is removed to form a third hole H3. For instance, the third hole H3 is formed by expanding the size of the second hole H2. The removal of part of the fourth structural body ST4 is performed by e.g. alkali treatment. This dissolves silicon. The third hole H3 is formed by controlling the amount of dissolution. For instance, a silicon column remains in four gaps.

The first film 50E (e.g. a plurality of first films 50E) and the second film 50G (e.g. a plurality of second films 50G) are exposed in the third hole H3. A first residual portion STP1 and a second residual portion STP2 of the fourth structural body ST4 remain in the third hole H3.

Figure 6E:
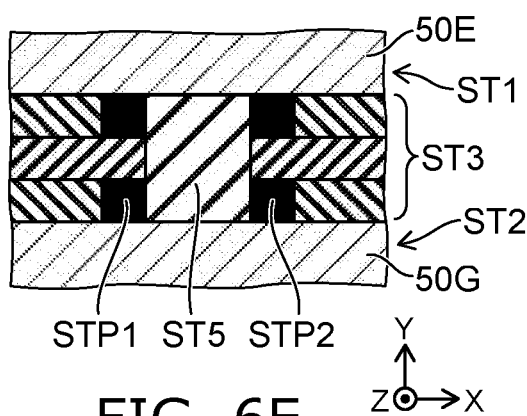

As shown in FIG. 6E, a fifth material is buried in the third hole H3 to form a fifth structural body ST5 from the fifth material. The fifth structural body ST5 extends along the third direction (Z-axis direction). The fifth material is e.g. silicon oxide film.

Figure 6F:
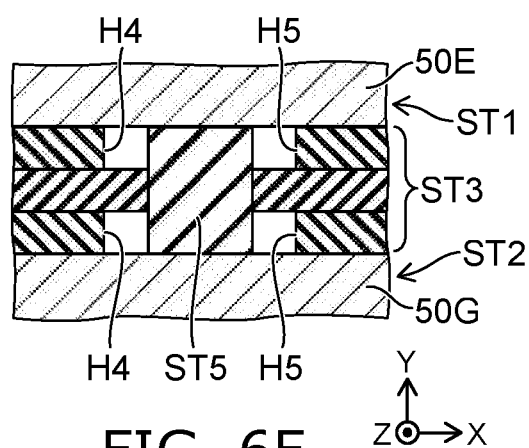

As shown in FIG. 6F, the first residual portion STP1 and the second residual portion STP2 are removed after forming the fifth structural body ST5. This forms a fourth hole H4 and a fifth hole H5. For instance, a surface portion of the buried silicon oxide film is removed. Furthermore, alkali treatment is performed. This selectively dissolves the column-shaped silicon portions (the first residual portion STP1 and the second residual portion STP2). For instance, four holes (two fourth holes H4 and two fifth holes H5) are formed.

Figure 7A:
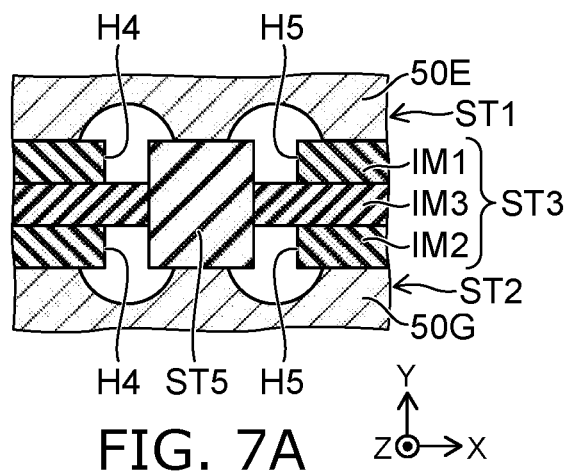

As shown in FIG. 7A, the first film 50E and the second film 50G exposed in the fourth hole H4 and the fifth hole H5 are set back after forming the fourth hole H4 and the fifth hole H5. This expands the size of the fourth hole H4 and the fifth hole H5. For instance, part of the plurality of first films 50E and the plurality of second films 50G (arc-shaped portion) is removed starting from the column-shaped holes (two fourth holes H4 and two fifth holes H5).

Figure 7B:
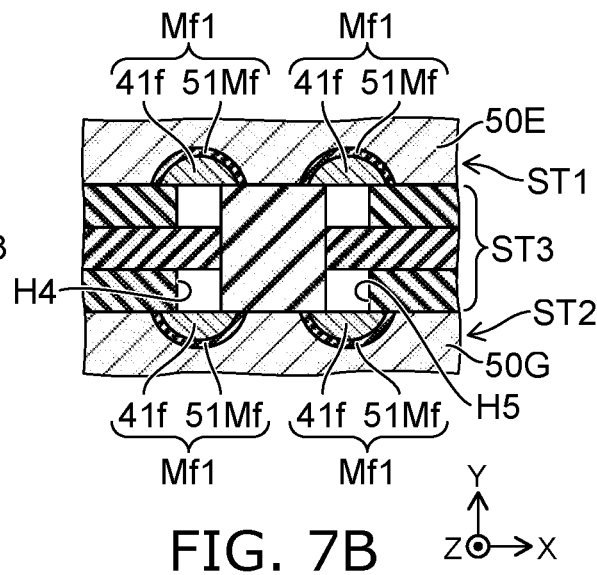

As shown in FIG. 7B, a first functional film Mf1 is formed on the surface of the first film 50E (e.g. a plurality of first films 50E) and the second film 50G (e.g. a plurality of second films 50G) exposed in each of the fourth hole H4 and the fifth hole H5. The first functional film Mf1 includes a memory film insulating film 51Mf and a charge storage film 41f. The memory film insulating film 51Mf is located between the charge storage film 41f and the first film 50E. The memory film insulating film 51Mf is located between the charge storage film 41f and the second film 50G. The charge storage film 41f corresponds to the first charge storage layer 41 in FIG. 1. The insulating film 51Mf corresponds to the first insulating member 51M.

For instance, first, the memory film insulating film 51Mf is formed on the surface of the first film 50E and the second film 50G exposed in each of the fourth hole H4 and the fifth hole H5. Subsequently, the charge storage film 41f is formed on the surface of the memory film insulating film 51Mf.

The charge storage film 41f is e.g. conductive. The charge storage film 41f is e.g. polysilicon. A memory of the floating gate type is formed in this case.

Thus, in this example, the first film 50E (e.g. a plurality of first films 50E) and the second film 50G (e.g. a plurality of second films 50G) exposed in the fourth hole H4 and the fifth hole H5 are set back after forming the fourth hole H4 and the fifth hole H5 and before forming the first functional film Mf1. Accordingly, a plurality of memory parts (charge storage film 41f) are divided from each other in the Z-axis direction.

As described later, the charge storage film 41f may be e.g. non-conductive. The charge storage film 41f contains e.g. silicon nitride. For instance, a memory of the charge storage type (such as MONOS type) is formed in this case. The setback of the plurality of first films 50E and the plurality of second films 50G may be omitted in this case.

Figure 7C:
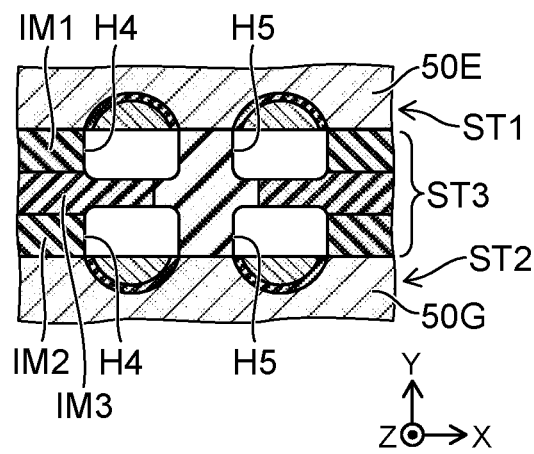

As shown in FIG. 7C, the size of the fourth hole H4 and the fifth hole H5 is expanded after forming the first functional film Mf1. For instance, the size of these holes is expanded by performing chemical liquid treatment or vapor phase treatment. For instance, treatment with buffered hydrofluoric acid is performed. This provides a substantially equal etching rate in the first material insulating part IM1, the second material insulating part IM2, and the third material insulating part IM3.

Figure 7D:
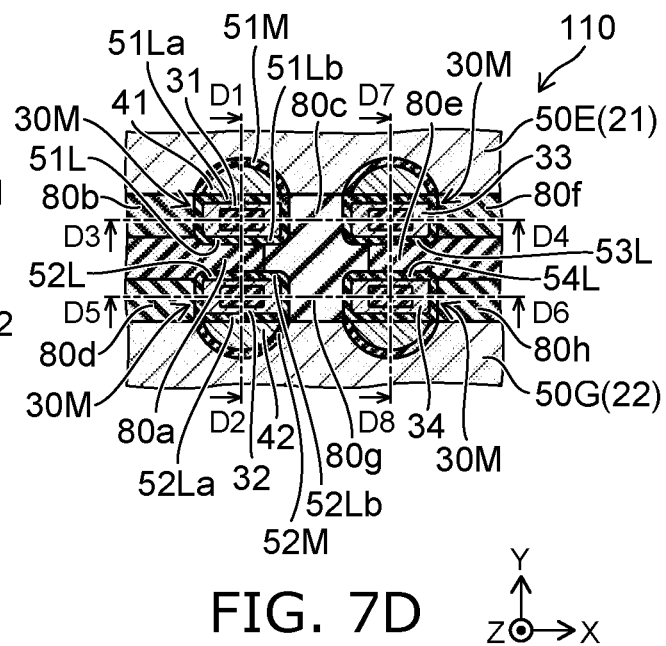
Figure 9A:
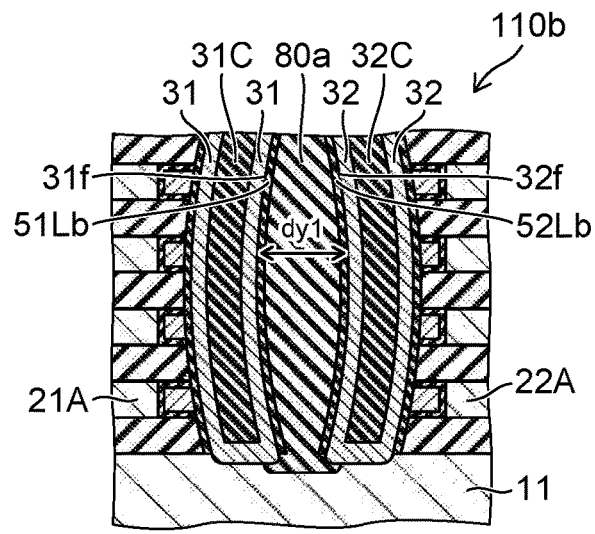
FIGS. 9A to 9D are schematic sectional views illustrating a part of a memory device according to a first variation of the first embodiment.
Figure 9B:
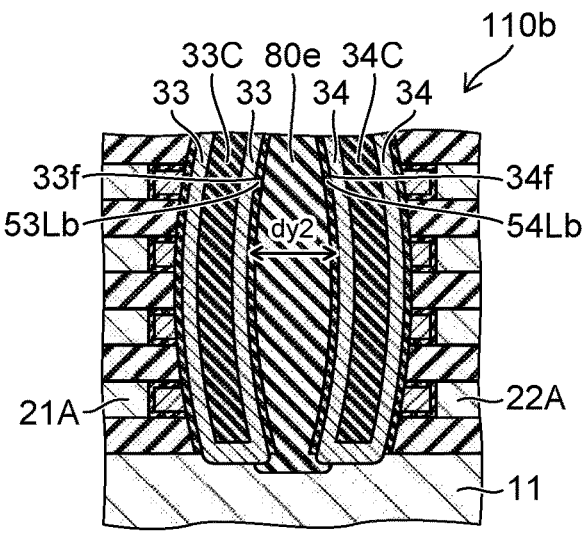
Figure 9C:
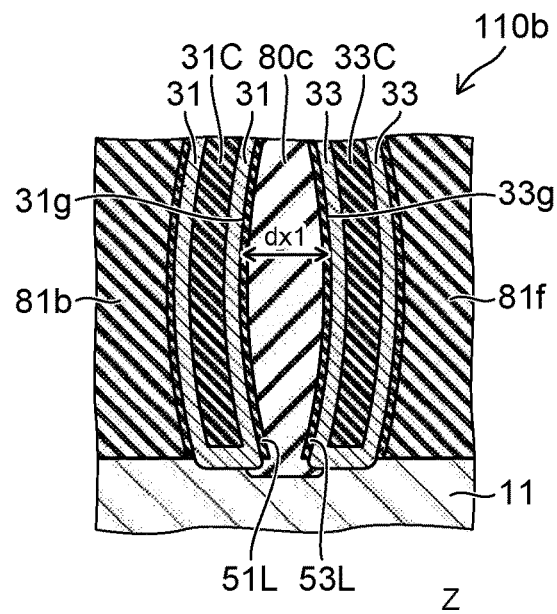
Figure 9D:
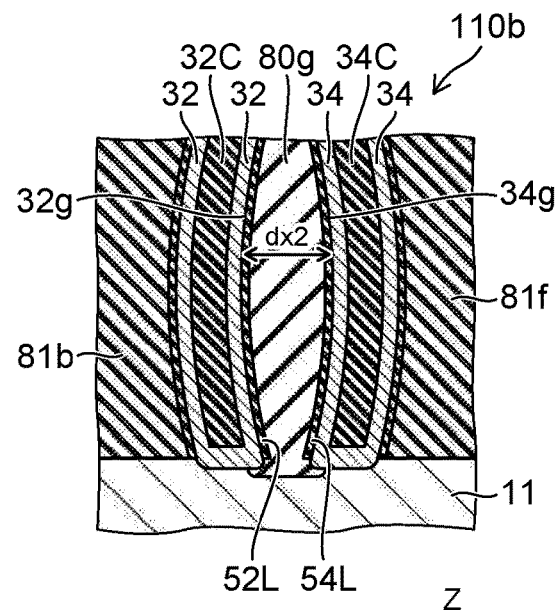
Figure 10A:
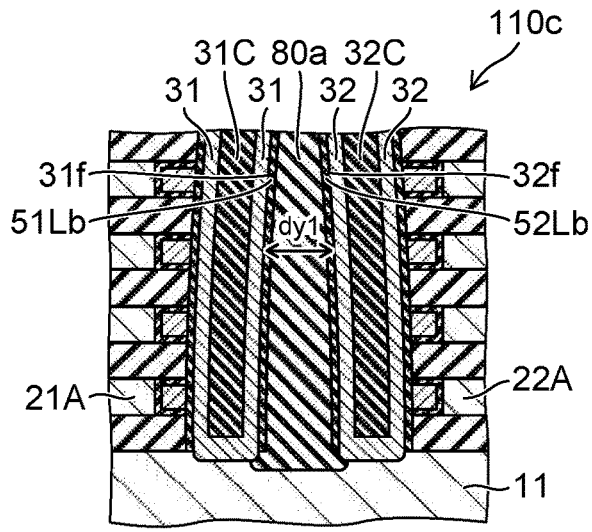
FIGS. 10A to 10D are schematic sectional views illustrating a part of a memory device according to a second variation of the first embodiment.
Figure 10B:
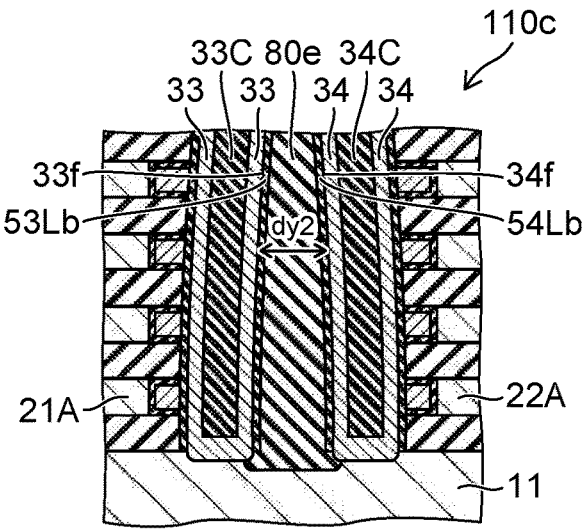
Figure 10C:
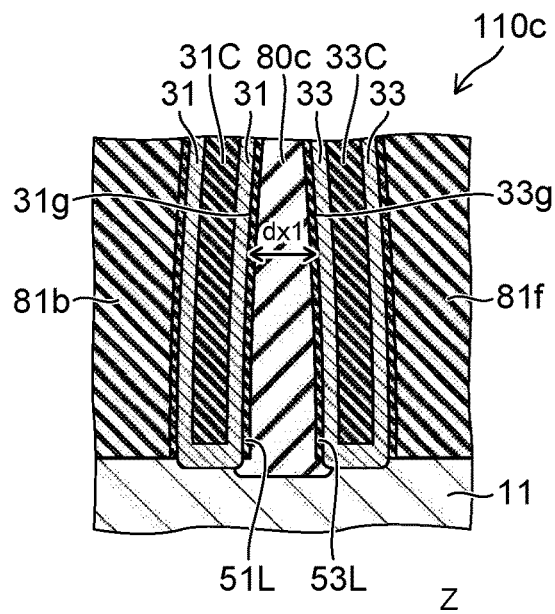
Figure 10D:
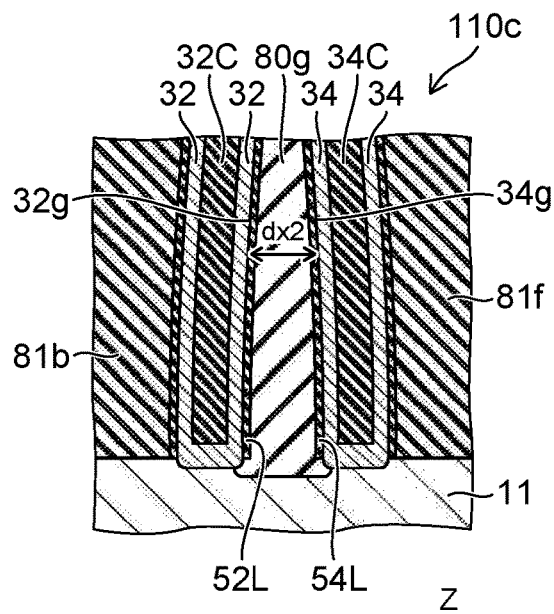
Figure 11A:
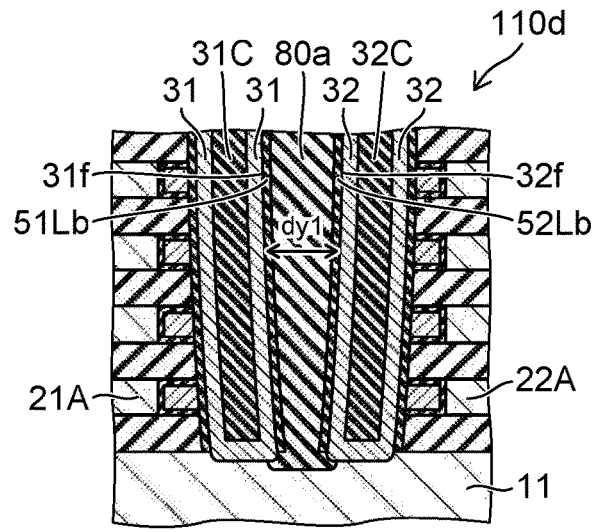
FIGS. 11A to 11D are schematic sectional views illustrating a part of a memory device according to a third variation of the first embodiment.
Figure 11B:
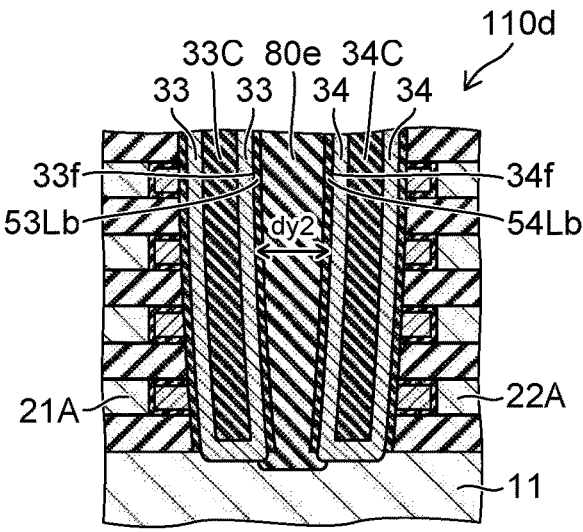
Figure 11C:
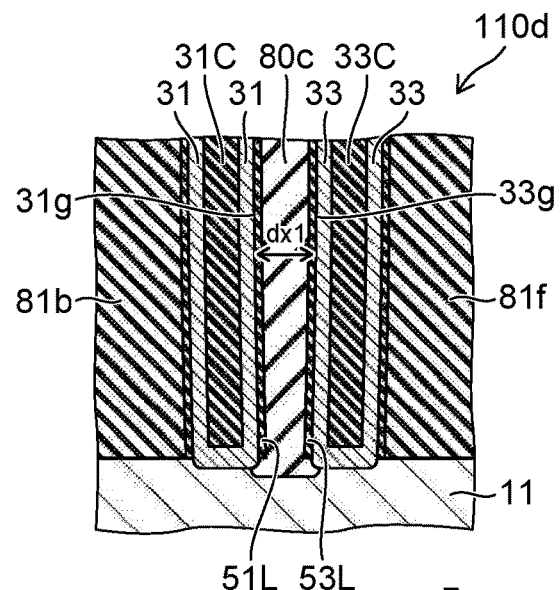
Figure 11D:
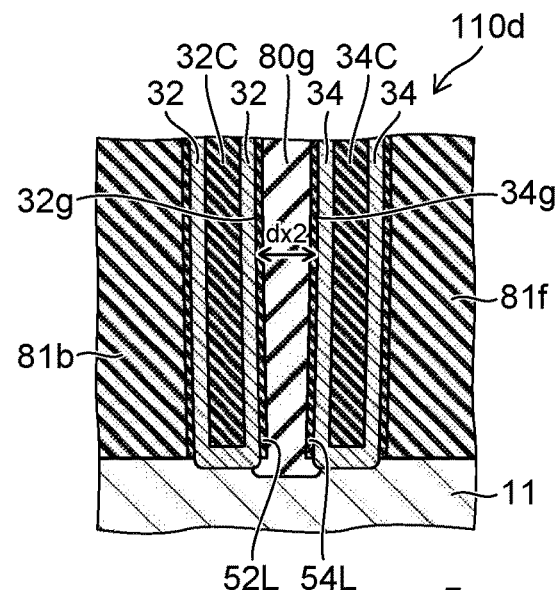

A first member 30M is formed as shown in FIG. 7D. The first member 30M extends along the third direction (Z-axis direction) in the residual space of the fourth hole H4 and the residual space of the fifth hole H5. The first member 30M includes e.g. a semiconductor member extending along the third direction (Z-axis direction). For instance, a plurality of first members 30M are provided. The plurality of first members 30M include e.g. first to fourth semiconductor members 31-34. One of the plurality of first members 30M includes e.g. a first semiconductor member 31 and a first insulating layer 51L. Another of the plurality of first members 30M includes e.g. a second semiconductor member 32 and a second insulating layer 52L.

As described later, in an alternative embodiment, the first member 30M may include a conductive member extending along the third direction (Z-axis direction).

In the above example, the size of the fourth hole H4 and the fifth hole H5 is expanded after forming the first functional film Mf1 and before forming the first member 30M. The expansion of the size of the fourth hole H4 and the fifth hole H5 may be omitted in the embodiment.

The memory device 110 is formed by the processing described above. The above method can provide a method for manufacturing a memory device capable of improving memory density.

In the above manufacturing method, the width (size) of the first hole H1 (see FIG. 6A) may change along the Z-axis direction (depth direction). The width of the first hole H1 is e.g. the length in one direction along the X-Y plane. For instance, in one example, the width of the first hole H1 at a position near the substrate 10s (or the conductive base member 11) may be smaller than the width of the first hole H1 at a position far from the substrate 10s (or the conductive base member 11). Besides, the width of the first hole H1 may change variously along the Z-axis direction (depth direction) depending on the process for forming the first hole H1.

In such cases, for instance, the positions in the X-Y plane of two fourth holes H4 and two fifth holes H5 may change in an interlocked manner along the Z-axis direction. In response thereto, in the set of four semiconductor members (first to fourth semiconductor members 31-34), the shape of these semiconductor members may change in an interlocked manner. An example of this change is described in the following.

FIGS. 8A to 8D are schematic sectional views illustrating part of a memory device according to the first embodiment.

FIG. 8A is a sectional view taken along line D1-D2 of FIG. 7D. FIG. 8B is a sectional view taken along line D7-D8 of FIG. 7D. FIG. 8C is a sectional view taken along line D3-D4 of FIG. 7D. FIG. 8D is a sectional view taken along line D5-D6 of FIG. 7D. These figures illustrate a memory device 110a according to the embodiment.

As shown in FIG. 8A, the first semiconductor member 31 has a side surface 31f. The side surface 31f is opposed to e.g. the second region 51Lb in the Y-axis direction. The second semiconductor member 32 has a side surface 32f. The side surface 32f is opposed to e.g. the fourth region 52Lb in the Y-axis direction. The distance dy1 along the Y-axis direction between the side surface 31f and the side surface 32f changes along the Z-axis direction. In this example, the distance dy1 at a first height position is shorter than the distance dy1 at a second height position. In the embodiment, the first height position and the second height position are arbitrary. In this example, the distance along the Z-axis direction between the first height position and the conductive base member 11 is shorter than the distance along the Z-axis direction between the second height position and the conductive base member 11. This also applies to the examples described in the subsequent figures of FIGS. 8B to 10D.

As shown in FIG. 8B, the third semiconductor member 33 has a side surface 33f. The side surface 33f is opposed to e.g. the region 53Lb of the third insulating layer 53L in the Y-axis direction. The fourth semiconductor member 34 has a side surface 34f. The side surface 34f is opposed to e.g. the region 54Lb of the fourth insulating layer 54L in the Y-axis direction. The distance dy2 along the Y-axis direction between the side surface 33f and the side surface 34f changes along the Z-axis direction. In this example, the distance dy2 at the first height position is shorter than the distance dy2 at the second height position.

As shown in FIG. 8C, the first semiconductor member 31 has a side surface 31g. The side surface 31g is opposed to e.g. the first insulating layer 51L in the X-axis direction. The third semiconductor member 33 has a side surface 33g. The side surface 33g is opposed to e.g. the third insulating layer 53L in the X-axis direction. The distance dx1 along the X-axis direction between the side surface 31g and the side surface 33g changes along the Z-axis direction. In this example, the distance dx1 at the first height position is shorter than the distance dx1 at the second height position.

As shown in FIG. 8D, the second semiconductor member 32 has a side surface 32g. The side surface 32g is opposed to e.g. the second insulating layer 52L in the X-axis direction. The fourth semiconductor member 34 has a side surface 34g. The side surface 34g is opposed to e.g. the fourth insulating layer 54L in the X-axis direction. The distance dx2 along the X-axis direction between the side surface 32g and the side surface 34g changes along the Z-axis direction. In this example, the distance dx2 at the first height position is shorter than the distance dx2 at the second height position.

For instance, the change of the distance dy1 per unit length in the Z-axis direction is substantially equal to the change of the distance dy2 per unit length in the Z-axis direction. For instance, the former is 0.8 times or more and 1.2 times or less of the latter.

For instance, the change of the distance dx1 per unit length in the Z-axis direction is substantially equal to the change of the distance dx2 per unit length in the Z-axis direction. For instance, the former is 0.8 times or more and 1.2 times or less of the latter.

For instance, the change of the distance dy1 per unit length in the Z-axis direction is substantially equal to the change of the distance dx1 per unit length in the Z-axis direction. For instance, the former is 0.8 times or more and 1.2 times or less of the latter.

For instance, the change of the distance dy2 per unit length in the Z-axis direction is substantially equal to the change of the distance dx2 per unit length in the Z-axis direction. For instance, the former is 0.8 times or more and 1.2 times or less of the latter.

FIGS. 9A to 9D are schematic sectional views illustrating part of a memory device according to the first embodiment.

FIGS. 9A to 9D are sectional views corresponding to FIGS. 8A to 8D, respectively. These figures illustrate a memory device 110b according to the embodiment.

In the memory device 110b, the distance dy1, the distance dy2, the distance dx1, and the distance dx2 increase and decrease along the Z-axis direction.

FIGS. 10A to 10D are schematic sectional views illustrating part of a memory device according to the first embodiment.

FIGS. 10A to 10D are sectional views corresponding to FIGS. 8A to 8D, respectively. These figures illustrate a memory device 110c according to the embodiment.

In the memory device 110c, in each of the distance dy1, the distance dy2, the distance dx1, and the distance dx2, the value at the second height position is larger than the value at the first height position. Also in this case, the distance along the Z-axis direction between the first height position and the conductive base member 11 is shorter than the distance along the Z-axis direction between the second height position and the conductive base member 11.

Thus, in the set of four semiconductor members (first to fourth semiconductor members 31-34), the shape of these semiconductor members changes in an interlocked manner. This causes the change as described above along the Z-axis direction in the distance dy1, the distance dy2, the distance dx1, and the distance dx2.

Also in the memory devices 110b and 110c described above, for instance, the change of the distance dy1 per unit length in the Z-axis direction is 0.8 times or more and 1.2 times or less of the change of the distance dy2 per unit length in the Z-axis direction. For instance, the change of the distance dx1 per unit length in the Z-axis direction is 0.8 times or more and 1.2 times or less of the change of the distance dx2 per unit length in the Z-axis direction.

For instance, the change of the distance dy1 per unit length in the Z-axis direction is 0.8 times or more and 1.2 times or less of the change of the distance dx1 per unit length in the Z-axis direction. For instance, the change of the distance dy2 per unit length in the Z-axis direction is 0.8 times or more and 1.2 times or less of the change of the distance dx2 per unit length in the Z-axis direction.

In the above manufacturing method, the material of the first material insulating part IM1 is different from the material of the third material insulating part IM3. These materials are mutually different in etching rate. Thus, for instance, when the first material insulating part IM1 and the third material insulating part IM3 are processed simultaneously, the obtained shape may be different from each other. Such difference in shape may be observed in the manufactured memory device. An example of such difference in shape is described in the following.

FIGS. 11A to 11D are schematic sectional views illustrating part of a memory device according to the first embodiment.

FIGS. 11A to 11D are sectional views corresponding to FIGS. 8A to 8D, respectively. These figures illustrate a memory device 110d according to the embodiment.

In the memory device 110d, for instance, the change of the distance dy1 per unit length in the Z-axis direction is 0.8 times or more and 1.2 times or less of the change of the distance dy2 per unit length in the Z-axis direction. For instance, the change of the distance dx1 per unit length in the Z-axis direction is 0.8 times or more and 1.2 times or less of the change of the distance dx2 per unit length in the Z-axis direction.

On the other hand, in the memory device 110d, for instance, the change of the distance dy1 per unit length in the Z-axis direction may be different from the change of the distance dx1 per unit length in the Z-axis direction. For instance, the change of the distance dy2 per unit length in the Z-axis direction may be different from the change of the distance dx2 per unit length in the Z-axis direction.

In the above example, the plurality of first films 50E and the plurality of second films 50G are conductive. On the other hand, the plurality of third films 50F and the plurality of fourth films 50H are insulative. In this case, the plurality of first films 50E constitute a plurality of first electrode layers 21A (such as the first conductive layer 21). The plurality of second films 50G constitute a plurality of second electrode layers 22A (such as the second conductive layer 22). The plurality of third films 50F and the plurality of fourth films 50H constitute e.g. at least part of the interlayer insulating region 80r.

The replace method described below may be used in the above manufacturing method. For instance, the plurality of first films 50E and the plurality of second films 50G function as sacrificial layers. The material of the plurality of first films 50E and the plurality of second films 50G is different from the material of the plurality of third films 50F and the plurality of fourth films 50H.

Figure 12:
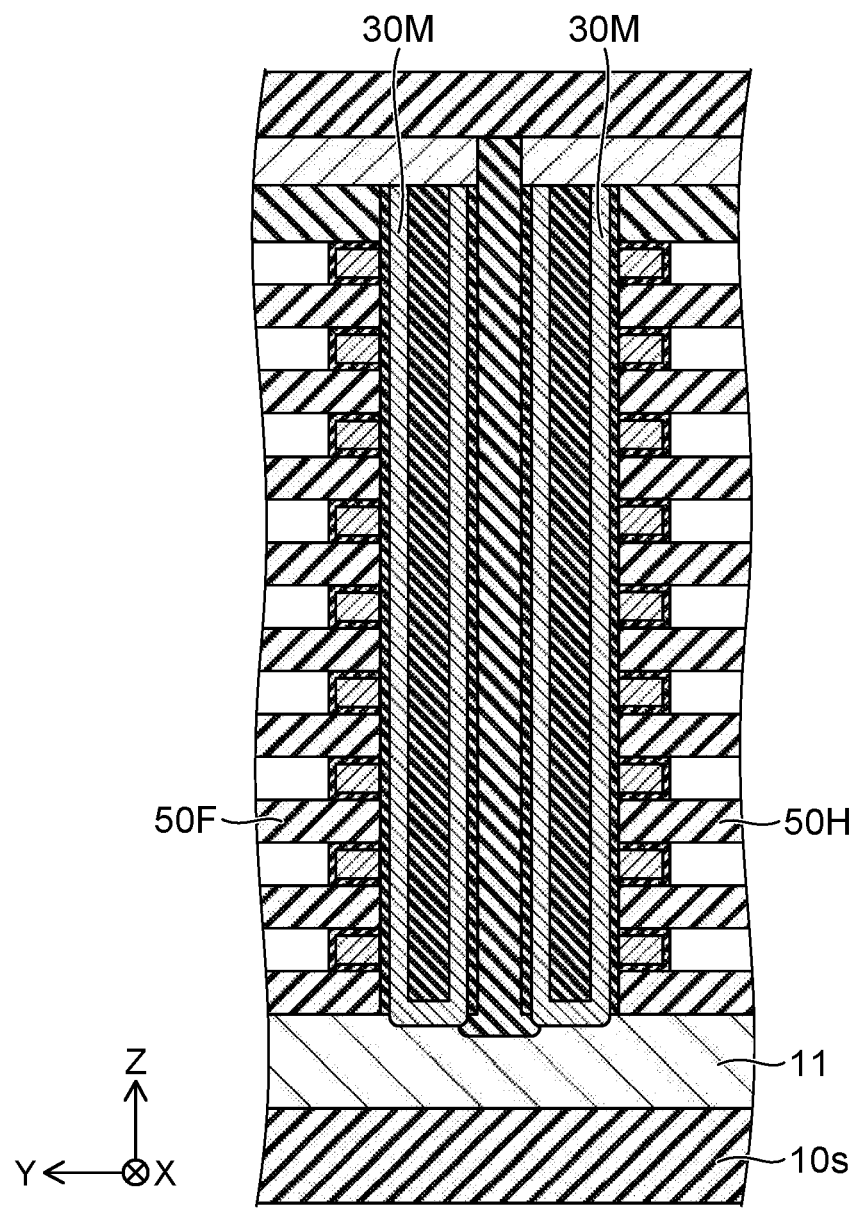
FIG. 12 is a schematic sectional view illustrating a method for manufacturing the memory device according to the first embodiment.

FIG. 12 is a schematic sectional view illustrating a method for manufacturing the memory device according to the first embodiment.

FIG. 12 illustrates the state after the first member 30M is formed. As shown in FIG. 12, for instance, the first film 50E (a plurality of first films 50E) and the second film 50G (a plurality of second films 50G) are removed after forming the first member 30M described above. Then, a conductive material is buried in the space formed by the removal. This conductive material constitutes a plurality of first electrode layers 21A (such as the first conductive layer 21) and a plurality of second electrode layers 22A (such as the second conductive layer 22).

(Second Embodiment)

Figure 13:
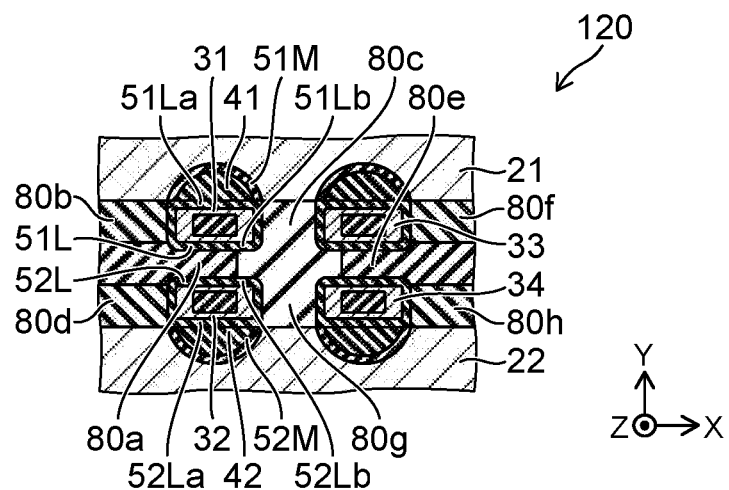
FIG. 13 is a schematic sectional view illustrating a memory device according to a second embodiment.

FIG. 13 is a schematic sectional view illustrating a memory device according to a second embodiment.

FIG. 13 is a sectional view corresponding to FIG. 4.

As shown in FIG. 13, the memory device 120 according to the embodiment is also provided with a first conductive layer 21, a second conductive layer 22, a first semiconductor member 31, a second semiconductor member 32, a first charge storage member 41, a first insulating member 51M, a first insulating layer 51L, a second charge storage member 42, a second insulating member 52M, and a second insulating layer 52L. In the memory device 120, the first charge storage member 41 and the second charge storage member 42 are non-conductive (e.g. insulative). The rest is similar to the memory device 110.

For instance, at least one of the first charge storage member 41 and the second charge storage member 42 contains e.g. silicon and nitrogen. At least one of the first charge storage member 41 and the second charge storage member 42 may contain at least one selected from the group consisting of silicon nitride, polysilicon, metal, organometallic complex, and metal compound (e.g. metal oxide and metal nitride). The aforementioned polysilicon may contain impurity. The aforementioned polysilicon may contain e.g. at least one selected from the group consisting of B, P, and As. The memory device 120 can also provide a memory device capable of improving memory density.

Figure 14:
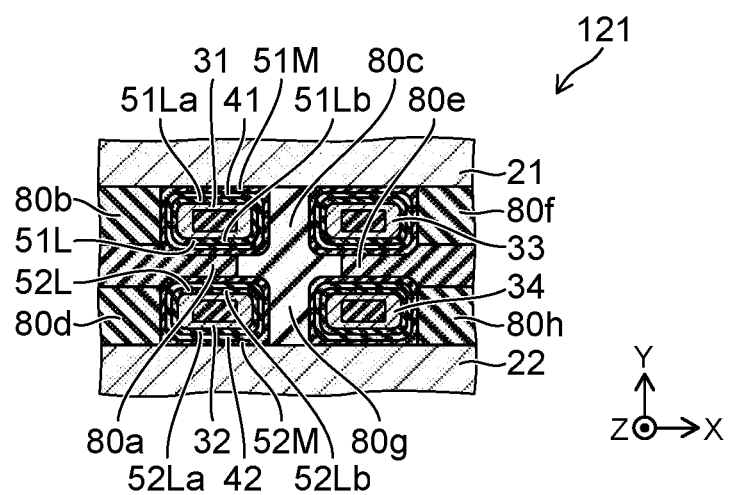
FIG. 14 is a schematic sectional view illustrating another memory device according to the second embodiment.
Figure 15A:
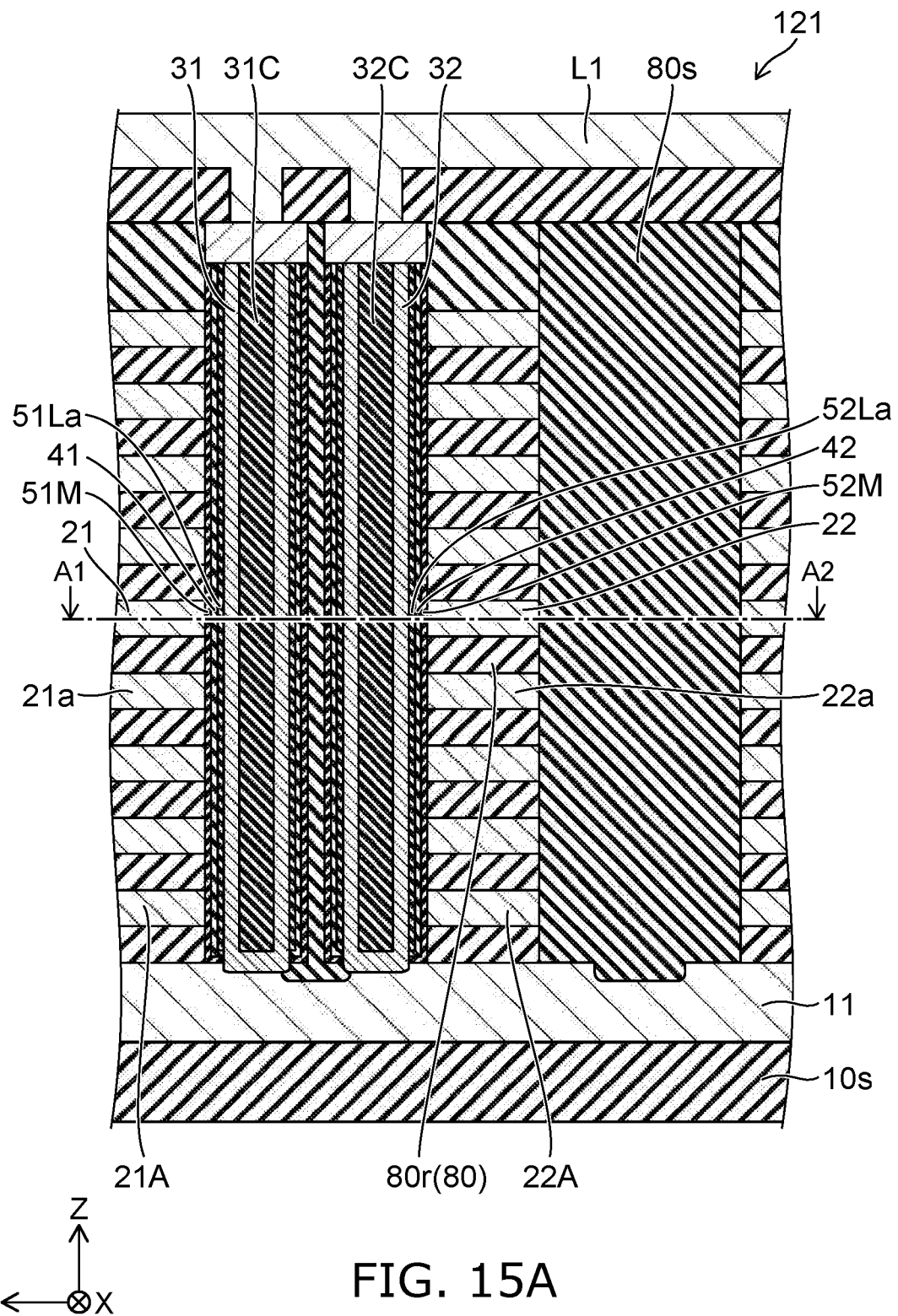
FIGS. 15A and 15B are schematic sectional views illustrating the other memory device according to the second embodiment.
Figure 15B:
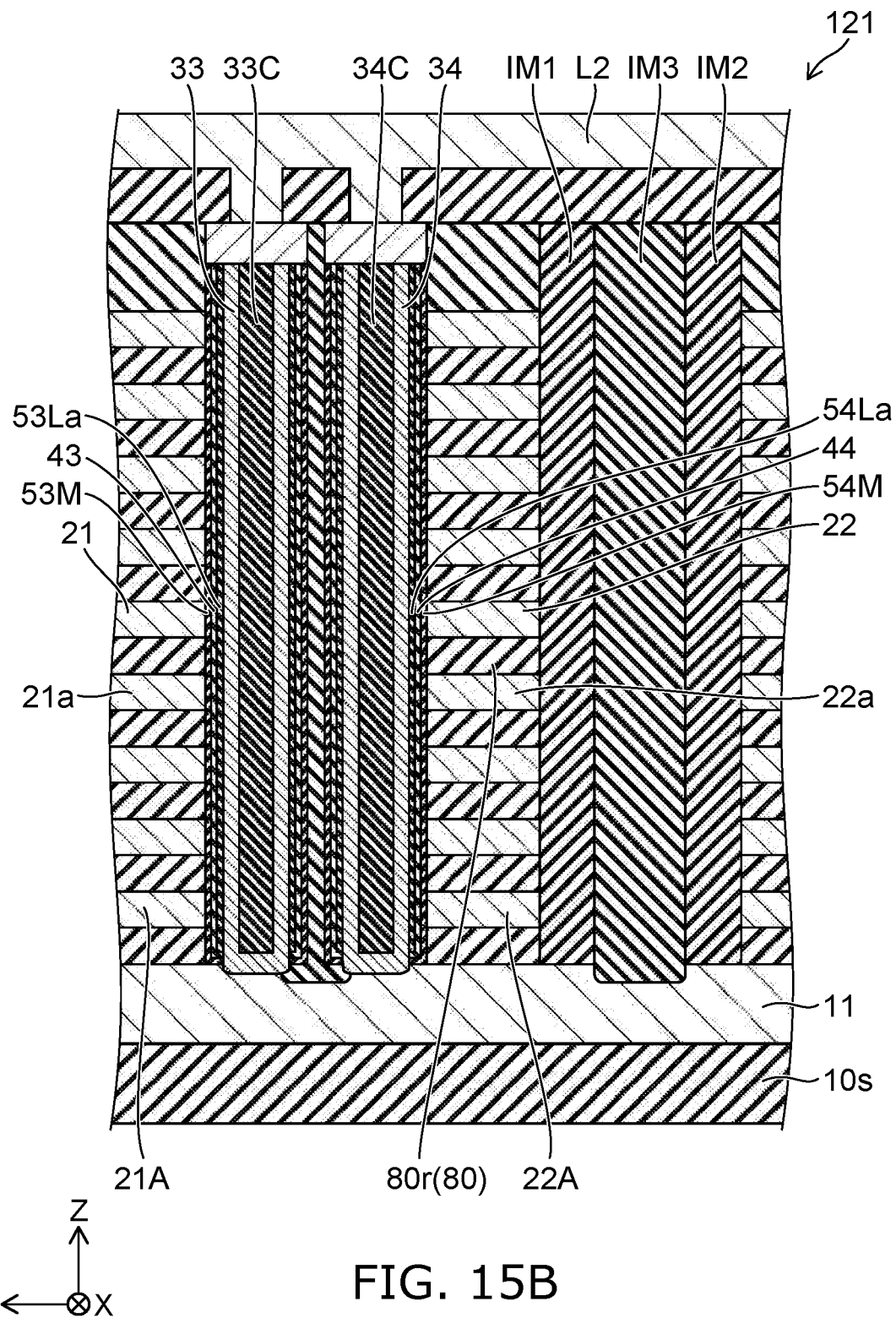

FIGS. 14, 15A, and 15B are schematic sectional views illustrating another memory device according to the second embodiment.

FIG. 14 is a sectional view taken along line A1-A3 of FIG. 15A. FIG. 15A is a sectional view corresponding to FIG. 3A. FIG. 15B is a sectional view corresponding to FIG. 3B.

As shown in FIG. 14, the first conductive layer 21 and the second conductive layer 22 are not set back in the alternative memory device 121 according to the embodiment. In the memory device 121, the first charge storage member 41 and the second charge storage member 42 are non-conductive (e.g. insulative). Thus, as shown in FIGS. 15A and 15B, the first charge storage member 41 may be provided continuously in a plurality of first electrode layers 21A arranged in the Z-axis direction. The second charge storage member 42 may be provided continuously in a plurality of second electrode layers 22A arranged in the Z-axis direction.

For instance, part of one first charge storage member 41 is opposed to one of the plurality of first electrode layers 21A (e.g. first conductive layer 21). Another part of one first charge storage member 41 may be opposed to another of the plurality of first electrode layers 21A (e.g. conductive layer 21a (see FIGS. 3A and 3B)).

For instance, part of one second charge storage member 42 is opposed to one of the plurality of second electrode layers 22A (e.g. second conductive layer 22). Another part of one second charge storage member 42 may be opposed to another of the plurality of second electrode layers 22A (e.g. conductive layer 22a (see FIGS. 3A and 3B)). The memory device 121 can also provide a memory device capable of improving memory density.

In manufacturing the memory devices 120 and 121, for instance, an insulative film is formed in forming the first functional film Mf1. For instance, in the processing illustrated in FIG. 7B, a film containing at least one selected from the group consisting of silicon, metal, silicon nitride, silicon oxide, metal nitride, and metal oxide is formed on the surface of the first film 50E and the second film 50G exposed in each of the fourth hole H4 and the fifth hole H5. This film contains e.g. silicon nitride. This film constitutes e.g. a first charge storage member 41 and a second charge storage member 42.

(Third Embodiment)

Figure 16:
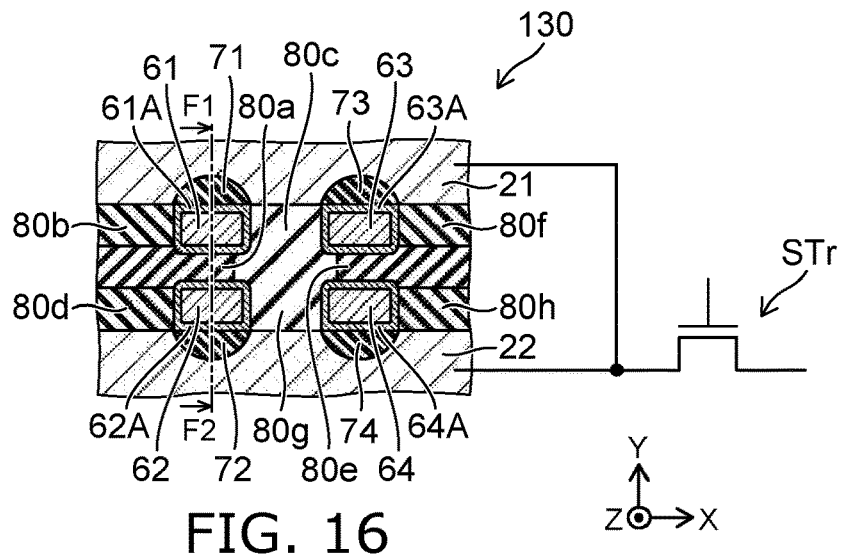
FIG. 16 is a schematic sectional view illustrating a memory device according to a third embodiment.
Figure 17:
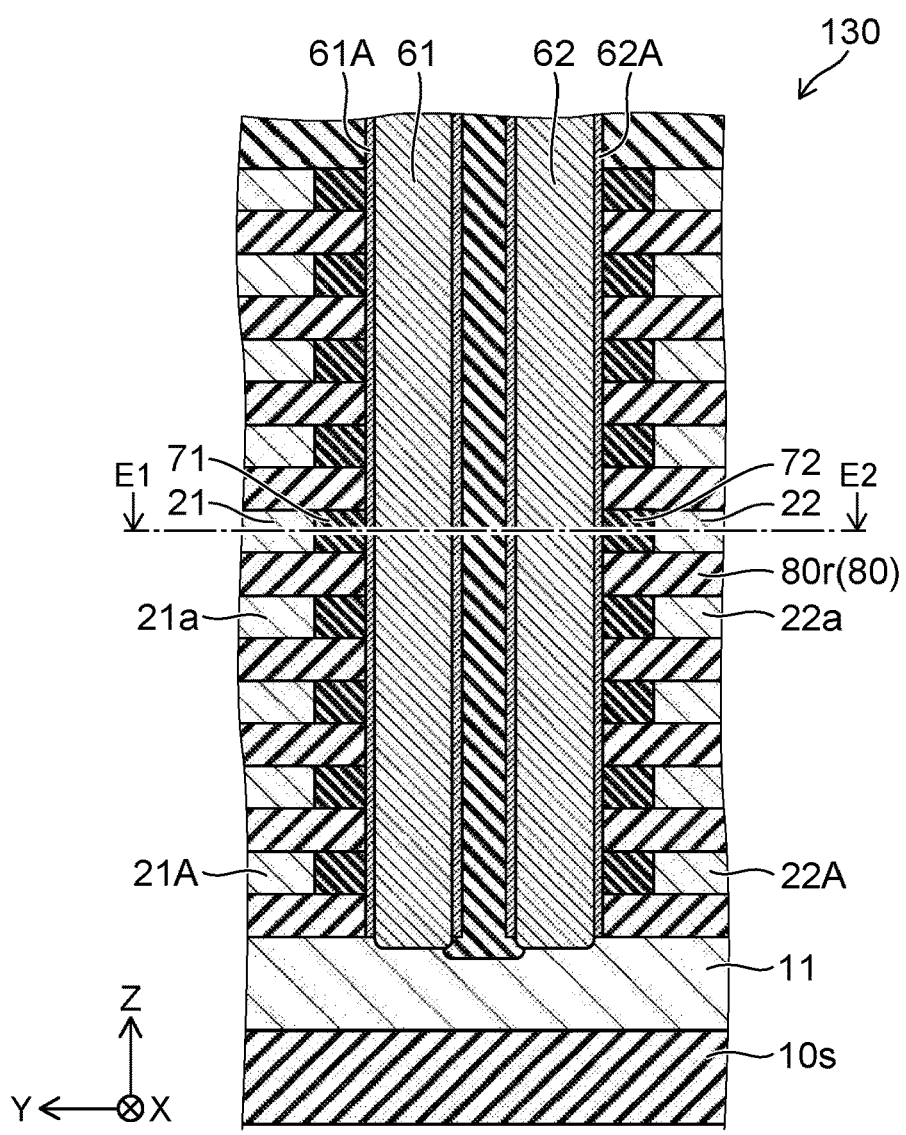
FIG. 17 is a schematic sectional view illustrating the memory device according to the third embodiment.

FIGS. 16 and 17 are schematic sectional views illustrating a memory device according to a third embodiment.

FIG. 16 is a sectional view taken along line E1-E2 of FIG. 17. FIG. 17 is a sectional view taken along line F1-F2 of FIG. 16.

As shown in FIGS. 16 and 17, the memory device 130 according to the embodiment is provided with a first conductive layer 21, a second conductive layer 22, a first conductive member 61, a second conductive member 62, a first resistance change member 71, a second resistance change member 72, and an insulating part 80.

The first conductive layer 21 extends along the first direction (e.g. X-axis direction). The second conductive layer 22 is spaced from the first conductive layer 21 in the second direction. The second direction crosses the first direction. In this example, the second direction is the Y-axis direction. The second conductive layer 22 extends along the first direction.

As shown in FIG. 17, the first conductive member 61 extends along the third direction. The third direction crosses a plane including the first direction and the second direction (X-Y plane). The third direction is e.g. the Z-axis direction. The first conductive member 61 passes between the first conductive layer 21 and the second conductive layer 22. The second conductive member 62 extends along the third direction. The second conductive member 62 passes between the first conductive member 61 and the second conductive layer 22. At least part of the first conductive member 61 is located between the first conductive layer 21 and the second conductive layer 22. At least part of the second conductive member 62 is located between the first conductive member 61 and the second conductive layer 22.

The first resistance change member 71 is provided between the first conductive layer 21 and the first conductive member 61. The second resistance change member 72 is provided between the second conductive layer 22 and the second conductive member 62.

The first resistance change member 71 and the second resistance change member 72 contain e.g. oxygen and at least one element selected from the group consisting of rare-earth metal, calcogenide, Mott insulator, ferroelectric, organic molecule, and organic metal. The first resistance change member 71 and the second resistance change member 72 contain e.g. titanium oxide (such as $TiO_x$). The first resistance change member 71 and the second resistance change member 72 may contain e.g. Ge, Sb, and Te. The first resistance change member 71 and the second resistance change member 72 may contain e.g. a GST material.

The first resistance change member 71 and the second resistance change member 72 may contain a material of the phase transition type. The first resistance change member 71 and the second resistance change member 72 may contain a material of ion memory (such as filament type). For instance, the first resistance change member 71 may include a first insulating material part (such as silicon oxide) and an element contained in at least one of the first conductive layer 21 and the first conductive member 61. The element (such as Ag) contained in at least one of the first conductive layer 21 and the first conductive member 61 constitutes e.g. a filament.

As shown in FIG. 16, the insulating part 80 includes a first insulating region 80a and a second insulating region 80b. The first insulating region 80a is located between the first resistance change member 71 and the second resistance change member 72. The direction from the second insulating region 80b to the first conductive member 61 lies along the first direction (X-axis direction).

Also in the memory device 130, the material contained in the second insulating region 80b is different from the material contained in the first insulating region 80a.

The memory device 130 can be manufactured by e.g. modifying part of the method for manufacturing the memory device 110. Also in the memory device 130, two conductive members (the first conductive member 61 and the second conductive member 62) are provided between two conductive layers (the first conductive layer 21 and the second conductive layer 22) arranged in the Y-axis direction. This can provide a memory device capable of improving memory density. For instance, the spacing (e.g. pitch) in the Y-axis direction between such two conductive members can be made small.

This example is further provided with a first rectification layer 61A and a second rectification layer 62A. The first rectification layer 61A is provided at least one of between the first resistance change member 71 and the first conductive layer 21 and between the first resistance change member 71 and the first conductive member 61. The second rectification layer 62A is provided at least one of between the second resistance change member 72 and the second conductive layer 22 and between the second resistance change member 72 and the second conductive member 62. These rectification layers include e.g. a semiconductor film. These rectification layers include e.g. a diode. These rectification layers include e.g. a p-i-n diode or a p-n diode. These rectification layers may include e.g. a Schottky diode. These rectification layers thus provided can suppress malfunctions such as miswrite.

The configuration described above may be repetitively provided in the memory device 130. As shown in FIG. 16, for instance, the memory device 130 may be further provided with a third conductive member 63 and a fourth conductive member 64, and further provided with a third resistance change member 73 and a fourth resistance change member 74. The memory device 130 may be further provided with a third rectification layer 63A and a fourth rectification layer 64A.

As shown in FIG. 16, in one example of the memory device 130, the first conductive layer 21 and the second conductive layer 22 are connected to a select transistor STr.

An example of the method for manufacturing the memory device 130 is described in the following.

For instance, the processing similar to that described with reference to FIGS. 5A, 5B, and 6A to 6F is performed. Subsequently, the following processing is performed.

FIGS. 18A to 18D are schematic sectional views illustrating a method for manufacturing the memory device according to the third embodiment.

Figure 18A:
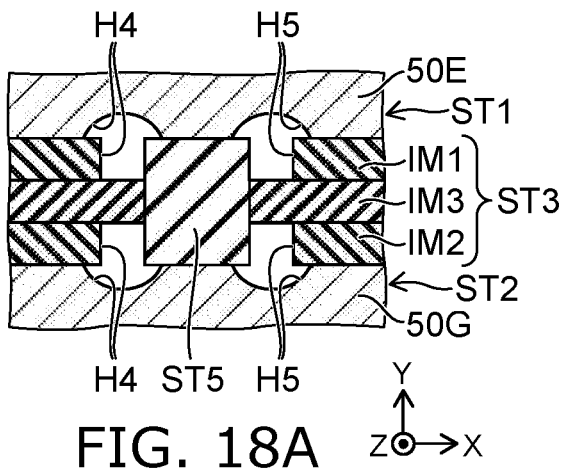
FIGS. 18A to 18D are schematic views illustrating a method for manufacturing the memory device according to the third embodiment.

As shown in FIG. 18A, also in this example, the first film 50E (e.g. a plurality of first films 50E) and the second film 50G (e.g. a plurality of second films 50G) exposed in the fourth hole H4 and the fifth hole H5 are set back after forming the fourth hole H4 and the fifth hole H5.

Figure 18B:
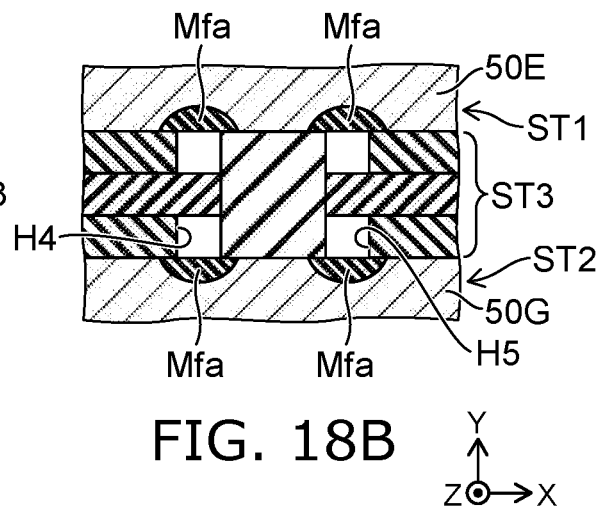

As shown in FIG. 18B, a first functional film Mfa is formed on the surface of the first film 50E (e.g. a plurality of first films 50E) and the second film 50G (e.g. a plurality of second films 50G) exposed in each of the fourth hole H4 and the fifth hole H5. The first functional film Mfa constitutes e.g. a resistance change member (such as a first resistance change member 71, a second resistance change member 72, a third resistance change member 73, and a fourth resistance change member 74). The first functional film Mfa contains e.g. oxygen and at least one element selected from the group consisting of rare-earth metal, calcogenide, Mott insulator, ferroelectric, organic molecule, and organic metal. The first functional film Mfa may contain e.g. a GST material.

Figure 18C:
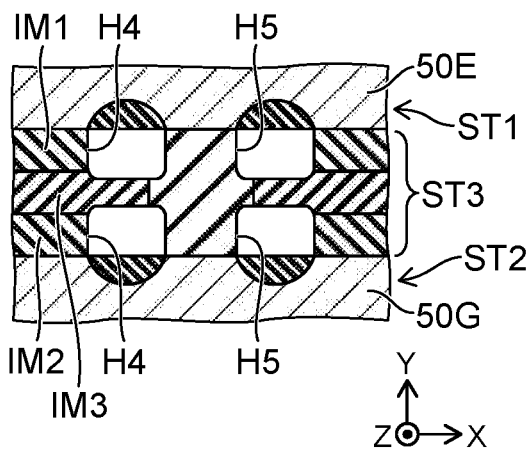

As shown in FIG. 18C, the size of the fourth hole H4 and the fifth hole H5 is expanded after forming the first functional film Mfa.

Figure 18D:
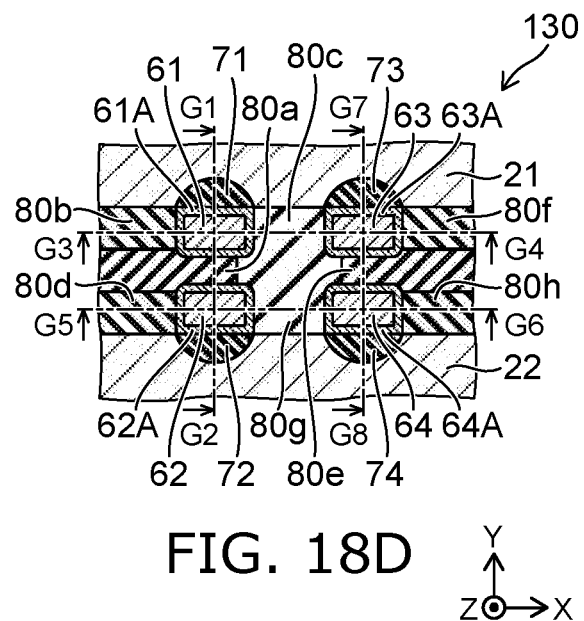

A first member 30M is formed as shown in FIG. 18D. The first member 30M extends along the third direction (Z-axis direction) in the residual space of the fourth hole H4 and the residual space of the fifth hole H5. In this example, the first member 30M includes a conductive member extending along the third direction (Z-axis direction). For instance, a plurality of first members 30M are provided. The plurality of first members 30M include e.g. first to fourth conductive members 61-64.

For instance, one of the plurality of first members 30M includes e.g. a first conductive member 61 and a first rectification layer 61A. Another of the plurality of first members 30M includes e.g. a second conductive member 62 and a second rectification layer 62A. For instance, the memory device 130 can be manufactured by the above processing.

Also in manufacturing the memory device 130, for instance, the positions in the X-Y plane of two fourth holes H4 and two fifth holes H5 may change in an interlocked manner along the Z-axis direction. In response thereto, in the set of four conductive members (first to fourth conductive members 61-64), the shape of these conductive members may change in an interlocked manner. An example of this change is described in the following.

FIGS. 19A to 19D are schematic sectional views illustrating part of a memory device according to the third embodiment.

Figure 19A:
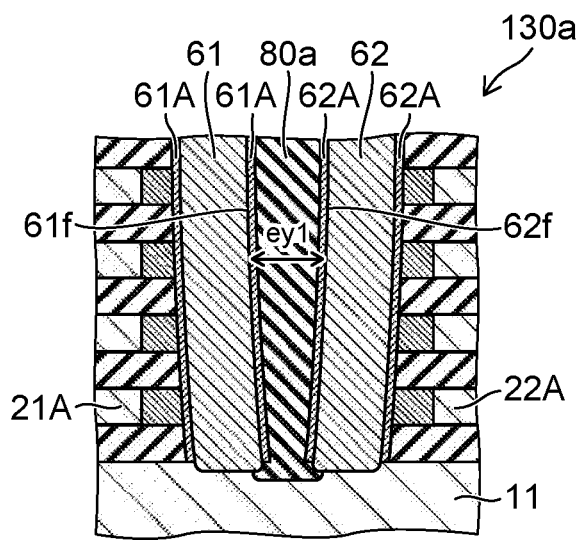
FIGS. 19A to 19D are schematic views illustrating a part of a memo device according to the third embodiment.
Figure 19B:
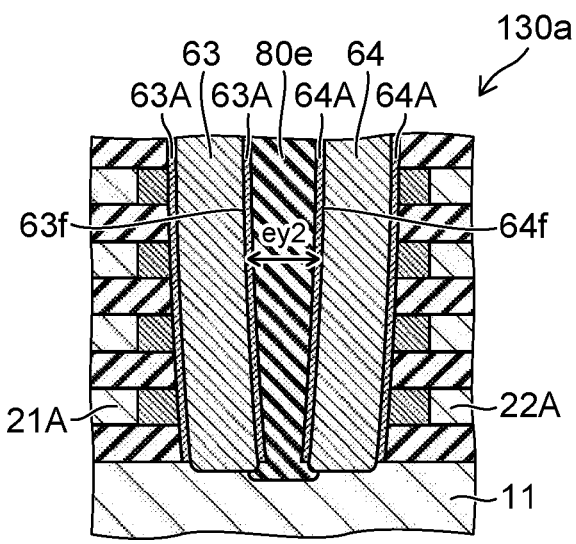
Figure 19C:
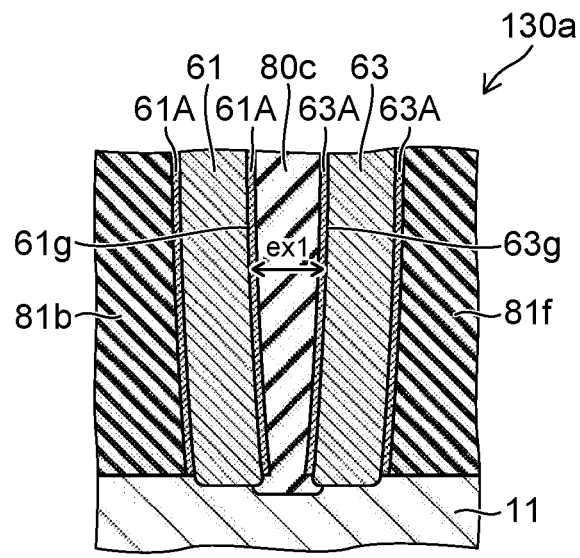
Figure 19D:
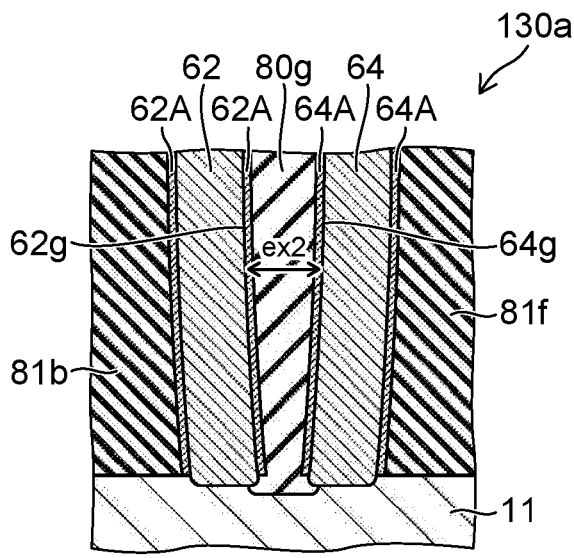
Figure 20A:
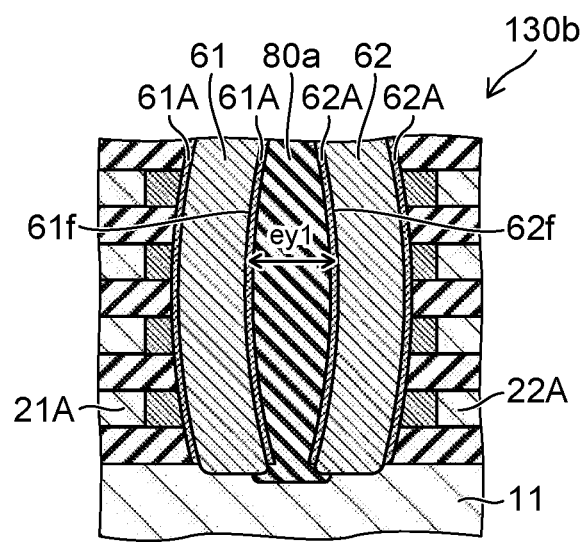
FIGS. 20A to 20D are schematic views illustrating a part of a memory device according to a first variation of the third embodiment.
Figure 20B:
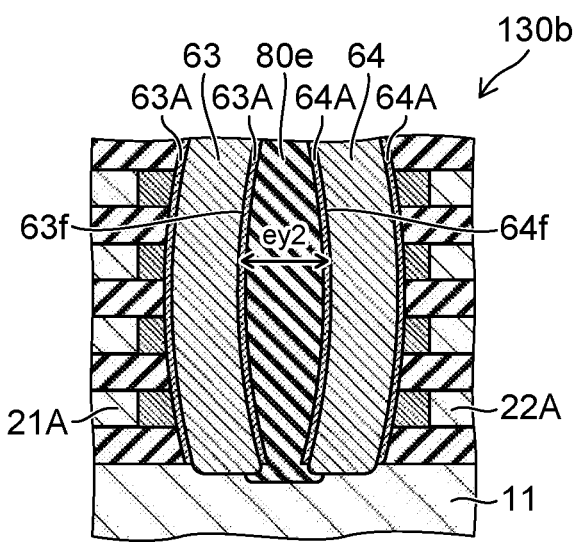
Figure 20C:
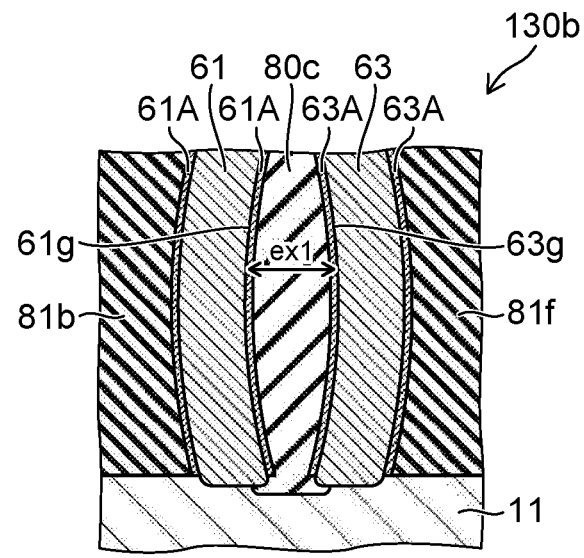
Figure 20D:
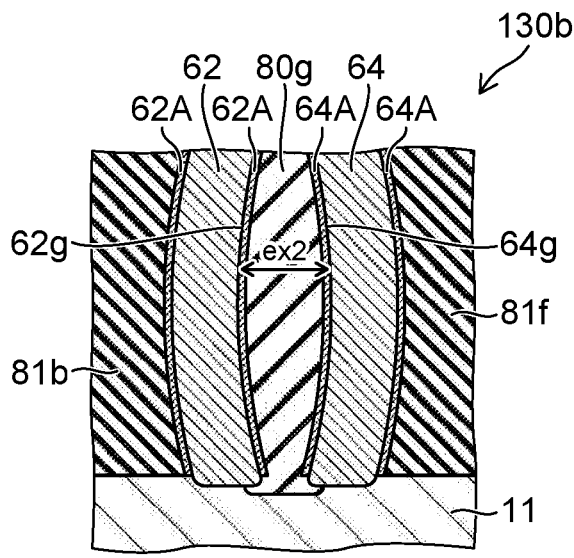
Figure 21A:
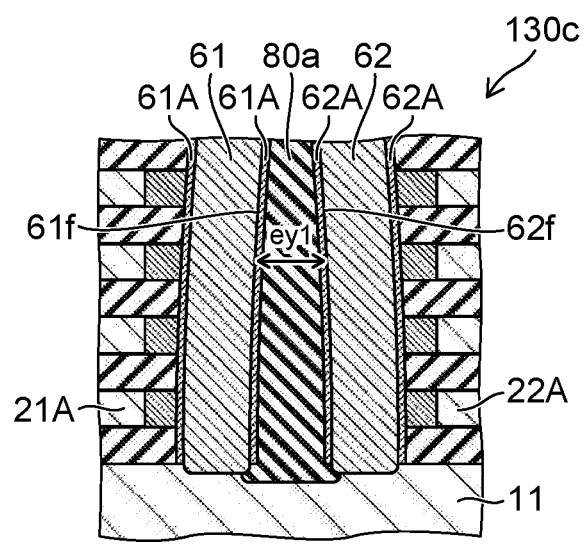
FIGS. 21A to 21D are schematic views illustrating a part of a memory device according to a second variation of the third embodiment.
Figure 21B:
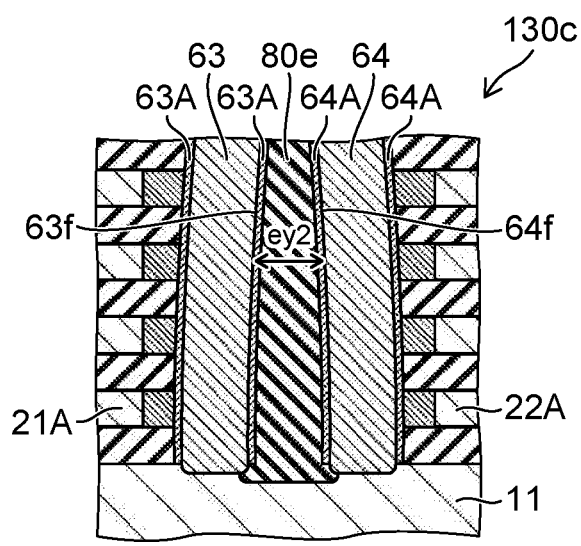
Figure 21C:
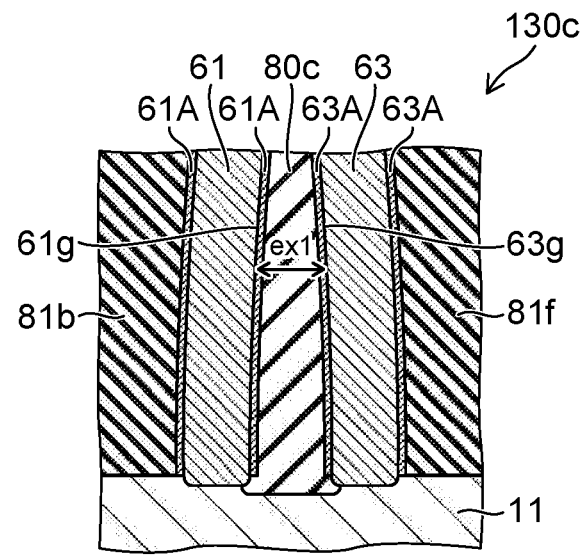
Figure 21D:
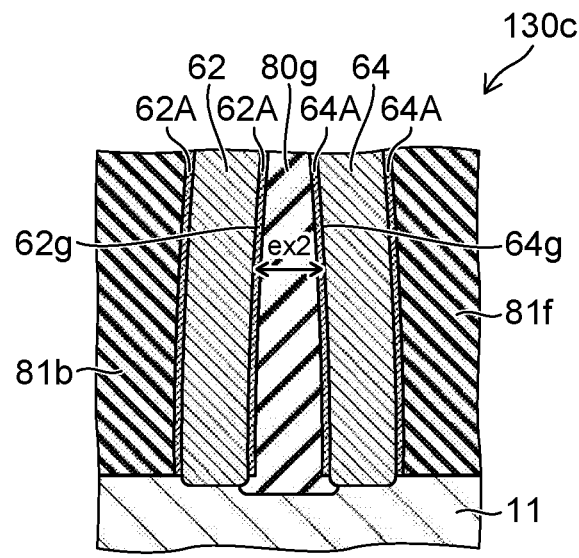
Figure 22A:
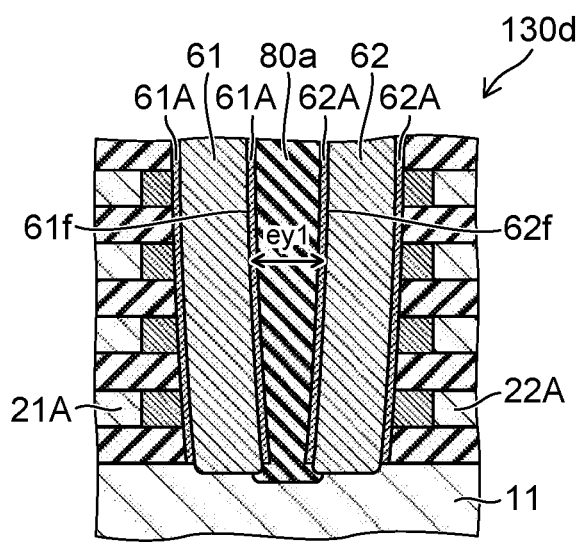
FIGS. 22A to 22D are schematic views illustrating a part of a memory device according to a third variation of the third embodiment.
Figure 22B:
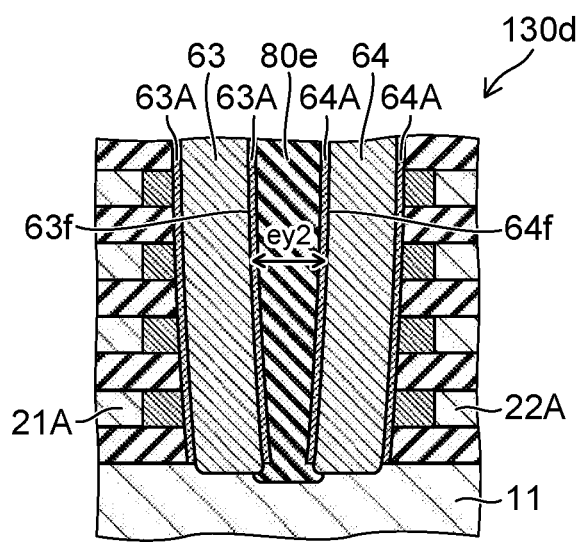
Figure 22C:
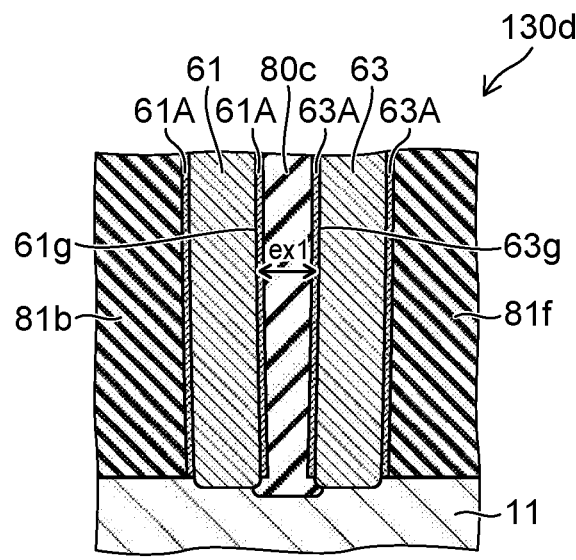
Figure 22D:
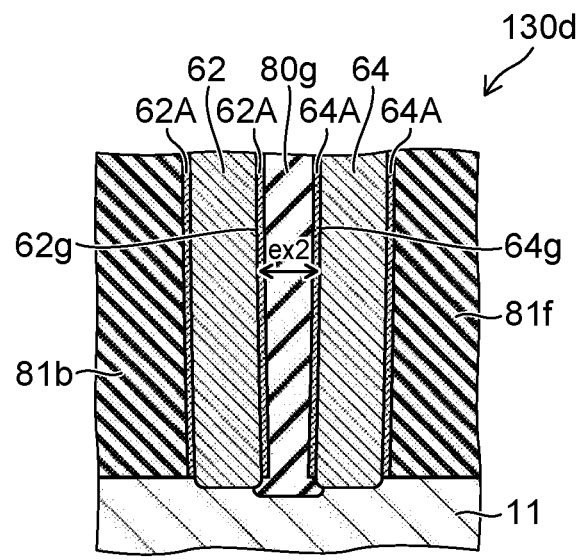

FIG. 19A is a sectional view taken along line G1-G2 of FIG. 18D. FIG. 19B is a sectional view taken along line G7-G8 of FIG. 18D. FIG. 19C is a sectional view taken along line G3-G4 of FIG. 18D. FIG. 19D is a sectional view taken along line G5-G6 of FIG. 18D. These figures illustrate a memory device 130a according to the embodiment.

As shown in FIG. 19A, the first conductive member 61 has a side surface 61f. The side surface 61f is e.g. a surface on the second conductive member 62 side in the Y-axis direction. The second conductive member 62 has a side surface 62f. The side surface 62f is e.g. a surface on the first conductive member 61 side in the Y-axis direction. The distance ey1 along the Y-axis direction between the side surface 61f and the side surface 62f changes along the Z-axis direction. In this example, the distance ey1 at a first height position is shorter than the distance ey1 at a second height position. The distance along the Z-axis direction between the first height position and the conductive base member 11 is shorter than the distance along the Z-axis direction between the second height position and the conductive base member 11.

As shown in FIG. 19B, the third conductive member 63 has a side surface 63f. The side surface 63f is e.g. a surface on the fourth conductive member 64 side in the Y-axis direction. The fourth conductive member 64 has a side surface 64f. The side surface 64f is e.g. a surface on the third conductive member 63 side in the Y-axis direction. The distance ey2 along the Y-axis direction between the side surface 63f and the side surface 64f changes along the Z-axis direction. In this example, the distance ey2 at the first height position is shorter than the distance ey2 at the second height position.

As shown in FIG. 19C, the first conductive member 61 has a side surface 61g. The side surface 61g is e.g. a surface on the third conductive member 63 side in the X-axis direction. The third conductive member 63 has a side surface 63g. The side surface 63g is e.g. a surface on the first conductive member 61 side in the X-axis direction. The distance ex1 along the X-axis direction between the side surface 61g and the side surface 63g changes along the Z-axis direction. In this example, the distance ex1 at the first height position is shorter than the distance ex1 at the second height position.

As shown in FIG. 19D, the second conductive member 62 has a side surface 62g. The side surface 62g is e.g. a surface on the fourth conductive member 64 side in the X-axis direction. The fourth conductive member 64 has a side surface 64g. The side surface 64g is e.g. a surface on the second conductive member 62 side in the X-axis direction. The distance ex2 along the X-axis direction between the side surface 62g and the side surface 64g changes along the Z-axis direction. In this example, the distance ex2 at the first height position is shorter than the distance ex2 at the second height position.

For instance, the change of the distance ey1 per unit length in the Z-axis direction is substantially equal to the change of the distance ey2 per unit length in the Z-axis direction. For instance, the former is 0.8 times or more and 1.2 times or less of the latter.

For instance, the change of the distance ex1 per unit length in the Z-axis direction is substantially equal to the change of the distance ex2 per unit length in the Z-axis direction. For instance, the former is 0.8 times or more and 1.2 times or less of the latter.

For instance, the change of the distance ey1 per unit length in the Z-axis direction is substantially equal to the change of the distance ex1 per unit length in the Z-axis direction. For instance, the former is 0.8 times or more and 1.2 times or less of the latter.

For instance, the change of the distance ey2 per unit length in the Z-axis direction is substantially equal to the change of the distance ex2 per unit length in the Z-axis direction. For instance, the former is 0.8 times or more and 1.2 times or less of the latter.

FIGS. 20A to 20D are schematic sectional views illustrating part of a memory device according to the third embodiment.

FIGS. 20A to 20D are sectional views corresponding to FIGS. 19A to 19D, respectively. These figures illustrate a memory device 130b according to the embodiment.

In the memory device 130b, the distance ey1, the distance ey2, the distance ex1, and the distance ex2 increase and decrease along the Z-axis direction.

FIGS. 21A to 21D are schematic sectional views illustrating part of a memory device according to the third embodiment.

FIGS. 21A to 21D are sectional views corresponding to FIGS. 19A to 19D, respectively. These figures illustrate a memory device 130c according to the embodiment.

In the memory device 130c, in each of the distance ey1, the distance ey2, the distance ex1, and the distance ex2, the value at the second height position is larger than the value at the first height position. Also in this case, the distance along the Z-axis direction between the first height position and the conductive base member 11 is shorter than the distance along the Z-axis direction between the second height position and the conductive base member 11.

Thus, in the set of four conductive members (first to fourth conductive members 61-64), the shape of these conductive members changes in an interlocked manner. This causes the change as described above along the Z-axis direction in the distance ey1, the distance ey2, the distance ex1, and the distance ex2.

Also in the memory devices 130b and 130c described above, for instance, the change of the distance ey1 per unit length in the Z-axis direction is 0.8 times or more and 1.2 times or less of the change of the distance ey2 per unit length in the Z-axis direction. For instance, the change of the distance ey1 per unit length in the Z-axis direction is 0.8 times or more and 1.2 times or less of the change of the distance ex2 per unit length in the Z-axis direction.

For instance, the change of the distance ey1 per unit length in the Z-axis direction is 0.8 times or more and 1.2 times or less of the change of the distance ex1 per unit length in the Z-axis direction. For instance, the change of the distance ey2 per unit length in the Z-axis direction is 0.8 times or more and 1.2 times or less of the change of the distance ex2 per unit length in the Z-axis direction.

In the above manufacturing method, the material of the first material insulating part IM1 is different from the material of the third material insulating part IM3. These materials are mutually different in etching rate. Thus, for instance, when the first material insulating part IM1 and the third material insulating part IM3 are processed simultaneously, the obtained shape may be different from each other. Such difference in shape may be observed in the manufactured memory device. An example of such difference in shape is described in the following.

FIGS. 22A to 22D are schematic sectional views illustrating part of a memory device according to the third embodiment.

FIGS. 22A to 22D are sectional views corresponding to FIGS. 19A to 19D, respectively. These figures illustrate a memory device 130d according to the embodiment.

In the memory device 130d, for instance, the change of the distance ey1 per unit length in the Z-axis direction is 0.8 times or more and 1.2 times or less of the change of the distance ey2 per unit length in the Z-axis direction. For instance, the change of the distance ex1 per unit length in the Z-axis direction is 0.8 times or more and 1.2 times or less of the change of the distance ex2 per unit length in the Z-axis direction.

On the other hand, in the memory device 130d, for instance, the change of the distance ey1 per unit length in the Z-axis direction may be different from the change of the distance ex1 per unit length in the Z-axis direction. For instance, the change of the distance ey2 per unit length in the Z-axis direction may be different from the change of the distance ex2 per unit length in the Z-axis direction.

For instance, a two-terminal resistance change memory is manufactured in the third embodiment. For instance, in a memory string, a bit line metal (such as the first conductive member 61) extends perpendicular to the substrate plate (substrate 10s). The material of the film contained in the memory cell is different from that of the first embodiment. Also in the third embodiment, two kinds of silicon oxide films are buried in the trench Tr. Four holes are formed from one hole using wet etching and film formation technique of high coverage.

(Fourth Embodiment)

In the embodiment, eight or more holes are formed from one hole (first hole).

FIGS. 23A to 23F are schematic sectional views illustrating a method for manufacturing a memory device according to the fourth embodiment.

FIGS. 24A to 24E are schematic sectional views illustrating the method for manufacturing a memory device according to the fourth embodiment.

Figure 23A:
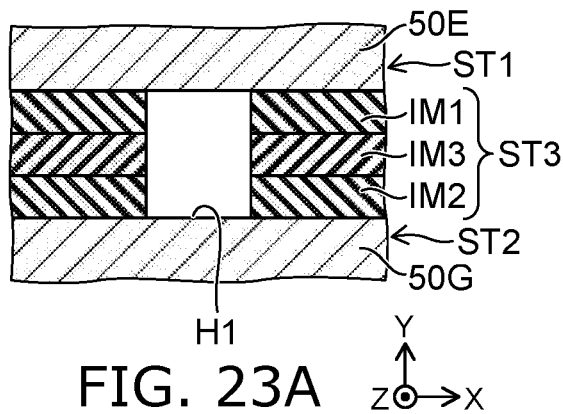
FIGS. 23A to 24E are schematic views illustrating a memory device according to a fourth embodiment.

As shown in FIG. 23A, a first hole H1 is formed in the first structural body ST1 and the second structural body ST2. The first structural body ST1 includes a first film 50E. The second structural body ST2 includes a second film 50G.

Figure 23B:
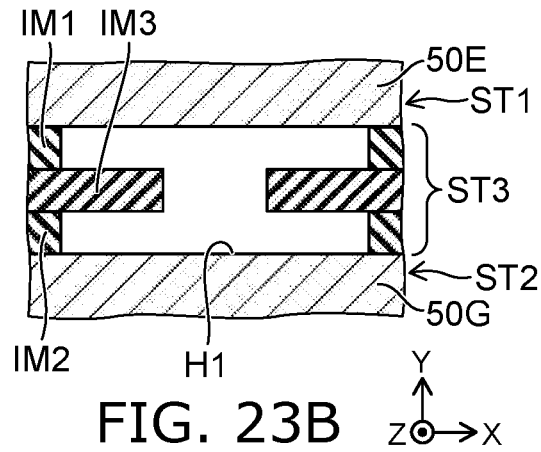

As shown in FIG. 23B, the first material insulating part IM1 and the second material insulating part IM2 exposed in the first hole H1 are set back. This expands the size of the first hole H1.

Figure 23C:
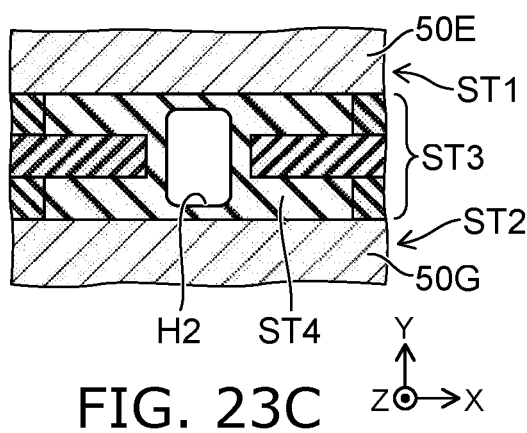

As shown in FIG. 23C, subsequently, a film of a fourth material is formed in the first hole H1. A fourth structural body ST4 is formed from the fourth material. The fourth material (fourth structural body ST4) is e.g. amorphous silicon. The fourth structural body ST4 has a second hole H2.

Figure 23D:
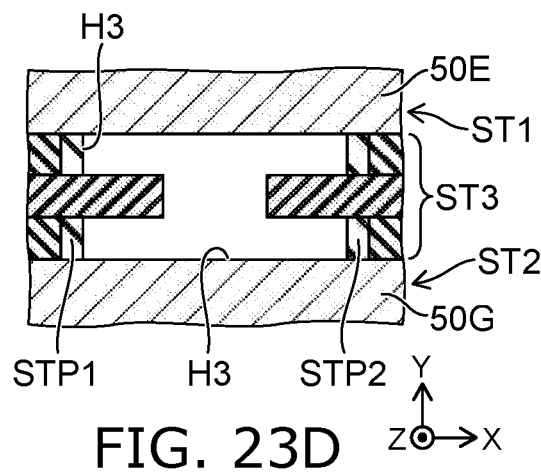

As shown in FIG. 23D, part of the fourth structural body ST4 is removed to form a third hole H3. For instance, the third hole H3 is formed by expanding the size of the second hole H2. For instance, a silicon column (a film of the fourth material) remains in four gaps. This leaves a first residual portion STP1 and a second residual portion STP2.

Figure 23E:
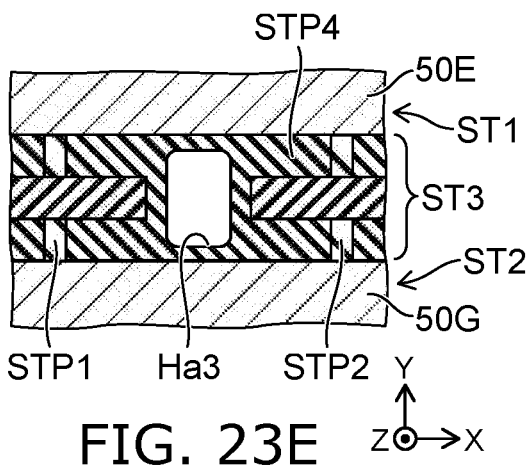

As shown in FIG. 23E, a structural body STa4 of e.g. silicon oxide is formed in the third hole H3. The structural body STa4 has a hole Ha3.

Figure 23F:
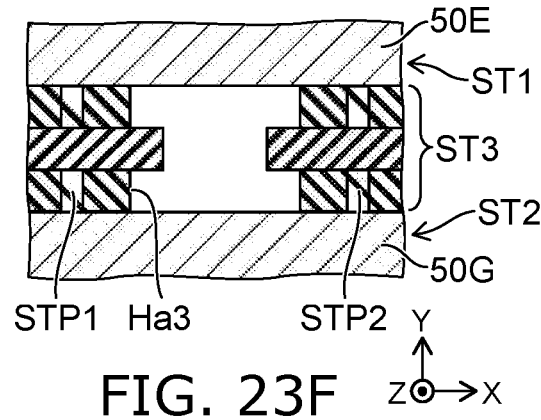

As shown in FIG. 23F, the size of the hole Ha3 is expanded by removing part of the structural body STa4.

Figure 24A:
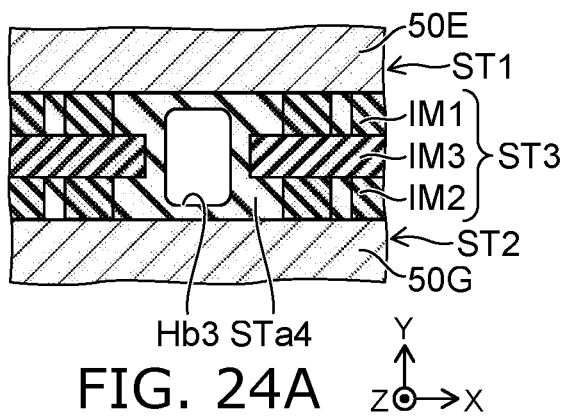

As shown in FIG. 24A, a film of the fourth material is formed in part of the hole Ha3 having the expanded size to form a structural body STa4. The film of the fourth material (structural body STa4) is e.g. amorphous silicon. The structural body STa4 has a hole Hb3.

Figure 24B:
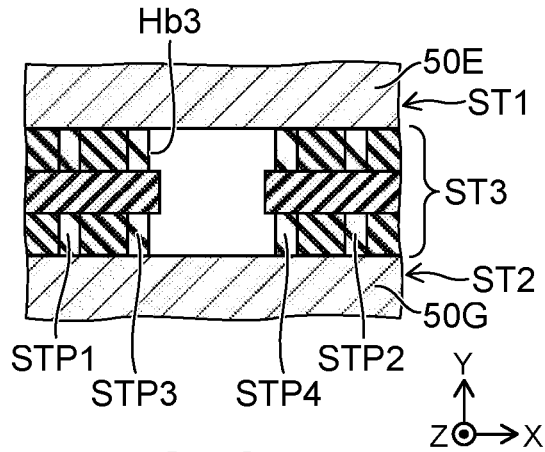

As shown in FIG. 24B, the size of the hole Hb3 is expanded by removing part of the structural body STa4. For instance, a silicon column (a film of the fourth material) remains in four gaps. This leaves a third residual portion STP3 and a fourth residual portion STP4.

Figure 24C:
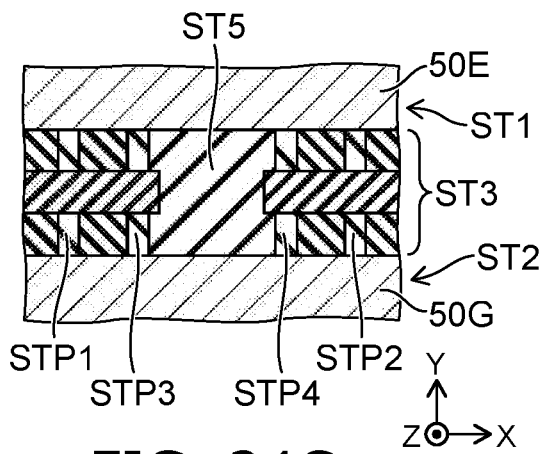

As shown in FIG. 24C, a fifth material is buried in the hole Hb3 to form a fifth structural body ST5 from the fifth material. The fifth structural body ST5 extends along the third direction (Z-axis direction). The fifth material is e.g. silicon oxide film.

Figure 24D:
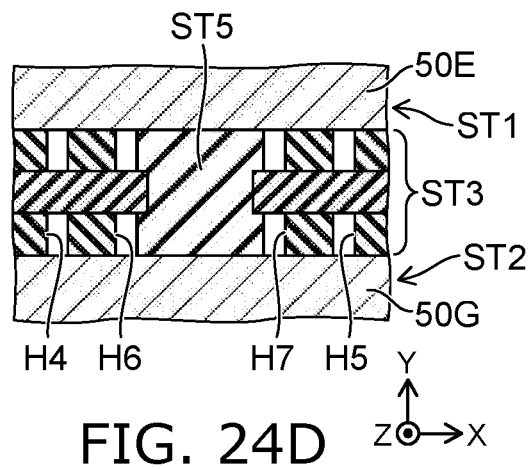

As shown in FIG. 24D, the first residual portion STP1, the second residual portion STP2, the third residual portion STP, and the fourth residual portion STP4 are removed after forming the fifth structural body ST5. This forms a fourth hole H4, a fifth hole H5, a hole H6, and a hole H7.

Figure 24E:
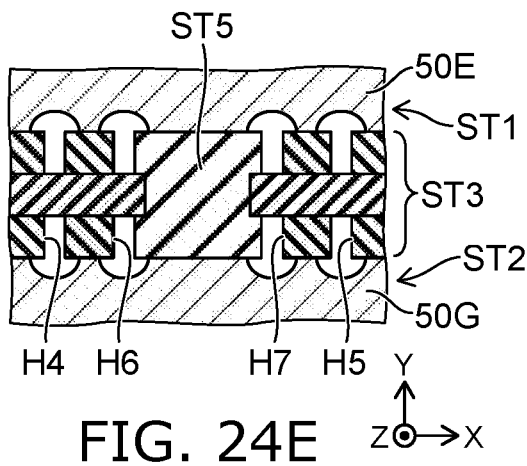

As shown in FIG. 24E, the first film 50E and the second film 50G exposed in the fourth hole H4, the fifth hole H5, the hole H6, and the hole H7 are set back after forming the fourth hole H4, the fifth hole H5, the hole H6, and the hole H7.

Then, a first functional film Mf1 is formed on the surface of the first film 50E (e.g. a plurality of first films 50E) and the second film 50G (e.g. a plurality of second films 50G) exposed in each of these holes. Subsequently, the memory device can be formed by performing e.g. the processing described with reference to FIGS. 7C and 7D.

In this example, two fourth holes H4, two fifth holes H5, two holes H6, and two holes H7 are formed based on one first hole H1.

In the foregoing, 4M (M being an integer of one or more) holes can be formed based on one first hole H1 by repeating the processing illustrated in FIGS. 23C to 23F.

Figure 25:
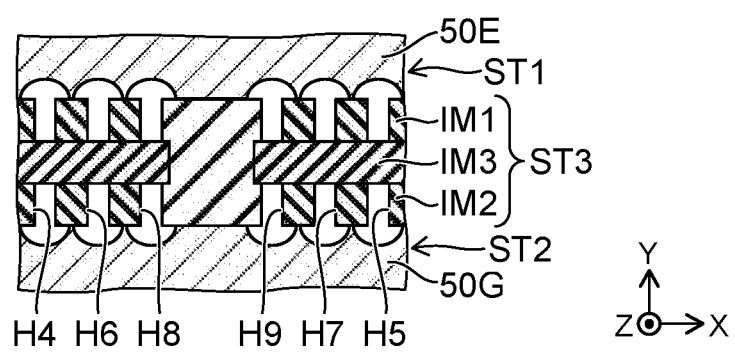
FIG. 25 is a schematic view illustrating another memory device according to the fourth embodiment.

FIG. 25 is a schematic sectional view illustrating a method for manufacturing an alternative memory device according to the fourth embodiment.

FIG. 25 is a sectional view corresponding to FIG. 24E.

The processing illustrated in FIGS. 23C to 23F is further repeated in this example. Thus, as shown in FIG. 25, two fourth holes H4, two fifth holes H5, two holes H6, two holes H7, two holes H8, and two holes H9 are formed based on one first hole H1.

The above embodiment provides e.g. a three-dimensional memory. Improvement in bit density is desired in the three-dimensional memory. Hole processing with high aspect ratio is performed in the three-dimensional memory. In the embodiment, a plurality of holes are formed based on one hole. This can provide a high-density memory.

For instance, a 3D memory having four floating gates is provided based on one hole. For instance, a 3D memory having four charge storage members is provided based on one hole. For instance, a memory having four ReRAM cells is provided based on one hole. For instance, a memory having four PCM (phase change memory) cells is provided based on one hole.

For instance, eight, twelve, or sixteen partitioned cells are provided based on one hole. For instance, 4M (M being an integer of one or more) holes are formed based on one hole.

For instance, the word line of the memory cell may be formed by the replace method in the manufacturing method according to the embodiment. A vertical gate transistor may be obtained in the manufacturing method according to the embodiment.

In the embodiment, for instance, the film (the first film 50E and the second film 50G) is set back from a plurality of locations of one hole on one plane, and a memory cell is buried therein. Thus, 4M (M being an integer of one or more) memory cells are formed from one hole. The manufacturing method according to the embodiment is applied to e.g. a memory device in which a memory string extends perpendicular to the substrate plate.

In the embodiment, for instance, a memory cell is provided at a position where one of a plurality of word lines crosses one of a plurality of bit lines. For instance, the embodiment can miniaturize at least one of a select gate and a global bit line. For instance, the embodiment can reduce the number of word line driving transistors.

The above embodiment provides e.g. a memory device and a method for manufacturing a memory device capable of improving memory density.

In this specification, "perpendicular" and "parallel" mean not only being exactly perpendicular and exactly parallel, but include e.g. variations in the manufacturing process, and only need to mean being substantially perpendicular and substantially parallel.

(Fifth Embodiment)

FIGS. 26A to 26J are schematic sectional views illustrating a method for manufacturing the memory device 110 according to a fifth embodiment. FIGS. 26A to 26J are sectional views taken along the X-Y plane and show a manufacturing process following FIG. 5B.

Figure 26A:
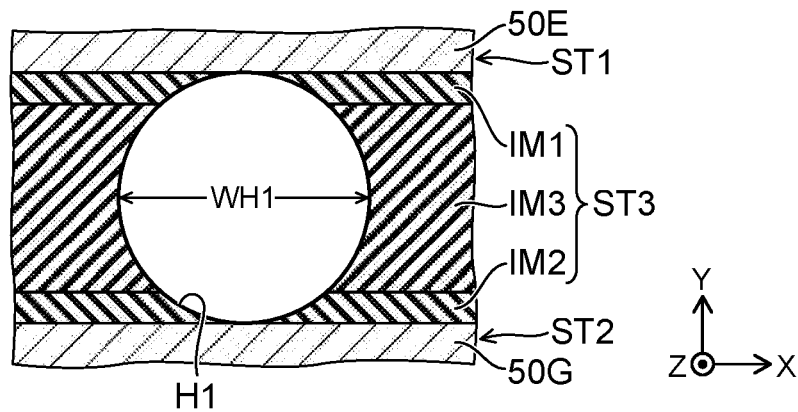
FIGS. 26A to 26J are schematic views illustrating a method for manufacturing a memory device according to a fifth embodiment.

As shown in FIG. 26A, a first hole H1 extending along the Z-axis direction is formed in the third structural body ST3. The first hole H1 is formed by removing part of the first material insulating part IM1, part of the second material insulating part IM2, and part of the third material insulating part IM3. The first hole H1 is formed so as to have a generally circular shape in a cross section along the X-Y plane and to have a width WH1 in the X-axis direction. WH1 is e.g. equal to the spacing between the first film 50E and the second film 50G.

Figure 26B:
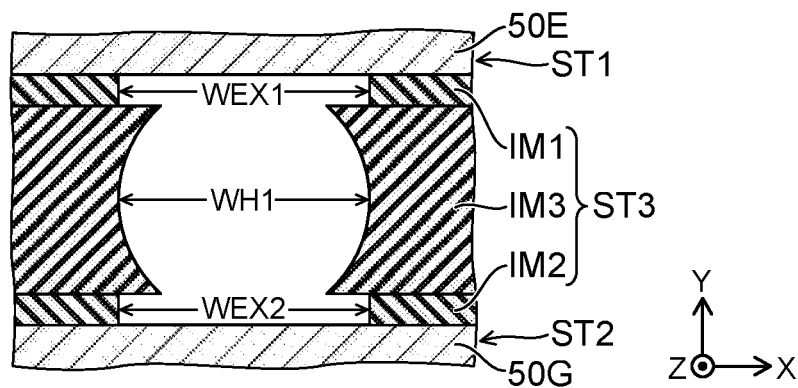

As shown in FIG. 26B, the first material insulating part IM1 and the second material insulating part IM2 exposed in the first hole H1 are set back in the X-axis direction. For instance, hydrofluoric acid treatment is performed. Thus, the amount of setback in the first material insulating part IM1 and the second material insulating part IM2 is made larger than the amount of setback in the third material insulating part IM3 due to the difference of etching rate in the silicon oxide films (the first material insulating part IM1, the second material insulating part IM2, and the third material insulating part IM3).

In this case, preferably, the width WEX1 in the X-axis direction of the setback portion of the first material insulating part IM1 and the width WEX2 in the X-axis direction of the setback portion of the second material insulating part IM2 are generally equal to the size WH1 in the X-axis direction of the first hole H1, or does not exceed WH1.

Figure 26C:
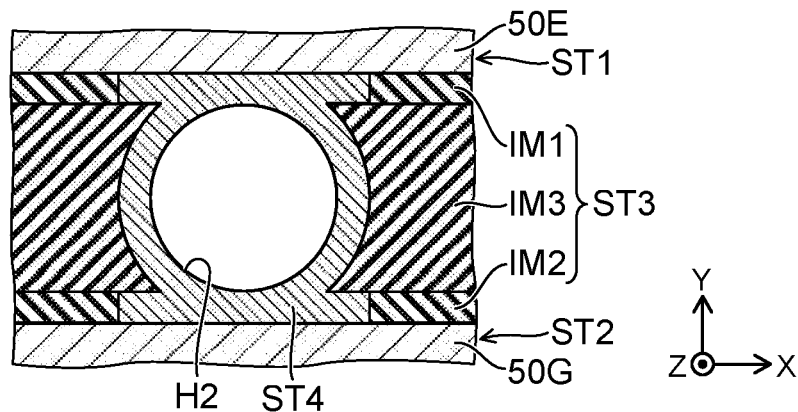

As shown in FIG. 26C, a film of a fourth material is formed on the inner surface of the first hole H1. This forms a fourth structural body ST4. The fourth structural body ST4 has a second hole H2 extending along the Z-axis direction. For instance, the fourth material (fourth structural body ST4) is silicon. The film of the fourth material is formed by e.g. the CVD method. This film of the fourth material is formed preferentially in the space formed by the setback of the first material insulating part IM1 and the second material insulating part IM2. The second hole H2 is formed by appropriately controlling the thickness of the film of the fourth material.

Figure 26D:
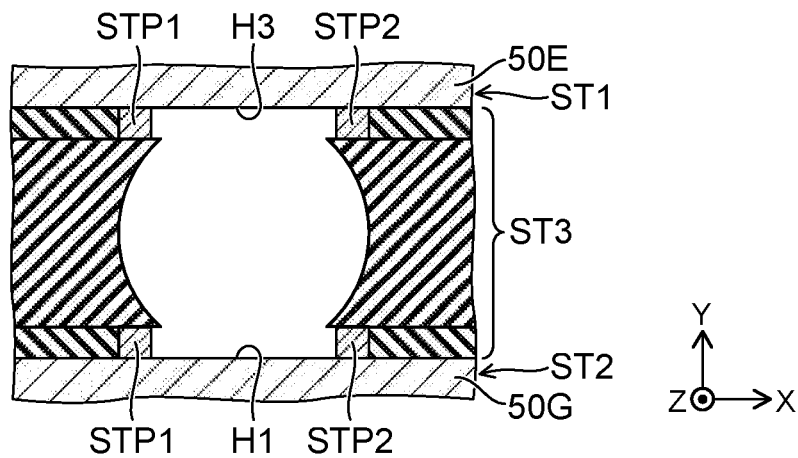

As shown in FIG. 26D, part of the fourth structural body ST4 is removed to form a third hole H3. For instance, the third hole H3 is formed by expanding the size of the second hole H2. The removal of part of the fourth structural body ST4 is performed by e.g. dissolving silicon by alkali treatment. The third hole H3 is formed by controlling the amount of dissolved silicon. For instance, a silicon column remains in four gaps produced by partly removing the first material insulating part IM1 and the second material insulating part IM2.

The first film 50E (e.g. a plurality of first films 50E) and the second film 50G (e.g. a plurality of second films 50G) are exposed in the third hole H3. A first residual portion STP1 and a second residual portion STP2 of the fourth structural body ST4 remain in the third hole H3.

Figure 26E:
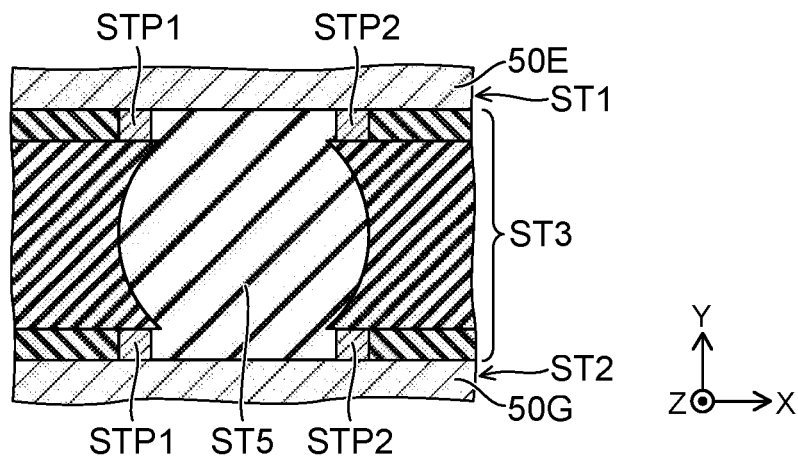

As shown in FIG. 26E, a fifth material is buried in the third hole H3 to form a fifth structural body ST5 from the fifth material. The fifth structural body ST5 extends along the Z-axis direction. The fifth material is e.g. silicon oxide.

Figure 26F:
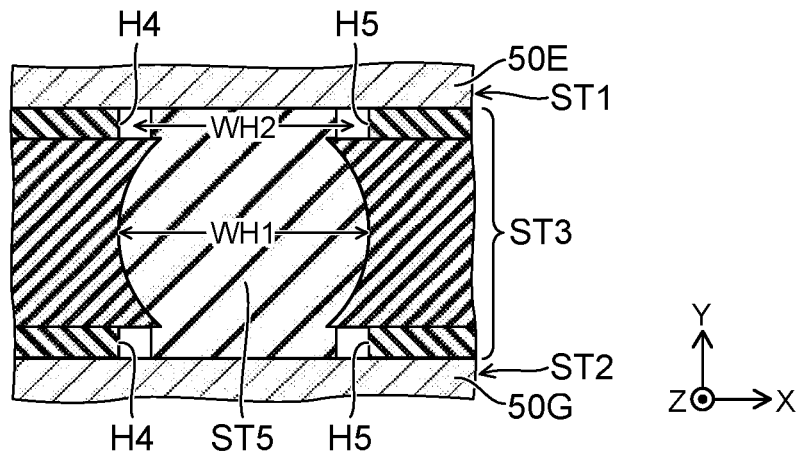

As shown in FIG. 26F, the first residual portion STP1 and the second residual portion STP2 are removed after forming the fifth structural body ST5. This forms a fourth hole H4 and a fifth hole H5. For instance, a surface portion of silicon oxide buried in the third hole H3 is removed to expose the first residual portion STP1 and the second residual portion STP2. Furthermore, alkali treatment is performed to selectively dissolve the column-shaped silicon portions (the first residual portion STP1 and the second residual portion STP2). This forms e.g. four holes (two fourth holes H4 and two fifth holes H5). The spacing WH2 in the X-axis direction between the center of the fourth hole H4 and the center of the fifth hole H5 is made equal to or narrower than the width WH1 in the X-axis direction of the first hole H1.

Figure 26G:
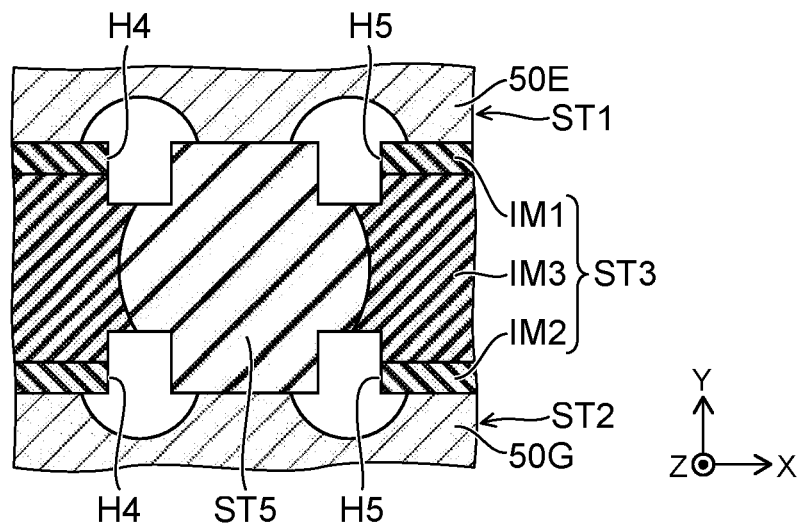

As shown in FIG. 26G, the first film 50E and the second film 50G exposed in the fourth hole H4 and the fifth hole H5 are set back. The size of each of the fourth hole H4 and the fifth hole H5 is expanded toward the first film 50E and the second film 50G. For instance, part of the plurality of first films 50E and the plurality of second films 50G (arc-shaped portion) is removed starting from the column-shaped holes (two fourth holes H4 and two fifth holes H5). At this time, the size of the fourth hole H4 and the fifth hole H5 may be expanded in advance by partly removing the first material insulating part IM1, the second material insulating part IM2, the third material insulating part IM3, and the fifth structural body ST5.

Figure 26H:
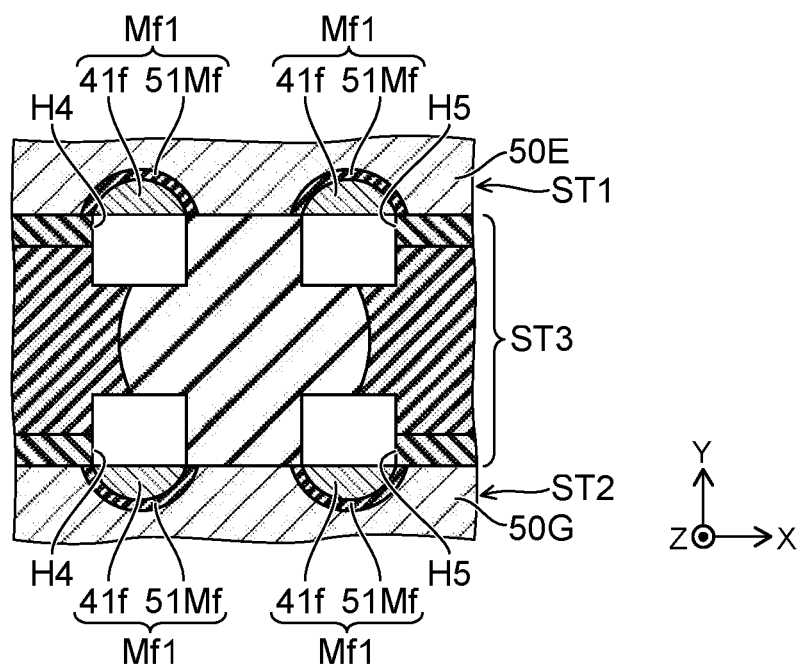

As shown in FIG. 26H, a first functional film Mf1 is formed on the surface of the first film 50E (e.g. a plurality of first films 50E) and the second film 50G (e.g. a plurality of second films 50G) exposed in each of the fourth hole H4 and the fifth hole H5. The first functional film Mf1 includes a memory film insulating film 51Mf and a charge storage film 41f. The memory film insulating film 51Mf is located between the charge storage film 41f and the first film 50E. The memory film insulating film 51Mf is located between the charge storage film 41f and the second film 50G. The charge storage film 41f corresponds to the first charge storage layer 41 in FIG. 1. The insulating film 51Mf corresponds to the first insulating member 51M.

For instance, the memory film insulating film 51Mf is formed on the inner surface of the fourth hole H4 and the fifth hole H5. Subsequently, the charge storage film 41f is formed on the surface of the memory film insulating film 51Mf. In this case, the first functional film Mf1 is formed so that the space (arc-shaped portion) formed by partly removing the first film 50E and the second film 50G is occluded to leave the space inside the fourth hole H4 and the fifth hole H5. Subsequently, the first functional film Mf1 formed on the inner surface of the fourth hole H4 and the fifth hole H5 is removed while leaving the first functional film Mf1 occluding the space formed by partly removing the first film 50E and the second film 50G.

Thus, the charge storage film 41f formed by the method of selectively setting back the plurality of first films 50E and the plurality of second films 50G in the fourth hole H4 and the fifth hole H5 is separated from each other in the Z-axis direction. The charge storage film 41f is e.g. conductive. The charge storage film 41f is e.g. polysilicon. In this case, the charge storage film 41f constitutes a memory cell of the floating gate type.

Figure 26I:
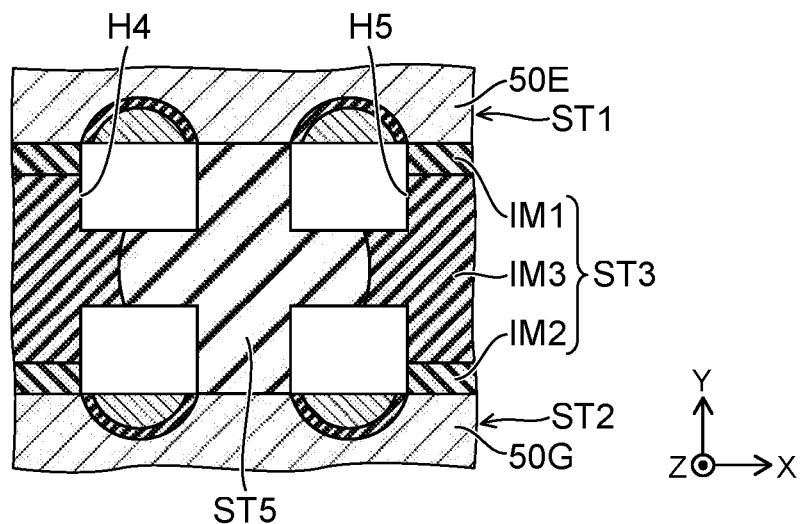

As shown in FIG. 26I, the size of the fourth hole H4 and the fifth hole H5 is expanded after forming the first functional film Mf1. For instance, the size of these holes is expanded by performing chemical liquid treatment or vapor phase treatment. For instance, treatment with buffered hydrofluoric acid is performed. This provides a substantially equal etching rate in the first material insulating part IM1, the second material insulating part IM2, the third material insulating part IM3, and the fifth structural body ST5.

Figure 26J:
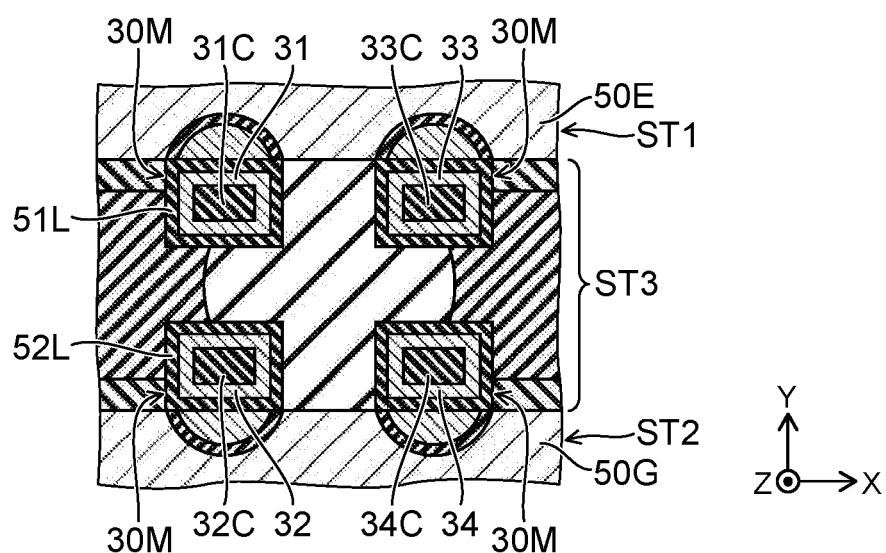

As shown in FIG. 26J, a first member 30M is formed inside the fourth hole H4 and the fifth hole H5. The first member 30M extends along the Z-axis direction in the residual space of the fourth hole H4 and the residual space of the fifth hole H5. The first member 30M includes e.g. a semiconductor member extending along the Z-axis direction. For instance, a plurality of first members 30M are provided. The plurality of first members 30M include e.g. first to fourth semiconductor members 31-34 and first to fourth core parts 31C-34C. One of the plurality of first members 30M includes e.g. a first semiconductor member 31, a first core part 31C, and a first insulating layer 51L. Another of the plurality of first members 30M includes e.g. a second semiconductor member 32, a second core part 32C, and a second insulating layer 52L.

The memory device 110 is formed by the processing described above. In the manufacturing method according to the embodiment, the spacing between the fourth hole H4 and the fifth hole H5 in the X-axis direction can be made narrower than the width WH1 in the X-axis direction of the first hole H1 formed initially. That is, the space between memory cells in the X-axis direction can be made narrower. This provides a memory device having improved memory density. The memory device 110 based on the manufacturing method according to the embodiment also has a cross-sectional shape similar to the shape shown in FIGS. 8A to 11D.

(Sixth Embodiment)

FIGS. 27A to 27K are schematic sectional views illustrating a method for manufacturing a memory device according to a sixth embodiment. FIGS. 27A to 27K are sectional views taken along the X-Y plane and show a manufacturing process following FIG. 5B.

Figure 27A:
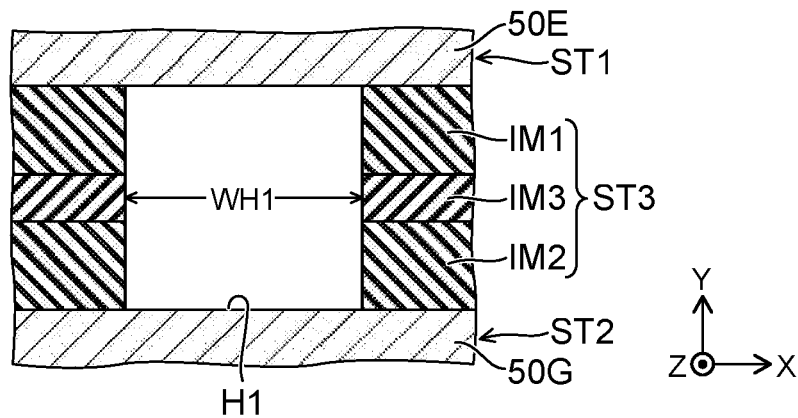
FIGS. 27A to 27K are schematic views illustrating a method for manufacturing a memory device according to a sixth embodiment.

As shown in FIG. 27A, a first hole H1 extending along the Z-axis direction is formed in the third structural body ST3. The first hole H1 is formed by removing part of the first material insulating part IM1, part of the second material insulating part IM2, and part of the third material insulating part IM3. The first hole H1 is formed so as to have a width WH1 in the X-axis direction.

Figure 27B:
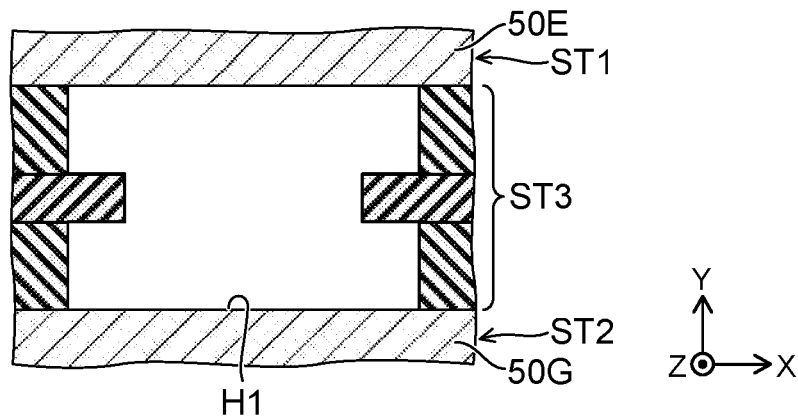

As shown in FIG. 27B, the first material insulating part IM1 and the second material insulating part IM2 exposed in the first hole H1 are set back in the X-axis direction. For instance, hydrofluoric acid treatment is performed. Thus, the amount of setback in the first material insulating part IM1 and the second material insulating part IM2 is made larger than the amount of setback in the third material insulating part IM3 due to the difference of etching rate in the silicon oxide films (the first material insulating part IM1, the second material insulating part IM2, and the third material insulating part IM3).

Figure 27C:
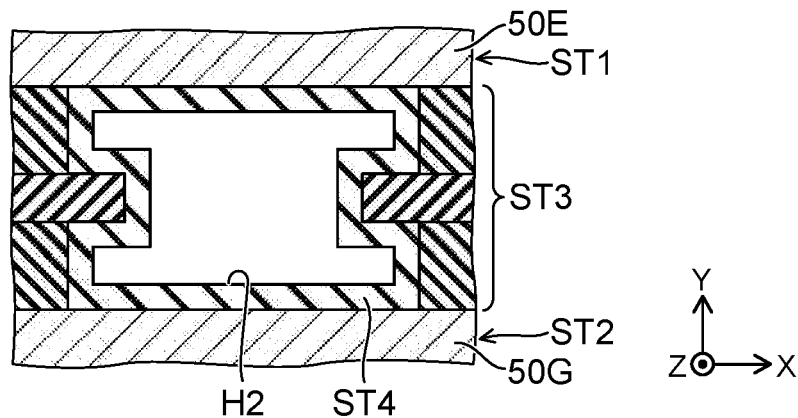

As shown in FIG. 27C, a film of a fourth material is formed on the inner surface of the first hole H1. This forms a fourth structural body ST4. The fourth structural body ST4 has a second hole H2 extending along the third direction. For instance, the fourth material (fourth structural body ST4) is silicon oxide. The second hole H2 has an H-shape in a cross section along the X-Y plane. That is, the film of the fourth material is a spacer film. The film of the fourth material is formed so as to reduce the size of the first hole H1 by which the first material insulating part IM1 and the second material insulating part IM2 are set back.

Figure 27D:
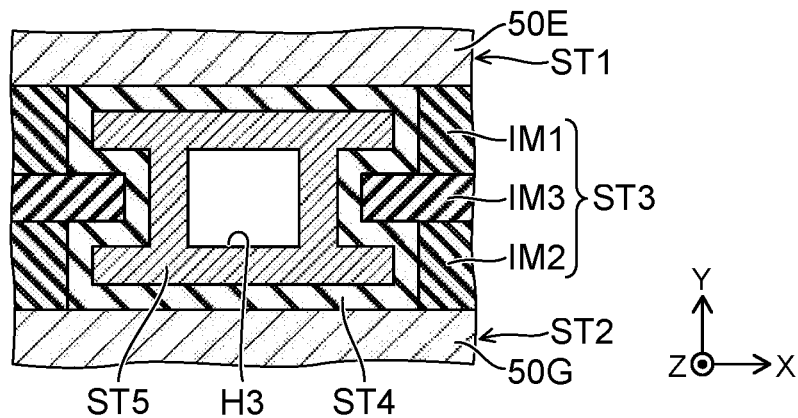

As shown in FIG. 27D, a film of a fifth material is formed on the inner surface of the second hole H2. This forms a fifth structural body ST5. The fifth structural body ST5 has a third hole H3 extending along the Z-axis direction. For instance, the fifth material (fifth structural body ST5) is silicon. The film of the fifth material is formed by e.g. the CVD method. This film of the fifth material is formed preferentially in the space of four corners formed by the setback of the first material insulating part IM1 and the second material insulating part IM2. The third hole H3 is formed by appropriately controlling the thickness of the film of the fifth material.

Figure 27E:
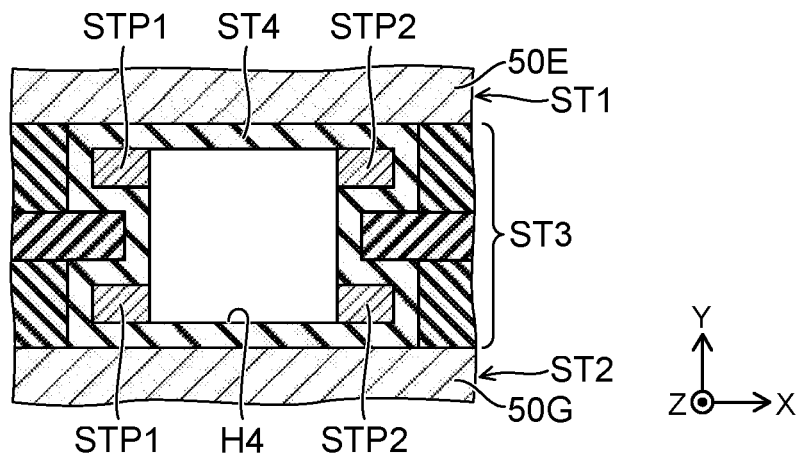

As shown in FIG. 27E, part of the fifth structural body ST5 is removed to form a fourth hole H4. For instance, the fourth hole H4 is formed by expanding the size of the third hole H3. The removal of part of the fifth structural body ST5 is performed by e.g. dissolving silicon by alkali treatment. The fourth hole H4 is formed by controlling the amount of dissolved silicon. For instance, a silicon column remains in the space of four corners formed by the setback of the first material insulating part IM1 and the second material insulating part IM2. That is, a first residual portion STP1 and a second residual portion STP2 of the fifth structural body ST5 remain at four corners of the fourth hole H4.

Figure 27F:
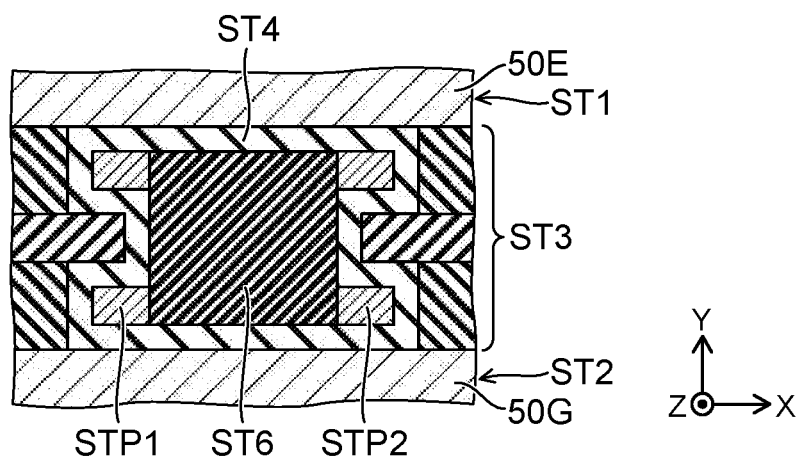

As shown in FIG. 27F, a sixth material is buried in the fourth hole H4 to form a sixth structural body ST6 from the sixth material. The sixth structural body ST6 extends along the Z-axis direction. The sixth material is e.g. silicon oxide.

Figure 27G:
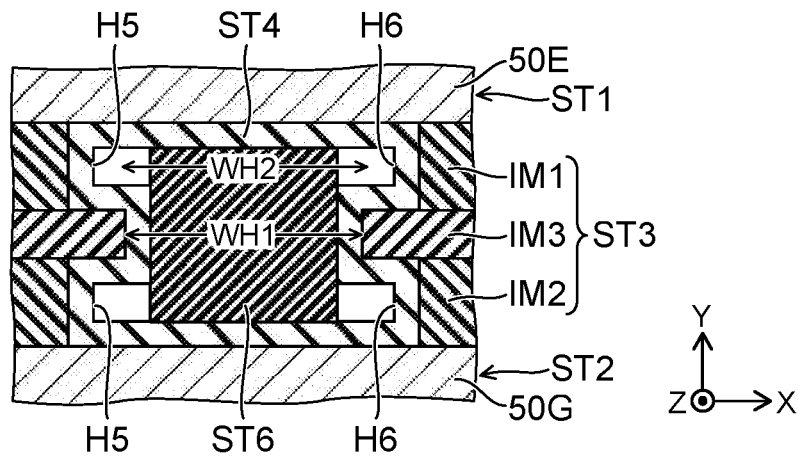

As shown in FIG. 27G, the first residual portion STP1 and the second residual portion STP2 are removed after forming the sixth structural body ST6. This forms a fifth hole H5 and a sixth hole H6. For instance, a surface portion of silicon oxide buried in the fourth hole H4 is removed to expose the first residual portion STP1 and the second residual portion STP2. Furthermore, alkali treatment is performed to selectively dissolve the column-shaped silicon portions (the first residual portion STP1 and the second residual portion STP2). This forms e.g. four holes (two fifth holes H5 and two sixth holes H6). The spacing WH2 in the X-axis direction between the center of the fifth hole H5 and the center of the sixth hole H6 is made equal to or narrower than the width WH1 in the X-axis direction of the first hole H1.

Figure 27H:
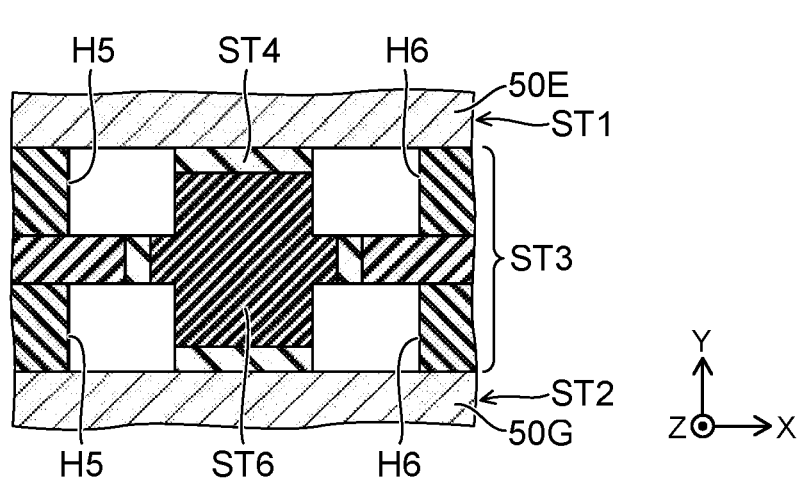

The size of the fifth hole H5 and the sixth hole H6 is expanded as shown in FIG. 27H. For instance, treatment with buffered hydrofluoric acid is performed to remove part of the fourth structural body ST4 and the sixth structural body ST6. The fourth structural body ST4 and the sixth structural body ST6 are isotropically removed at a substantially equal etching rate. The first film 50E and the second film 50G are each exposed in the fifth hole H5 and the sixth hole H6.

Figure 27I:
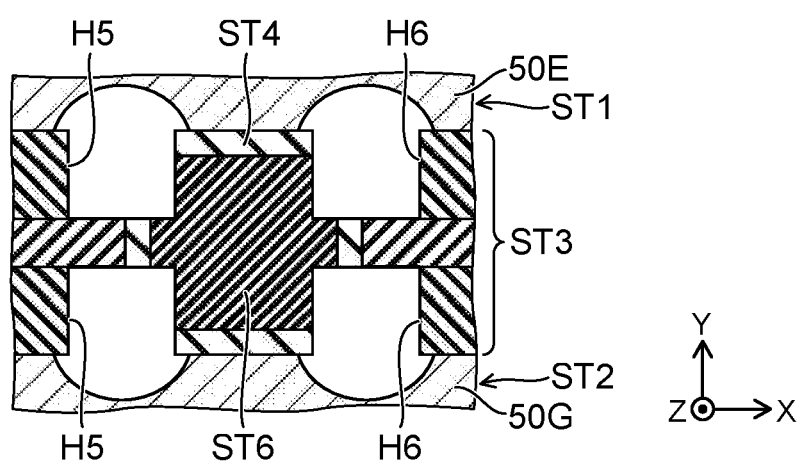

As shown in FIG. 27I, the first film 50E and the second film 50G exposed in the fifth hole H5 and the sixth hole H6 are set back. The size of each of the fifth hole H5 and the sixth hole H6 is expanded toward the first film 50E and the second film 50G. For instance, part of the plurality of first films 50E and the plurality of second films 50G (arc-shaped portion) is removed starting from the column-shaped holes (two fifth holes H5 and two sixth holes H6).

Figure 27J:
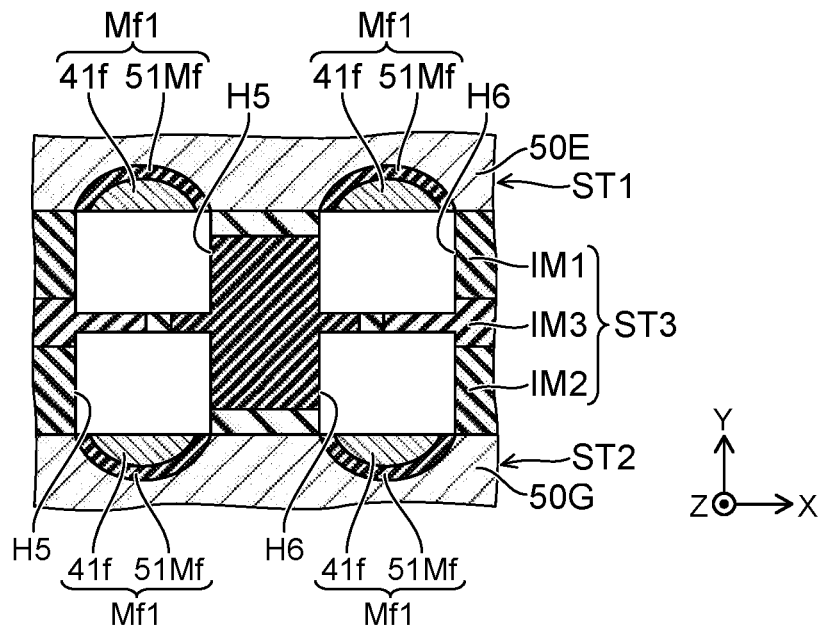

As shown in FIG. 27J, a first functional film Mf1 is formed on the surface of the first film 50E (e.g. a plurality of first films 50E) and the second film 50G (e.g. a plurality of second films 50G) exposed in each of the fifth hole H5 and the sixth hole H6. The first functional film Mf1 includes a memory film insulating film 51Mf and a charge storage film 41f. The memory film insulating film 51Mf is located between the charge storage film 41f and the first film 50E. The memory film insulating film 51Mf is located between the charge storage film 41f and the second film 50G. The charge storage film 41f corresponds to the first charge storage layer 41 in FIG. 1. The insulating film 51Mf corresponds to the first insulating member 51M.

For instance, the memory film insulating film 51Mf is formed on the inner surface of the fifth hole H5 and the sixth hole H6. Subsequently, the charge storage film 41f is formed on the surface of the memory film insulating film 51Mf. In this case, the first functional film Mf1 is formed so that the space (arc-shaped portion) formed by partly removing the first film 50E and the second film 50G is occluded to leave the space inside the fifth hole H5 and the sixth hole H6. Subsequently, the first functional film Mf1 formed on the inner surface of the fifth hole H5 and the sixth hole H6 is removed while leaving the first functional film Mf1 occluding the space formed by partly removing the first film 50E and the second film 50G.

The charge storage film 41f thus formed is separated from each other in the Z-axis direction. The charge storage film 41f is e.g. conductive. The charge storage film 41f is e.g. polysilicon. The charge storage film 41f constitutes a memory cell of the floating gate type.

Figure 27K:
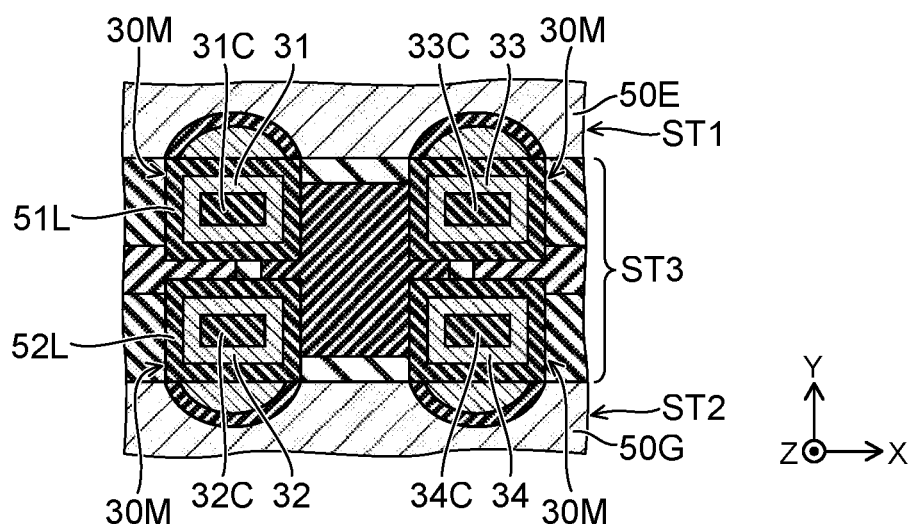

As shown in FIG. 27K, a first member 30M is formed inside the fifth hole H5 and the sixth hole H6. The first member 30M extends along the Z-axis direction in the residual space of the fifth hole H5 and the residual space of the sixth hole H6. The first member 30M includes e.g. a semiconductor member extending along the Z-axis direction. For instance, a plurality of first members 30M are provided. The plurality of first members 30M include e.g. first to fourth semiconductor members 31-34 and first to fourth core parts 31C-34C. One of the plurality of first members 30M includes e.g. a first semiconductor member 31, a first core part 31C, and a first insulating layer 51L. Another of the plurality of first members 30M includes e.g. a second semiconductor member 32, a second core part 32C, and a second insulating layer 52L.

The memory device 110 is formed by the processing described above. In the above method, the spacing between the fifth hole H5 and the sixth hole H6 in the X-axis direction can be made narrower than the width WH1 in the X-axis direction of the first hole H1 formed initially. That is, the space between memory cells in the X-axis direction can be made narrower. This provides a memory device having improved memory density. The memory device 110 based on the manufacturing method according to the embodiment also has a cross-sectional shape similar to the shape shown in FIGS. 8A to 11D.

(Seventh Embodiment)

FIGS. 28A to 28J are schematic sectional views illustrating a method for manufacturing a memory device according to a seventh embodiment. FIGS. 28A to 28J are sectional views taken along the X-Y plane and show a manufacturing process following FIG. 5B.

Figure 28A:
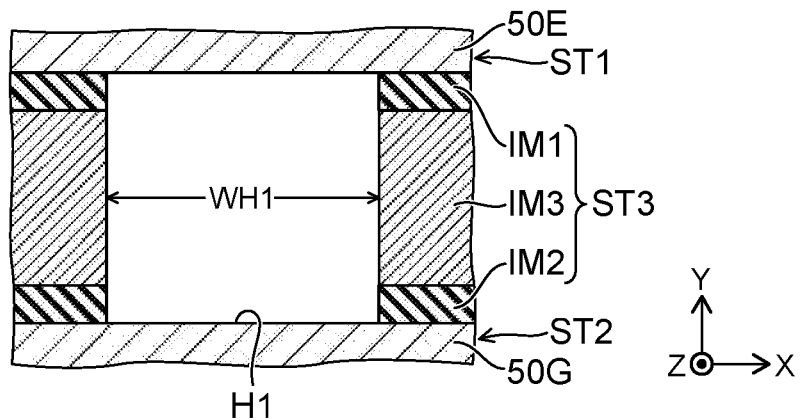
FIGS. 28A to 28J are schematic views illustrating a method for manufacturing a memory device according to a seventh embodiment.

As shown in FIG. 28A, a first hole H1 extending along the Z-axis direction is formed in the third structural body ST3. The first hole H1 is formed by removing part of the first material insulating part IM1, part of the second material insulating part IM2, and part of the third material insulating part IM3. The first hole H1 is formed so as to have a width WH1 in the X-axis direction.

Figure 28B:
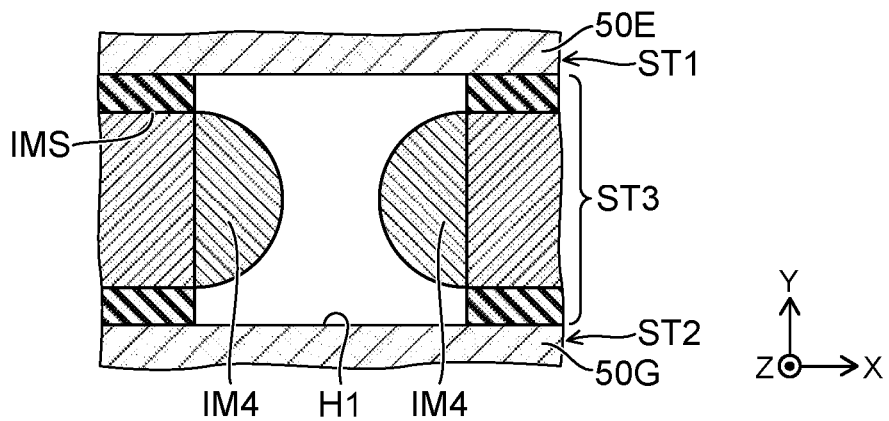

As shown in FIG. 28B, a spacer insulating part IM4 is formed selectively on the third material insulating part IM3 exposed in the first hole H1. For instance, the third material insulating part IM3 is an undoped polysilicon film. Undoped silicon (spacer insulating part IM4) can be formed selectively thereon by epitaxial growth. Thus, the first hole H1 has a shape having narrow gaps at four corners in a cross section along the X-Y plane.

Figure 28C:
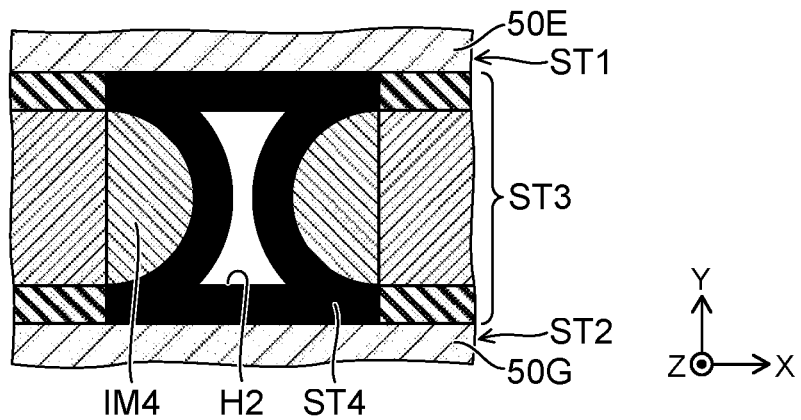

As shown in FIG. 28C, a film of a fourth material is formed on the inner surface of the first hole H1. This forms a fourth structural body ST4. The fourth structural body ST4 has a second hole H2 extending along the third direction. For instance, the fourth material (fourth structural body ST4) is silicon nitride. The film of the fourth material is formed so as to fill the gaps of the four corners of the first hole H1 and to retain a second hole H2.

Figure 28D:
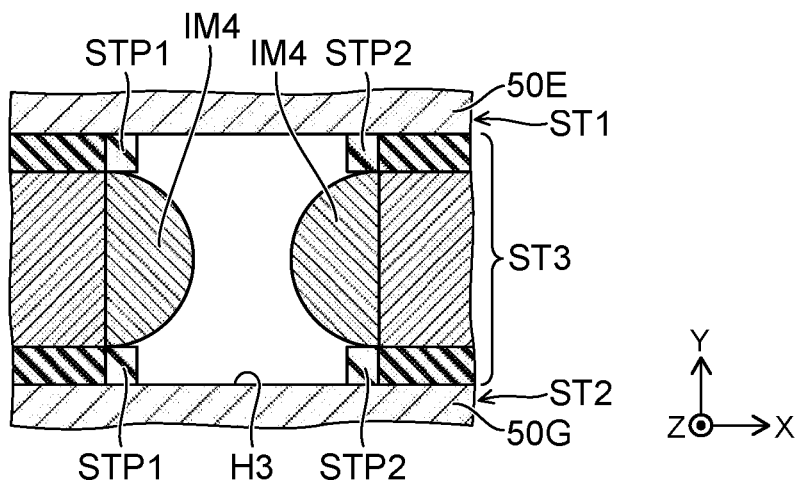

As shown in FIG. 28D, part of the fourth structural body ST4 is removed to form a third hole H3. For instance, the third hole H3 is formed by expanding the size of the second hole H2 while leaving the portions buried at the four corners. The removal of part of the fourth structural body ST4 is performed by e.g. dissolving silicon nitride by phosphoric acid treatment. The third hole H3 is formed by controlling the amount of dissolved silicon nitride so as to leave the portions (a first residual portion STP1 and a second residual portion STP2) buried at the four corners of the second hole H2.

Figure 28E:
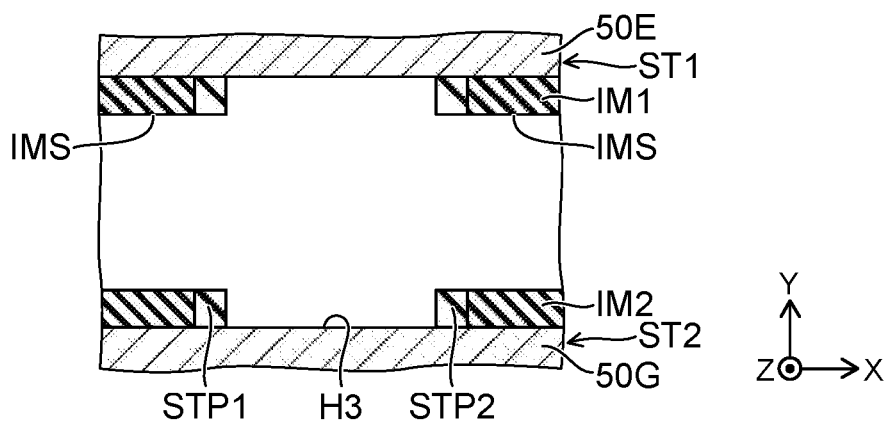

As shown in FIG. 28E, the third material insulating part IM3 and the spacer insulating part IM4 are removed selectively. Thus, in addition to the third hole H3, a space IMS is formed by the removal of the third material insulating part IM3 and the spacer insulating part IM4. The removal of the third material insulating part IM3 and the spacer insulating part IM4 is performed by e.g. dissolving silicon by alkali treatment.

Figure 28F:
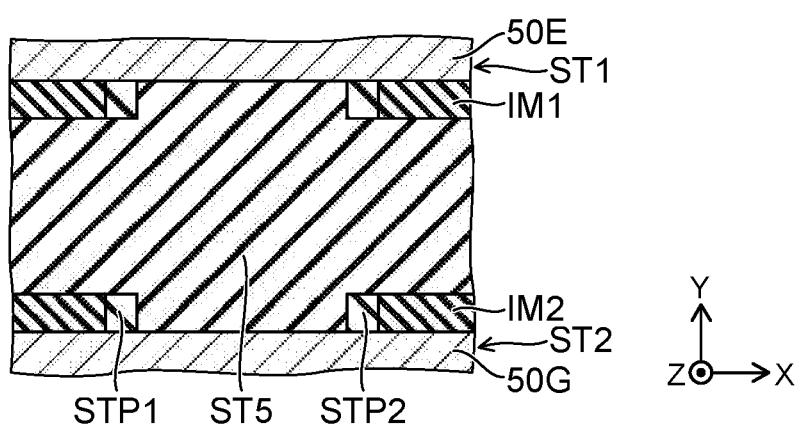

As shown in FIG. 28F, a fifth material is buried in the third hole H3 and the space IMS to form a fifth structural body ST5 from the fifth material. The fifth structural body ST5 extends along the X-axis direction and the Z-axis direction. The fifth material is e.g. silicon oxide.

Figure 28G:
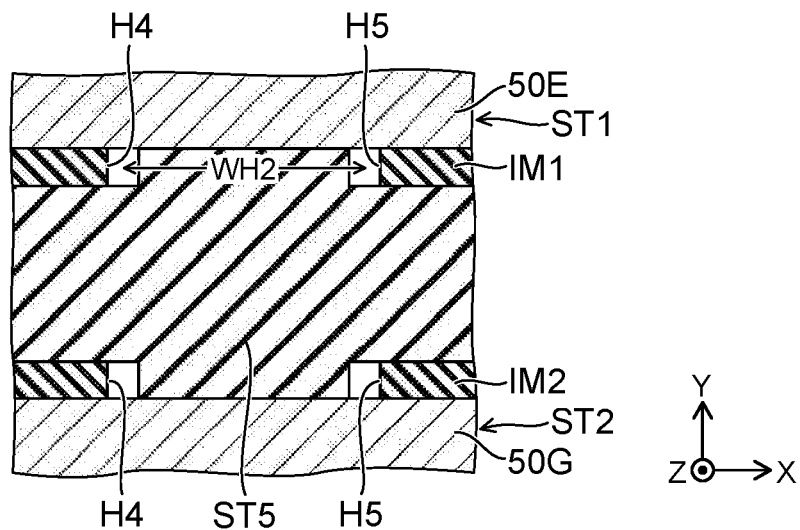

As shown in FIG. 28G, the first residual portion STP1 and the second residual portion STP2 are removed after forming the fifth structural body ST5. This forms a fourth hole H4 and a fifth hole H5. For instance, a surface portion of silicon oxide buried in the third hole H3 and the space IMS is removed to expose the first residual portion STP1 and the second residual portion STP2. Furthermore, phosphoric acid treatment is performed to selectively dissolve the silicon nitride columns (the first residual portion STP1 and the second residual portion STP2). This forms e.g. four holes (two fourth holes H4 and two fifth holes H5). The spacing WH2 in the X-axis direction between the center of the fourth hole H4 and the center of the fifth hole H5 is made narrower than the width WH1 in the X-axis direction of the first hole H1.

Figure 28H:
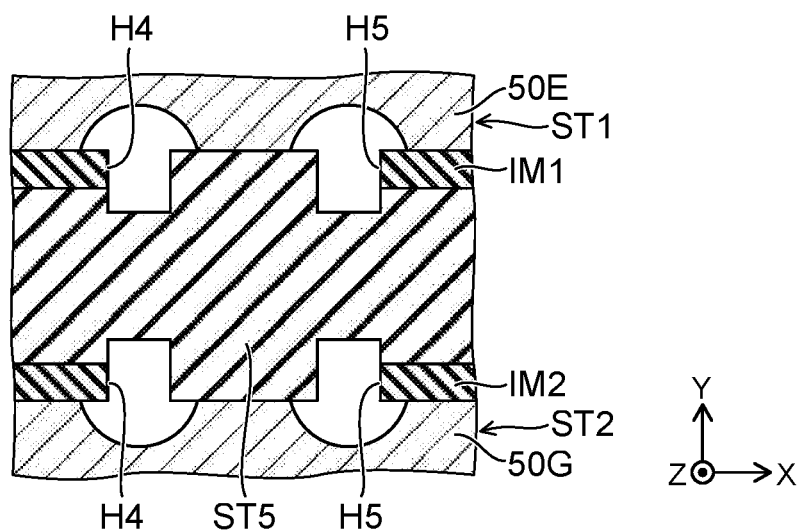

The size of the fourth hole H4 and the fifth hole H5 is expanded as shown in FIG. 28H. For instance, treatment with buffered hydrofluoric acid is performed to remove part of the first material insulating part IM1, the second material insulating part IM2, and the fifth structural body ST5. Furthermore, the first film 50E and the second film 50G exposed in the fourth hole H4 and the fifth hole H5 are set back. For instance, part of the plurality of first films 50E and the plurality of second films 50G (arc-shaped portion) is removed starting from the column-shaped holes (two fourth holes H4 and two fifth holes H5).

Figure 28I:
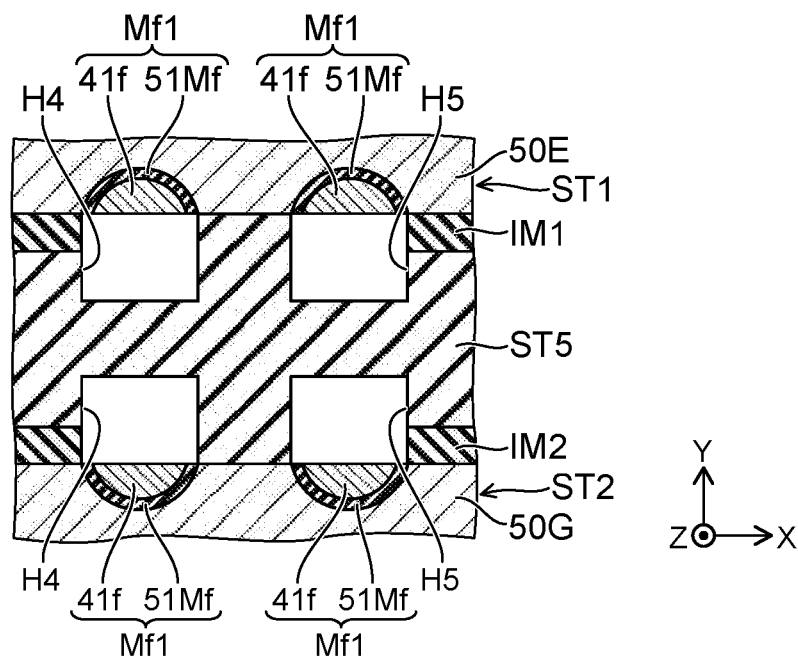

As shown in FIG. 28I, a first functional film Mf1 is formed on the surface of the first film 50E (e.g. a plurality of first films 50E) and the second film 50G (e.g. a plurality of second films 50G) exposed in each of the fourth hole H4 and the fifth hole H5. The first functional film Mf1 includes a memory film insulating film 51Mf and a charge storage film 41f. The memory film insulating film 51Mf is located between the charge storage film 41f and the first film 50E. The memory film insulating film 51Mf is located between the charge storage film 41f and the second film 50G. The charge storage film 41f corresponds to the first charge storage layer 41 in FIG. 1. The insulating film 51Mf corresponds to the first insulating member 51M.

For instance, the memory film insulating film 51Mf is formed on the inner surface of the fourth hole H4 and the fifth hole H5. Subsequently, the charge storage film 41f is formed on the surface of the memory film insulating film 51Mf. In this case, the first functional film Mf1 is formed so that the space (arc-shaped portion) formed by partly removing the first film 50E and the second film 50G is occluded to leave the space inside the fourth hole H4 and the fifth hole H5. Subsequently, the first functional film Mf1 formed on the inner surface of the fourth hole H4 and the fifth hole H5 is removed while leaving the first functional film Mf1 occluding the space formed by partly removing the first film 50E and the second film 50G.

The charge storage film 41f thus formed is separated from each other in the Z-axis direction. The charge storage film 41f is e.g. conductive. The charge storage film 41f is e.g. polysilicon. The charge storage film 41f constitutes a memory cell of the floating gate type.

Furthermore, the size of the fourth hole H4 and the fifth hole H5 is expanded after forming the first functional film Mf1. For instance, the size of these holes is expanded by performing chemical liquid treatment or vapor phase treatment. For instance, treatment with buffered hydrofluoric acid is performed to remove part of each of the first material insulating part IM1, the second material insulating part IM2, and the fifth structural body ST5.

Figure 28J:
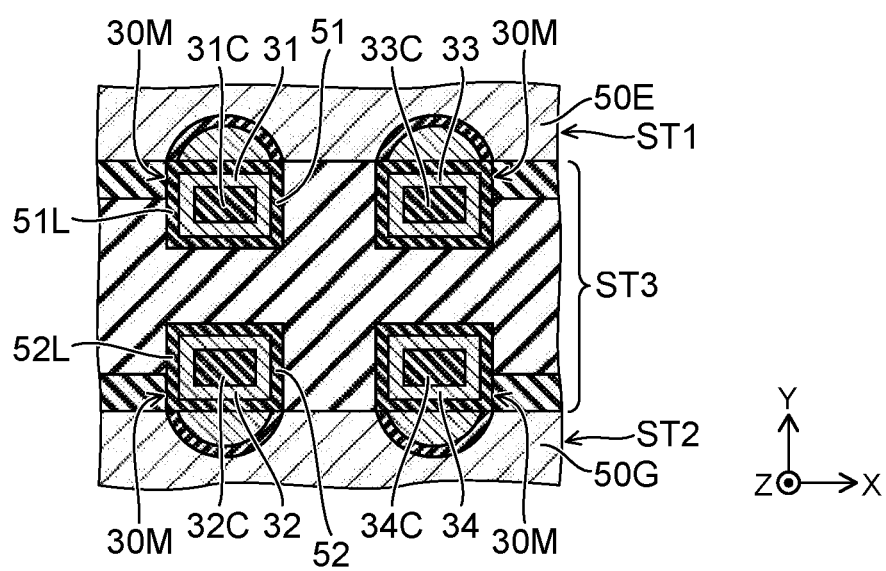

As shown in FIG. 28J, a first member 30M is formed inside the fourth hole H4 and the fifth hole H5. The first member 30M extends along the Z-axis direction in the residual space of the fourth hole H4 and the residual space of the fifth hole H5. The first member 30M includes e.g. a semiconductor member extending along the Z-axis direction. For instance, a plurality of first members 30M are provided. The plurality of first members 30M include e.g. first to fourth semiconductor members 31-34 and first to fourth core parts 31C-34C. One of the plurality of first members 30M includes e.g. a first semiconductor member 31, a first core part 31C, and a first insulating layer 51L. Another of the plurality of first members 30M includes e.g. a second semiconductor member 32, a second core part 32C, and a second insulating layer 52L.

The memory device 110 is formed by the processing described above. In the above method, the spacing between the fourth hole H4 and the fifth hole H5 in the X-axis direction can be made narrower than the width WH1 in the X-axis direction of the first hole H1 formed initially. That is, the space between memory cells in the X-axis direction can be made narrower. This provides a memory device having improved memory density. The memory device 110 based on the manufacturing method according to the embodiment also has a cross-sectional shape similar to the shape shown in FIGS. 8A to 11D.

(Eighth Embodiment)

FIGS. 29A to 29L are schematic sectional views illustrating a method for manufacturing a memory device according to an eighth embodiment. FIGS. 29A to 29L are sectional views taken along the X-Y plane and show a manufacturing process following FIG. 5B.

Figure 29A:
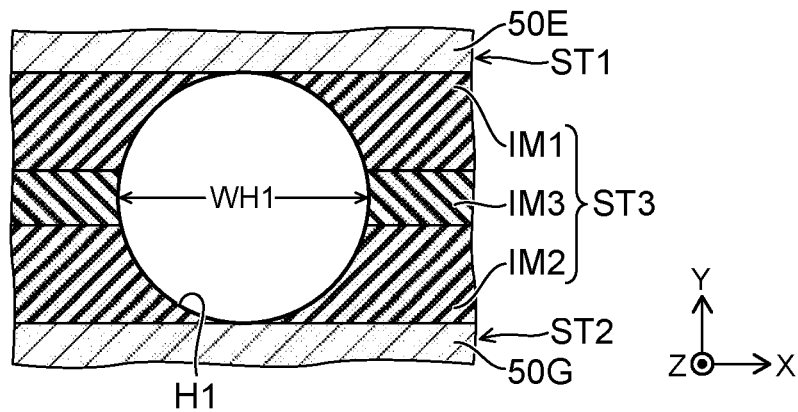
FIGS. 29A to 29L are schematic views illustrating a method for manufacturing a memory device according to an eighth embodiment.

As shown in FIG. 29A, a first hole H1 extending along the Z-axis direction is formed in the third structural body ST3. The first hole H1 is formed by removing part of the first material insulating part IM1, part of the second material insulating part IM2, and part of the third material insulating part IM3. The first hole H1 is formed so as to have a generally circular shape in a cross section along the X-Y plane and to have a width WH1 in the X-axis direction. WH1 is e.g. equal to the spacing between the first film 50E and the second film 50G.

Figure 29B:
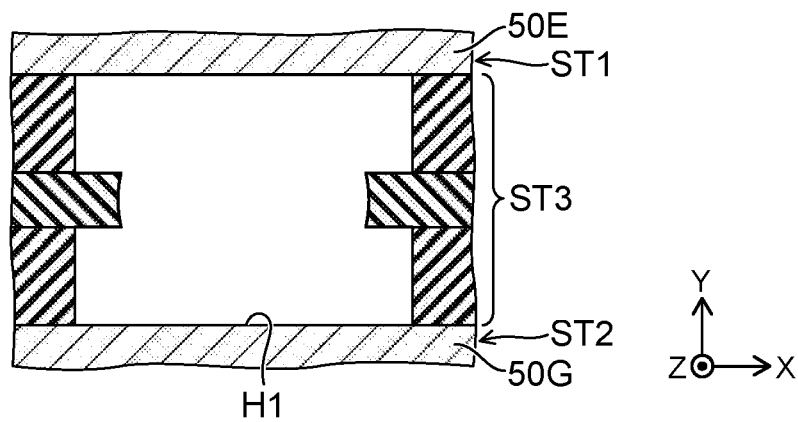

As shown in FIG. 29B, the first material insulating part IM1 and the second material insulating part IM2 exposed in the first hole H1 are set back in the X-axis direction. For instance, hydrofluoric acid treatment is performed. Thus, the amount of setback in the first material insulating part IM1 and the second material insulating part IM2 is made larger than the amount of setback in the third material insulating part IM3 due to the difference of etching rate in the silicon oxide films (the first material insulating part IM1, the second material insulating part IM2, and the third material insulating part IM3).

Figure 29C:
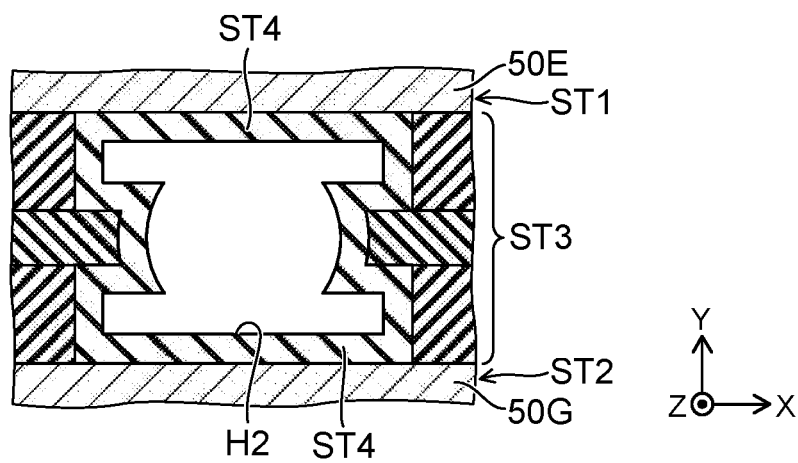

As shown in FIG. 29C, a film of a fourth material is formed on the inner surface of the first hole H1. This forms a fourth structural body ST4. The fourth structural body ST4 has a second hole H2 extending along the Z-axis direction. For instance, the fourth material (fourth structural body ST4) is silicon oxide. The film of the fourth material is formed so as to leave narrow voids at four corners of the second hole H2.

Figure 29D:
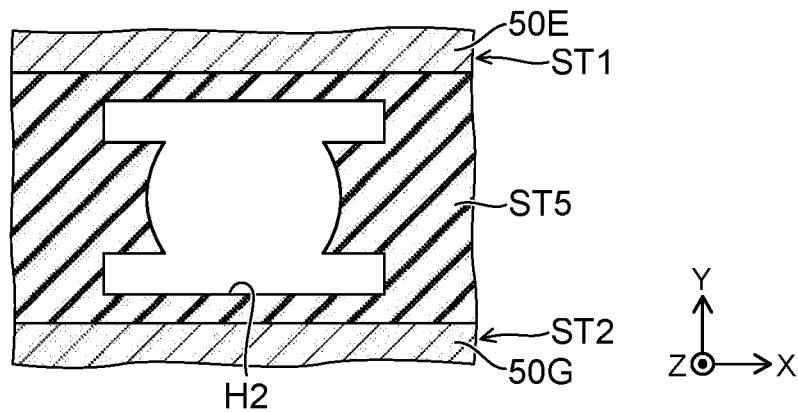

As shown in FIG. 29D, the first material insulating part IM1, the second material insulating part IM2, the third material insulating part IM3, and the film of the fourth material (fourth structural body ST4) are integrated to form a fifth structural body ST5. For instance, heat treatment is performed to homogenize silicon oxide constituting the first material insulating part IM1, the second material insulating part IM2, the third material insulating part IM3, and the fourth structural body ST4. The fifth structural body ST5 includes a second hole H2.

Figure 29E:
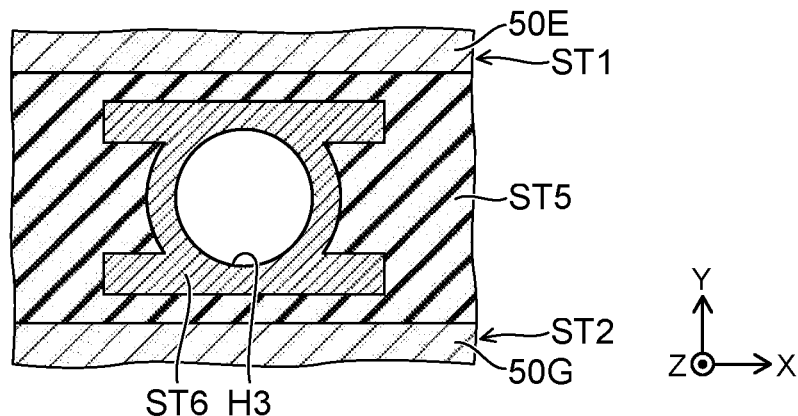

As shown in FIG. 29E, a film of a sixth material is formed on the inner surface of the second hole H2. This forms a sixth structural body ST6. The sixth structural body ST6 has a third hole H3 extending along the Z-axis direction. For instance, the sixth material (sixth structural body ST6) is silicon. The film of the sixth material is formed by e.g. the CVD method. This film of the sixth material is buried in the voids formed at the four corners of the second hole H2 and has a thickness forming a third hole H3.

Figure 29F:
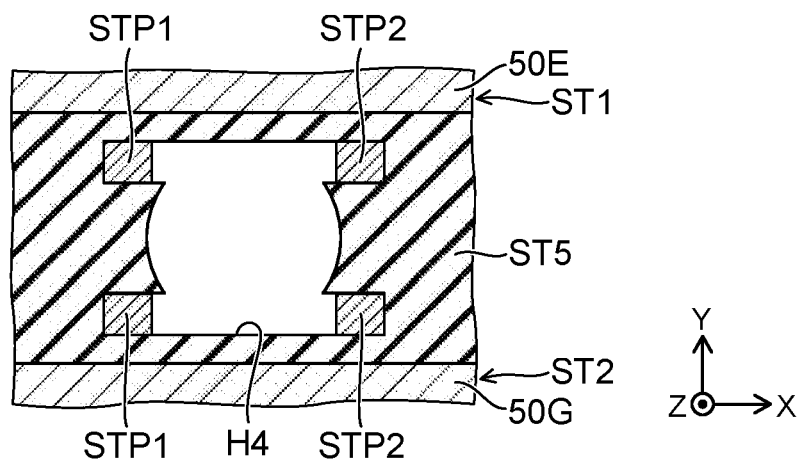

As shown in FIG. 29F, part of the sixth structural body ST6 is removed to form a fourth hole H4. For instance, the fourth hole H4 is formed by expanding the size of the third hole H3. The removal of part of the sixth structural body ST6 is performed by e.g. dissolving silicon by alkali treatment. The fourth hole H4 is formed by controlling the amount of dissolved silicon. This leaves e.g. a silicon column buried in the voids at the four corners of the second hole H2 (a first residual portion STP1 and a second residual portion STP2).

Figure 29G:
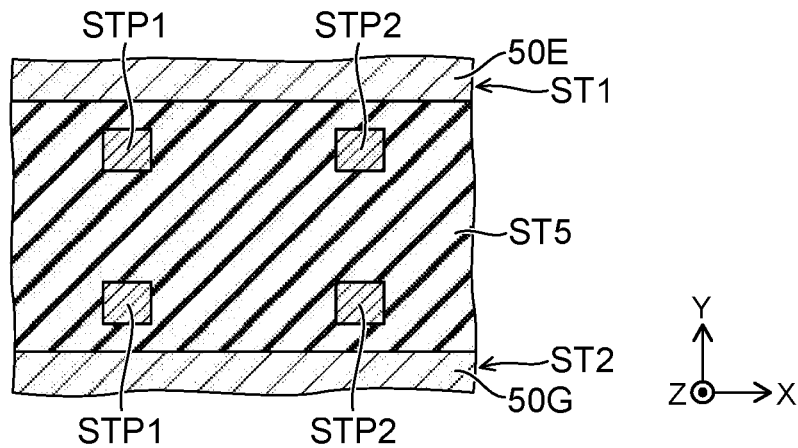

As shown in FIG. 29G, the same material as that of the fifth structural body ST5 is buried in the fourth hole H4 and integrated. The material buried in the fourth hole H4 is e.g. silicon oxide.

Figure 29H:
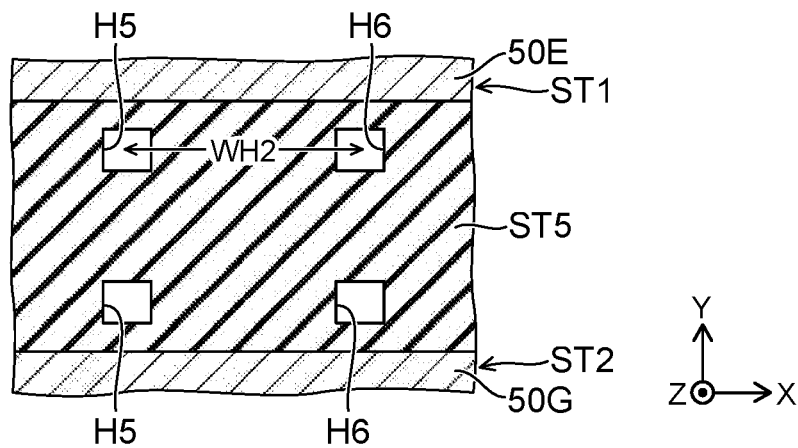

As shown in FIG. 29H, the first residual portion STP1 and the second residual portion STP2 are removed to form a fifth hole H5 and a sixth hole H6. For instance, a surface portion of silicon oxide buried in the fourth hole H4 is removed to expose the first residual portion STP1 and the second residual portion STP2. Furthermore, alkali treatment is performed to selectively dissolve the column-shaped silicon portions (the first residual portion STP1 and the second residual portion STP2). This forms four holes (two fifth holes H5 and two sixth holes H6). The spacing WH2 in the X-axis direction between the center of the fifth hole H5 and the center of the sixth hole H6 is made equal to or narrower than the width WH1 in the X-axis direction of the first hole H1.

Figure 29I:
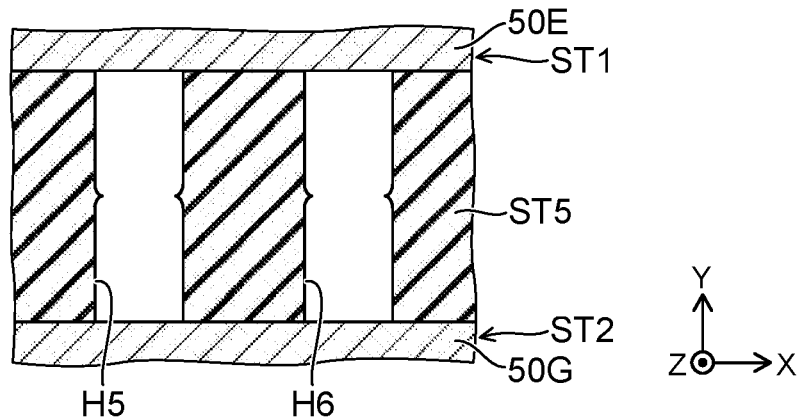

As shown in FIG. 29I, the size of the fifth hole H5 and the sixth hole H6 is expanded to join two fifth holes H5 and to join two sixth holes H6 in the Y-axis direction. For instance, treatment with buffered hydrofluoric acid is performed. The fifth structural body ST5 is isotropically etched because it is homogenized. The first film 50E and the second film 50G are exposed in the fifth hole H5 and the sixth hole H6.

Figure 29J:
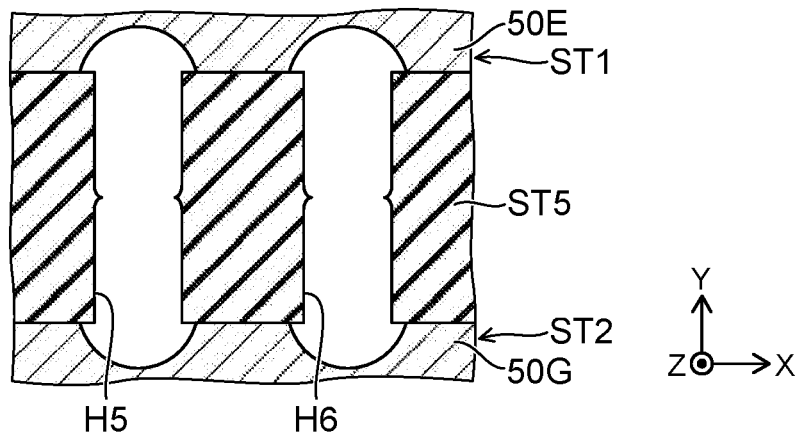

As shown in FIG. 29J, the first film 50E and the second film 50G exposed in the fifth hole H5 and the sixth hole H6 are set back. The size of each of the fifth hole H5 and the sixth hole H6 is expanded toward the first film 50E and the second film 50G. For instance, part of the plurality of first films 50E and the plurality of second films 50G (arc-shaped portion) is removed starting from the column-shaped holes (the fifth hole H5 and the sixth hole H6).

Figure 29K:
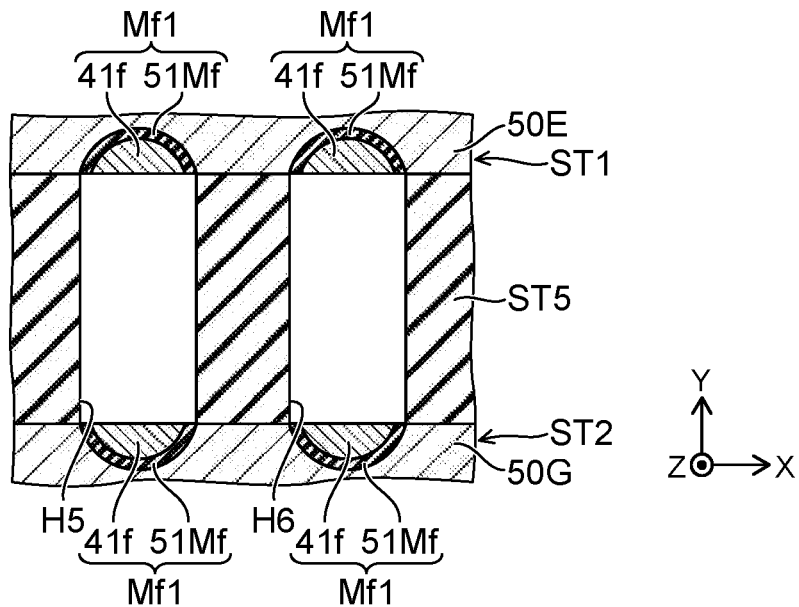

As shown in FIG. 29K, a first functional film Mf1 is formed on the surface of the first film 50E (e.g. a plurality of first films 50E) and the second film 50G (e.g. a plurality of second films 50G) exposed in each of the fifth hole H5 and the sixth hole H6. The first functional film Mf1 includes a memory film insulating film 51Mf and a charge storage film 41f. The memory film insulating film 51Mf is located between the charge storage film 41f and the first film 50E. The memory film insulating film 51Mf is located between the charge storage film 41f and the second film 50G. The charge storage film 41f corresponds to the first charge storage layer 41 in FIG. 1. The insulating film 51Mf corresponds to the first insulating member 51M.

For instance, the memory film insulating film 51Mf is formed on the inner surface of the fifth hole H5 and the sixth hole H6. Subsequently, the charge storage film 41f is formed on the surface of the memory film insulating film 51Mf. In this case, the first functional film Mf1 is formed so that the space (arc-shaped portion) formed by partly removing the first film 50E and the second film 50G is occluded to leave the space inside the fifth hole H5 and the sixth hole H6. Subsequently, the first functional film Mf1 formed on the inner surface of the fifth hole H5 and the sixth hole H6 is removed while leaving the first functional film Mf1 occluding the space formed by partly removing the first film 50E and the second film 50G.

The charge storage film 41f thus formed is separated from each other in the Z-axis direction. The charge storage film 41f is e.g. conductive. The charge storage film 41f is e.g. polysilicon. In this case, the charge storage film 41f constitutes a memory cell of the floating gate type.

Furthermore, the size of the fifth hole H5 and the sixth hole H6 is expanded after forming the first functional film Mf1. For instance, the size of these holes is expanded by performing chemical liquid treatment or vapor phase treatment. For instance, treatment with buffered hydrofluoric acid is performed to etch the fifth structural body ST5 isotropically.

Figure 29L:
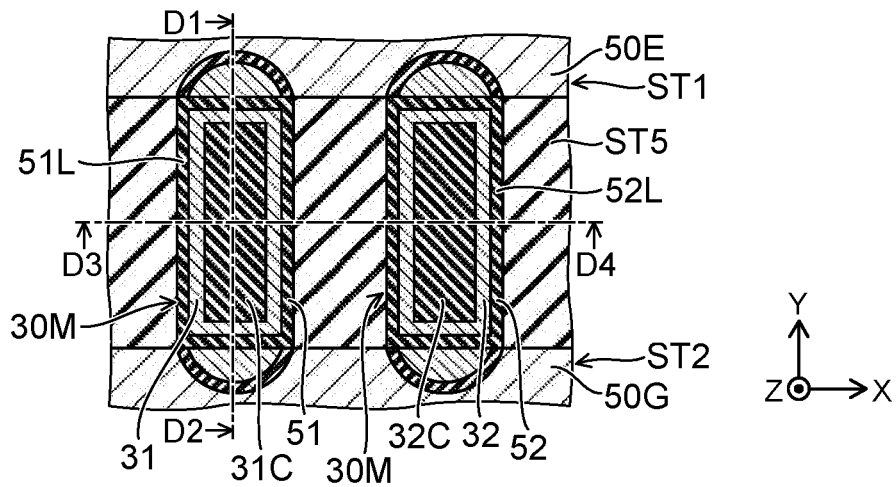

As shown in FIG. 29L, a first member 30M is formed inside the fifth hole H5 and the sixth hole H6. The first member 30M extends along the Z-axis direction in the residual space of the fifth hole H5 and the residual space of the sixth hole H6. The first member 30M includes e.g. a semiconductor member extending along the Z-axis direction. One of the first members 30M includes e.g. a first semiconductor member 31, a first core part 31C, and a first insulating layer 51L. Another of the first members 30M includes e.g. a second semiconductor member 32, a second core part 32C, and a second insulating layer 52L.

The memory device 110 is formed by the processing described above. The homogenization of the insulating part performed in the step shown in FIG. 29D is not limited to the embodiment, but can be performed also in the other embodiments.

In the manufacturing method according to the embodiment, the spacing between the fifth hole H5 and the sixth hole H6 in the X-axis direction can be made narrower than the width WH1 in the X-axis direction of the first hole H1 formed initially. Thus, the space between memory cells in the X-axis direction can be made narrower. This provides a memory device having improved memory density.

Figure 30A:
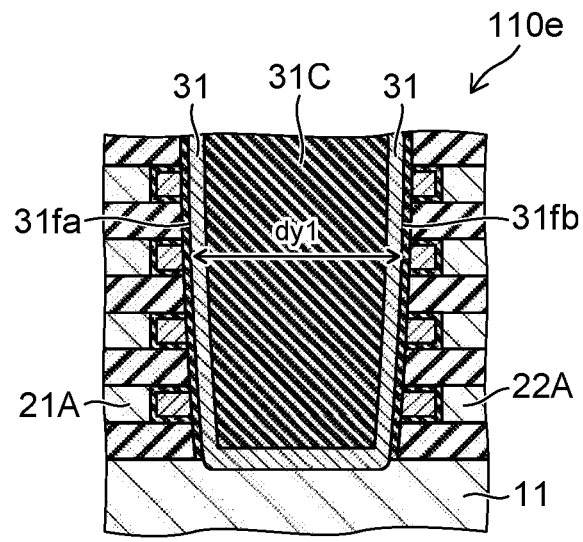
FIGS. 30A and 30B are schematic views illustrating a part of the memory device according to the eighth embodiment.
Figure 30B:
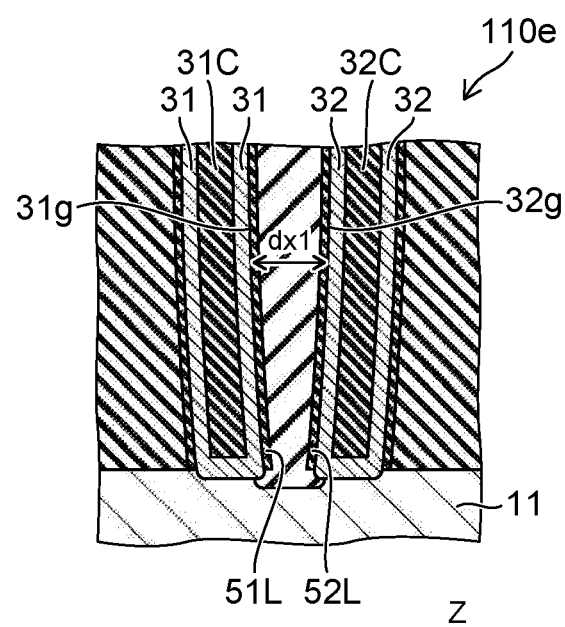

FIGS. 30A and 30B are schematic sectional views illustrating part of a memory device according to the eighth embodiment. FIG. 30A is a sectional view taken along line D1-D2 of FIG. 29L. FIG. 30B is a sectional view taken along line D3-D4 of FIG. 29L. These figures illustrate a memory device 110e according to the embodiment.

As shown in FIG. 30A, the first semiconductor member 31 has side surfaces 31fa and 31fb. The distance dy1 along the Y-axis direction between the side surface 31fa and the side surface 31fb changes along the Z-axis direction. In this example, the distance dy1 at a first height position is shorter than the distance dy1 at a second height position. In the embodiment, the first height position and the second height position are arbitrary. This also applies to the subsequent figures of FIGS. 31A, 32A, and 33A.

In the example shown in FIG. 30A, the distance along the Z-axis direction between the first height position and the conductive base member 11 is shorter than the distance along the Z-axis direction between the second height position and the conductive base member 11.

As shown in FIG. 30B, the first semiconductor member 31 has a side surface 31g. The side surface 31g is opposed to e.g. the first insulating layer 51L in the X-axis direction. The third semiconductor member 32 has a side surface 32g. The side surface 32g is opposed to e.g. the second insulating layer 52L in the X-axis direction. The distance dx1 along the X-axis direction between the side surface 31g and the side surface 32g changes along the Z-axis direction. This also applies to the subsequent figures of FIGS. 31B, 32B, and 33B.

In the example shown in FIG. 30B, the distance dx1 at the first height position is shorter than the distance dx1 at the second height position.

For instance, the change of the distance dy1 per unit length in the Z-axis direction is substantially equal to the change of the distance dx1 per unit length in the Z-axis direction. For instance, the former is 0.8 times or more and 1.2 times or less of the latter.

Figure 31A:
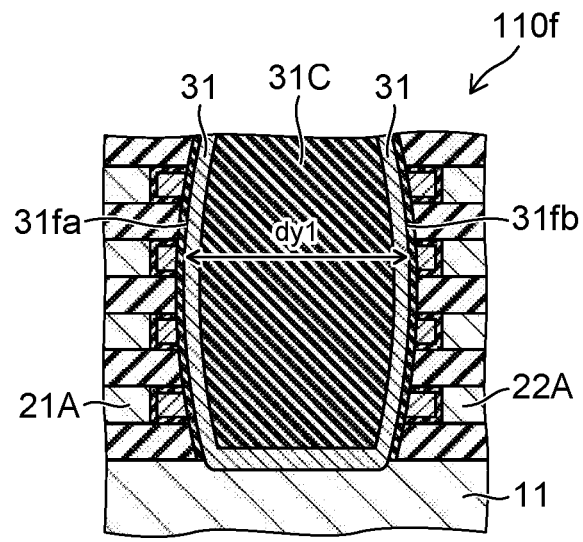
FIGS. 31A and 31B are schematic views illustrating a part of a memory device according to a first variation of the eight embodiment.
Figure 31B:
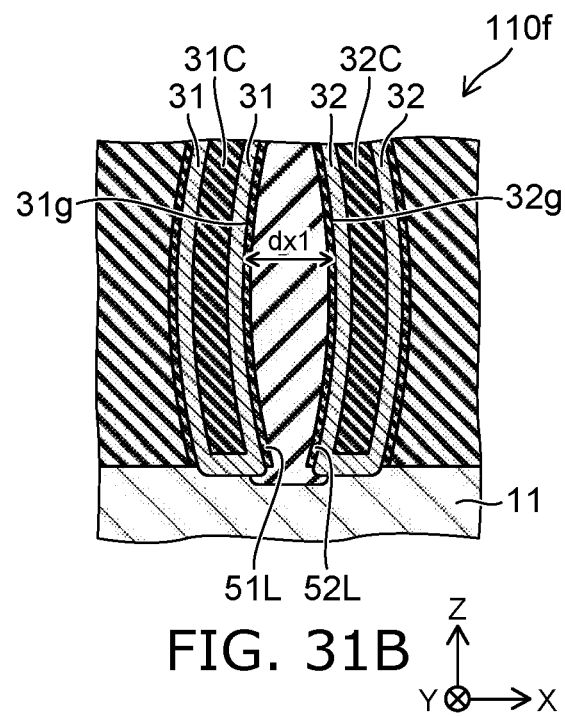

FIGS. 31A and 31B are schematic sectional views illustrating part of a memory device according to a first variation of the eighth embodiment. FIGS. 31A and 31B are sectional views corresponding to FIGS. 30A and 30B, respectively. These figures illustrate a memory device 110f according to the embodiment.

In the memory device 110f, the distance dy1 and the distance dx1 increase and decrease along the Z-axis direction.

Figure 32A:
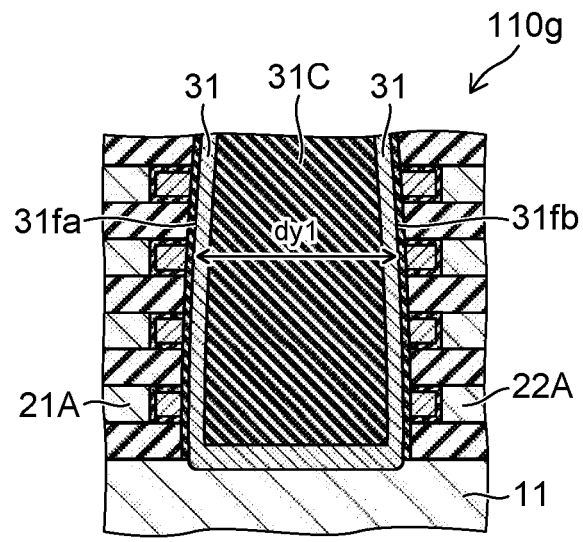
FIGS. 32A and 32B are schematic views illustrating a part of a memory device according to a second variation of the eight embodiment.
Figure 32B:
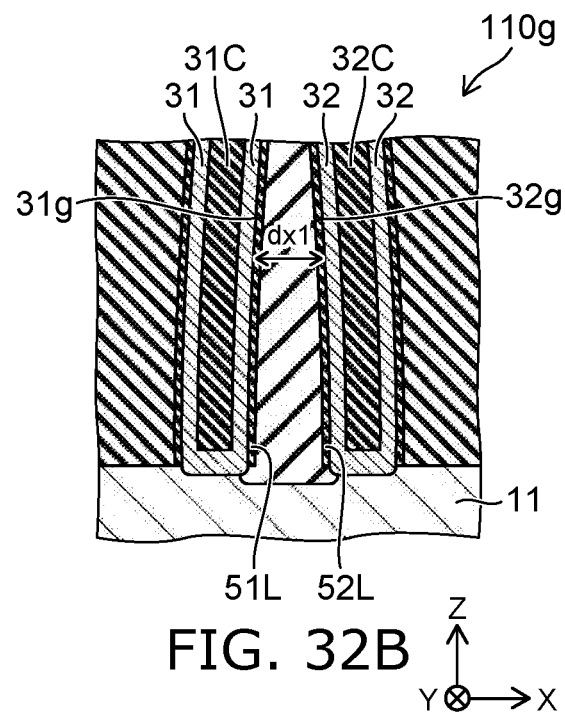

FIGS. 32A and 32B are schematic sectional views illustrating part of a memory device according to a second variation of the eighth embodiment. FIGS. 32A and 32B are sectional views corresponding to FIGS. 30A and 30B, respectively. These figures illustrate a memory device 110g according to the embodiment.

In the memory device 110g, in each of the distance dy1 and the distance dx1, the value at the second height position is larger than the value at the first height position. Also in this case, the distance along the Z-axis direction between the first height position and the conductive base member 11 is shorter than the distance along the Z-axis direction between the second height position and the conductive base member 11.

In the above embodiment, in the set of two semiconductor members (first and second semiconductor members 31, 32), the shape of these semiconductor members changes in an interlocked manner. This causes the change as described above along the Z-axis direction in the distance dy1 and the distance dx1. For instance, the change of the distance dy1 per unit length in the Z-axis direction is 0.8 times or more and 1.2 times or less of the change of the distance dx1 per unit length in the Z-axis direction.

In the above manufacturing method, the material of the first material insulating part IM1 is different from the material of the third material insulating part IM3. These materials are mutually different in etching rate. Thus, for instance, when the first material insulating part IM1 and the third material insulating part IM3 are processed simultaneously, the obtained shape may be different from each other. Such difference in shape may be observed in the manufactured memory device. An example of such difference in shape is described in the following.

Figure 33A:
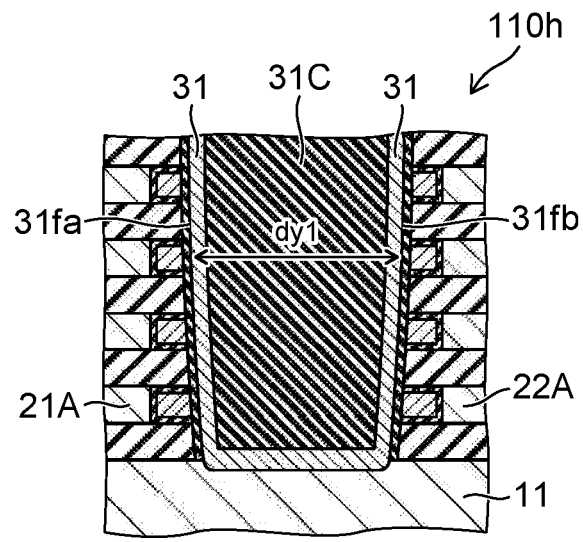
FIGS. 33A and 33B are schematic views illustrating a part of a memory device according to a third variation of the eight embodiment.
Figure 33B:
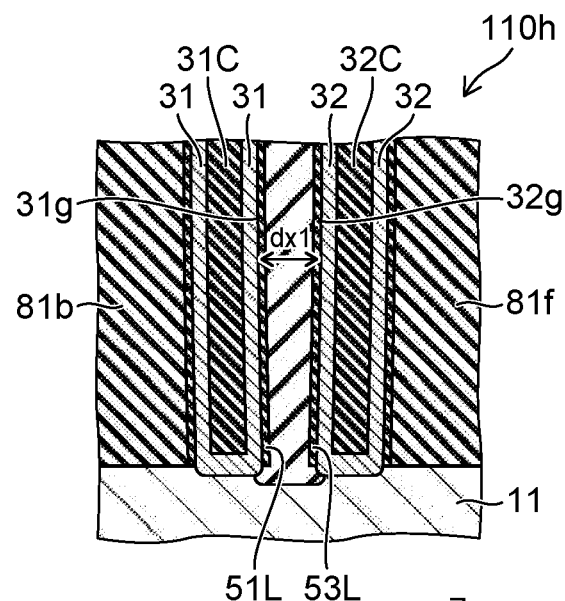

FIGS. 33A and 33B are schematic sectional views illustrating part of a memory device according to a third variation of the eighth embodiment. FIGS. 33A and 33B are sectional views corresponding to FIGS. 30A and 30B, respectively. These figures illustrate a memory device 110h according to the embodiment.

In the memory device 110h, for instance, the change of the distance dy1 per unit length in the Z-axis direction may be different from the change of the distance dx1 per unit length in the Z-axis direction.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in memory devices such as conductive layers, semiconductor members, charge storage members, resistance change members, insulating members, insulating layers, insulating parts, etc., from known art. Such practice is included in the scope of the invention to the extent that similar effects thereto are obtained.

Further, any two or more components of the specific5 examples may be combined within the extent of technical feasibility and are included in the scope of the invention to the extent that the purport of the invention is included.

Moreover, all memory devices, and methods for manufacturing s memory devices practicable by an appropriate design modification by one skilled in the art based on the memory devices, and the methods for manufacturing memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device comprising:
   a plurality of conductive layers extending along a first direction and being arranged in a second direction crossing the first direction, the plurality of conductive layers including a first conductive layer and a second conductive layer, the second conductive layer being adjacent to the first conductive layer with a first space;
   a first semiconductor member positioned in the first space between the first conductive layer and the second conductive layer, the first semiconductor member extending along a third direction crossing a plane including the first and second directions;
   a second semiconductor member positioned in the first space and extending along the third direction, the first semiconductor member and the second semiconductor member being arranged in the second direction, the first semiconductor member being positioned between the first conductive layer and the second semiconductor member, the second semiconductor member being positioned between the first semiconductor member and the second conductive layer;

a first charge storage member provided between the first conductive layer and the first semiconductor member;

a first insulating member provided between the first conductive layer and the first charge storage member;

a first insulating layer positioned in the first space, the first insulating layer including a first region and a second region, the first region being positioned between the first semiconductor member and the first charge storage member, the second region being positioned between the first semiconductor member and the second semiconductor member;

a second charge storage member provided between the second conductive layer and the second semiconductor member;

a second insulating member provided between the second conductive layer and the second charge storage member; and a second insulating layer positioned in the first space, the second insulating layer including a third region and a fourth region, the third region being positioned between the second semiconductor member and the second charge storage member, the fourth region being positioned between the second region of the first insulating layer and the second semiconductor member.

2. The device according to claim 1, further comprising:
an insulating part positioned in the first space between the first conductive layer and the second conductive layer, the insulating part including a first insulating region and a second insulating region,
at least a part of the first insulating region being positioned between the second region of the first insulating layer and the fourth region of the second insulating layer,
the second insulating region and the first semiconductor member being arranged in the first direction, and
the second insulating region including a material different from a material included in the first insulating region.

3. The device according to claim 1, wherein
the first charge storage member and a portion of the first conductive layer are arranged in the first direction, and
the second charge storage member and a portion of the second conductive layer are arranged in the first direction.

4. The device according to claim 1, further comprising:
a conductive base member electrically connected to the first semiconductor member and the second semiconductor member,
the first semiconductor member having a first surface opposing the first charge storage member,
the second semiconductor member having a second surface opposing the second charge storage member, and
a spacing changing between the first surface and the second surface, the spacing depending on a position away from the conductive base member in the third direction.

5. The device according to claim 1, wherein the first insulating layer further includes a fifth region and a sixth region, the fifth region and the sixth region being arranged in the first direction, the first semiconductor member being positioned between the fifth region and the sixth region.

6. The device according to claim 2, wherein
the insulating part further includes a third insulating region, the first semiconductor member being positioned between the second insulating region and the third insulating region, the third insulating region including a material different from the material included in the second insulating region.

7. The device according to claim 2, wherein
the plurality of conductive layers further include a third conductive layer and a fourth conductive layer,
the third conductive layer being adjacent to the first conductive layer with a second space, the first conductive layer being positioned between the second conductive layer and the third conductive layer,
the fourth conductive layer being adjacent to the second conductive layer with a third space, the second conductive layer being positioned between the first conductive layer and the fourth conductive layer;
third and fourth semiconductor members positioned in the first space between the first conductive layer and the second conductive layer, the third and fourth semiconductor members being arranged in the second direction, the third semiconductor member being positioned between the first conductive layer and the fourth semiconductor member, the fourth semiconductor member being positioned between the third semiconductor member and the second conductive layer, the first semiconductor member and the third semiconductor member being arranged in the first direction with the second insulating region of the insulating part interposed, the second semiconductor member and the fourth semiconductor member being arranged in the first direction with the second insulating region of the insulating pan interposed;
a fifth semiconductor members positioned in the second space between the first conductive layer and the third conductive layer, the fifth semiconductor member and the second insulating region of the insulating part being arranged in the second direction, the first conductive layer being positioned between the fifth semiconductor member and the second insulating region of the insulating part; and
a sixth semiconductor members positioned in the third space between the second conductive layer and the fourth conductive layer, the sixth semiconductor member and the second insulating region of the insulating part being arranged in the second direction, the second conductive layer being positioned between the sixth semiconductor member and the second insulating region of the insulating part.

8. The device according to claim 5, wherein the first insulating layer surrounds the first semiconductor member with the first, second, fifth and sixth regions.

9. A memory device comprising:
a plurality of conductive layers extending along a first direction and being arranged in a second direction crossing the first direction, the plurality of conductive layers including a first conductive layer and a second conductive layer, the second conductive layer being adjacent to the first conductive layer with a first space;
a first semiconductor member positioned in the first space between the first conductive layer and the second conductive layer, the first semiconductor member non-linearly extending along a third direction crossing a plane including the first and second directions;
a second semiconductor member positioned in the first space and non-linearly extending along the third direction, the first semiconductor member and the second semiconductor member being arranged in the first direction;
a first charge storage member provided between the first conductive layer and the first semiconductor member;
a first insulating member provided between the first conductive layer and the first charge storage member;
a second charge storage member provided between the second conductive layer and the first semiconductor member;
a second insulating member provided between the second conductive layer and the second charge storage member;
a first insulating layer positioned in the first space, the first insulating layer including a first region and a second region, the first region being positioned between the first semiconductor member and the first charge storage member, the second region being positioned between the first semiconductor member and the second charge storage member;
a third charge storage member provided between the first conductive layer and the second semiconductor member;
a third insulating member provided between the first conductive layer and the third charge storage member;
a fourth charge storage member provided between the second conductive layer and the second semiconductor member;
a fourth insulating member provided between the second conductive layer and the fourth charge storage member; and
a second insulating layer positioned in the first space, the second insulating layer including a third region and a fourth region, the third region being positioned between the second semiconductor member and the third charge storage member, the fourth region being positioned between the second semiconductor member and the fourth charge storage member.

10. The device according to claim 9, further comprising:
a conductive base member electrically connected to the first semiconductor member and the second semiconductor member,
a spacing in the first direction changing between the first semiconductor member and the second semiconductor member, the spacing depending on a position away from the conductive base member in the third direction.

11. A method for manufacturing a memory device comprising:
forming a plurality of structural bodies extending along a first direction and being arranged in a second direction crossing the first direction, the plurality of structural bodies including a first structural body and a second structural body, the second structural body being adjacent to the first structural body with a first space, the first structural body including a first film, the second structural body including a second film;
forming a third structural body in the first space between the first structural body and the second structural body, the third structural body including a first material insulating part
forming a first hole in the third structural body by selectively removing a portion of the first material insulating part;
forming a fourth structural body having a second hole by forming a film of a second material in the first hole after forming recesses in the first material insulating part exposed in the first hole;
forming a third hole by selectively removing a portion of the fourth structural body, a first residual portion and a second residual portion of the fourth structural body remaining in the third hole;
forming a fifth structural body of a third material by filling the third hole with the third material;
forming a fourth hole and a fifth hole by removing the first residual portion and the second residual portion after forming the fifth structural body; and
forming first functional films in the first film and the second film, respectively, in the fourth and fifth holes.

12. The method according to claim 11, further comprising:
forming first members in a residual space of the fourth hole and a residual space of the fifth hole, respectively, the first members each including a semiconductor member or a conductive member extending along a third direction, the third direction crossing a plane including the first and second directions.

13. The method according to claim 11, further comprising:
forming recesses in the first film and the second film exposed in the fourth hole and the fifth hole after forming the fourth hole and the fifth hole and before forming the first functional films.

14. The method according to claim 11, wherein
forming the first functional films includes
forming memory insulating films on the first film and the second film, respectively, and
forming conductive charge storage films on the memory insulating films, respectively.

15. The method according to claim 11, where
the first functional films each includes at least one selected from the group consisting of a silicon oxide film, a silicon nitride film, and an aluminum oxide film.

16. The method according to claim 11, wherein
the fourth hole is provided in a plurality, the fourth holes being arranged in the first direction in the first space between the first structural body and the second structural body,
the fifth hole is provided in a plurality, the fifth holes being arranged in the first direction in the first space, and
the fourth holes include two fourth holes being adjacent in the first direction, a center distance of the two holes being equal to or narrower than a width in the first direction of the first hole.

17. The method according to claim 11, further comprising:
forming a spacer film on an inner surface of the first hole before forming the fourth structural body.

18. The method according to claim 11, further comprising:
enlarging the fourth hole and the fifth hole before forming the first functional film, the fourth hole and the fifth hole being joined together.

19. The method according to claim 12, further comprising:
enlarging the fourth hole and the fifth hole after forming the first functional films and before forming the first members.

20. The method according to claim 12, wherein
the first structural body further includes a plurality of third films, the first film being provided in a plurality in the first structural body, the first films and the third films being arranged alternately in the third direction, and the second structural body further includes a plurality of fourth films, the second film being provided in a plurality in the second structural body, the second films and the fourth films being arranged alternately in the third direction.

* * * * *